US012787413B2

(12) United States Patent
Kim et al.

(10) Patent No.: US 12,787,413 B2
(45) Date of Patent: Nov. 3, 2026

(54) SEMICONDUCTOR DEVICES

(71) Applicant: SAMSUNG ELECTRONICS CO., LTD., Suwon-si (KR)

(72) Inventors: Sunghwan Kim, Suwon-si (KR); Wandon Kim, Suwon-si (KR); Junki Park, Suwon-si (KR); Hyunbae Lee, Suwon-si (KR); Hyoseok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 18/378,992

(22) Filed: Oct. 11, 2023

(65) Prior Publication Data

US 2024/0154017 A1 May 9, 2024

(30) Foreign Application Priority Data

Nov. 8, 2022 (KR) ........................ 10-2022-0147773

(51) Int. Cl.
*H10D 64/62* (2025.01)
*H10D 30/01* (2025.01)
(Continued)

(52) U.S. Cl.
CPC ........... *H10D 64/62* (2025.01); *H10D 30/014* (2025.01); *H10D 30/024* (2025.01); *H10D 30/43* (2025.01);
(Continued)

(58) Field of Classification Search
CPC ............. H10D 30/024; H10D 30/6211; H10D 30/6735; H10D 84/0193; H10D 84/853;
(Continued)

(56) References Cited

U.S. PATENT DOCUMENTS 9,177,810 B2 11/2015 Basker et al.
9,478,468 B1 10/2016 Cheng et al.
(Continued)

FOREIGN PATENT DOCUMENTS

KR 10-2021-0129795 A 10/2021

OTHER PUBLICATIONS

Extended European Search Report in European Appln. No. 23207242.1, mailed on Apr. 10, 2024, 5 pages.
(Continued)

*Primary Examiner* — Tucker J Wright
(74) *Attorney, Agent, or Firm* — Fish & Richardson P.C.

(57) ABSTRACT

A semiconductor device includes a substrate including a first region and a second region. a first gate structure on the first region of the substrate, a first source/drain layer on a portion of the substrate adjacent to the first gate structure. a second gate structure on the second region of the substrate. a second source/drain layer on a portion of the substrate adjacent to the second gate structure. and a first contact plug including a first metal silicide pattern on the first source/drain layer. The first metal silicide pattern includes a silicide of a first metal and a silicide of a second metal different from the first metal. The device further includes a first conductive pattern on the first metal silicide pattern, a second contact plug including a second metal silicide pattern on the second source/drain layer, and a second conductive pattern on the second metal silicide pattern. The second metal silicide pattern includes a silicide of the first and second metals. A first ratio of the first metal to the second metal included in the first metal silicide pattern is different from a second ratio of the first metal to the second metal included in the second metal silicide pattern.

20 Claims, 50 Drawing Sheets

(51) Int. Cl.

| | |
|---|---|
| ***H10D 30/43*** | (2025.01) |
| ***H10D 30/62*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.
CPC ..... *H10D 30/6211* (2025.01); *H10D 30/6219* (2025.01); *H10D 30/6729* (2025.01); *H10D 30/6735* (2025.01); *H10D 62/121* (2025.01); *H10D 62/151* (2025.01); *H10D 64/0112* (2026.01); *H10D 64/017* (2025.01); *H10D 84/017* (2025.01); *H10D 84/0186* (2025.01); *H10D 84/0193* (2025.01); *H10D 84/038* (2025.01); *H10D 84/853* (2025.01)

(58) Field of Classification Search
CPC .. H10D 84/85; H10D 64/0112; H10D 84/017; H10W 20/066
See application file for complete search history.

(56) References Cited

U.S. PATENT DOCUMENTS

| | | | | |
|---|---|---|---|---|
| 9,548,306 | B2 | 1/2017 | Basker et al. | |
| 10,566,246 | B1 | 2/2020 | Wu et al. | |
| 10,796,968 | B2 | 10/2020 | Leib et al. | |
| 11,430,790 | B2 | 8/2022 | More | |
| 2012/0083089 | A1* | 4/2012 | Kim ..................... | H10D 30/601 257/E21.409 |
| 2015/0028423 | A1* | 1/2015 | Park ..................... | H10D 84/038 257/369 |
| 2020/0091011 | A1 | 3/2020 | Khaderbad et al. | |
| 2021/0257262 | A1 | 8/2021 | Khaderbad et al. | |
| 2022/0069100 | A1 | 3/2022 | Hwang et al. | |
| 2022/0102522 | A1 | 3/2022 | Dewey et al. | |

OTHER PUBLICATIONS

Office Action in Korean Appln. No. 10-2022-0147773, mailed on Mar. 28, 2026, 10 pages (with English translation).

* cited by examiner

SEMICONDUCTOR DEVICES

CROSS-REFERENCE TO RELATED APPLICATION

A claim of priority under 35 USC § 119 is made to Korean Patent Application No. 10-2022-0147773, filed on Nov. 8, 2022, in the Korean Intellectual Property Office (KIPO), the contents of which are herein incorporated by reference in their entirety.

TECHNICAL FIELD

Example embodiments relate to semiconductor devices. More particularly, example embodiments relate to semiconductor devices having contact plugs.

DISCUSSION OF THE RELATED ART

In a transistor, an ohmic contact structure including a metal silicide may be formed in order to reduce a resistance between a source/drain layer including a semiconductor material and a contact plug including a metal on the source/drain layer. A material of the ohmic contact structure may be optimized so that the resistance between the source/drain layer and the contact plug may be effectively reduced according to the specific type of the semiconductor material included in the source/drain layer.

SUMMARY

According to example embodiments, there is provided a semiconductor device. The semiconductor device may include a substrate including a first region and a second region; a first gate structure on the first region of the substrate, a first source/drain layer on a portion of the substrate adjacent to the first gate structure; a second gate structure on the second region of the substrate; a second source/drain layer on a portion of the substrate adjacent to the second gate structure; a first contact plug including a first metal silicide pattern on the first source/drain layer, the first metal silicide pattern including a silicide of a first metal and a silicide of a second metal different from the first metal, and a first conductive pattern on the first metal silicide pattern; and a second contact plug including a second metal silicide pattern on the second source/drain layer, the second metal silicide pattern including a silicide of the first and second metals and a second conductive pattern on the second metal silicide pattern, wherein a first ratio of the first metal to the second metal included in the first metal silicide pattern is different from a second ratio of the first metal to the second metal included in the second metal silicide pattern.

According to example embodiments, there is provided a semiconductor device. The semiconductor device may include a substrate including a first region and a second region; a first epitaxial layer on the first region of the substrate; a second epitaxial layer on the second region of the substrate; a first contact plug including a first metal silicide pattern on the first epitaxial layer, the first metal silicide pattern including a silicide of a first metal and a silicide of a second metal different from the first metal, and a first conductive pattern on the first metal silicide pattern; and a second contact plug including a second metal silicide pattern on the second epitaxial layer, the second metal silicide pattern including a silicide of the first and second metal and a second conductive pattern on the second metal silicide pattern, wherein a work function of the first metal silicide pattern and a work function of the second metal silicide pattern are different from each other.

According to example embodiments, there is provided a semiconductor device. The semiconductor device may include a substrate, a first active fin, a second active fin, a first transistor, a second transistor, a first contact plug and a second contact plug. The substrate may include a first region and a second region. The first active fin and the second active fin may be disposed on the first and second regions of the substrate, respectively. The first transistor may include a first gate structure on the first active fin of the first region of the substrate; and a first source/drain layer on a portion of the first active fin adjacent to the first gate structure, the first source/drain layer including silicon-germanium doped with a p-type impurity. The second transistor may include a second gate structure on the second active fin of the second region of the substrate; and a second source/drain layer on a portion of the second active fin adjacent to the second gate structure, the second source/drain layer including silicon doped with a n-type impurity. The first contact plug may include a first metal silicide pattern on the first source/drain layer, the first metal silicide pattern including a silicide of a first metal having a work function equal to or more than about 4.6 eV; a first conductive pattern on the first metal silicide pattern, the first conductive pattern including a third metal; and a first metal layer between the first metal silicide pattern and the first conductive pattern, the first metal layer including a second metal having a work function in a range of about 2.0 eV to about 4.5 eV. The second contact plug may include a second metal silicide pattern on the second source/drain layer, the first metal silicide pattern including a silicide of the first metal; and a second conductive pattern on the second metal silicide pattern, the second conductive pattern including the third metal. In the semiconductor device, a first ratio of the first metal to the second metal included in the first metal silicide pattern may be greater than a second ratio of the first metal to the second metal included in the second metal silicide pattern.

In the semiconductor device in accordance with example embodiments, a first contact plug on a source/drain layer of an NMOS transistor may include a first ohmic contact structure, and a second contact plug on a source/drain layer of a PMOS transistor may include a second ohmic contact structure. The first and second ohmic contact structure may have different work functions from each other, and thus, a contact resistance between the first source/drain layer and the first contact plug and a contact resistance between the second source/drain layer and the second contact plug may be reduced.

In addition, the first and second ohmic contact structures may be formed not by separate processes but by the same etching processes and the same deposition processes, and thus, stages and cost of processes may be reduced.

BRIEF DESCRIPTION OF THE DRAWINGS

FIG. 4 is an enlarged cross-sectional view of regions X and Y of FIG. 3.

DESCRIPTION OF EMBODIMENTS

A semiconductor device and a method of manufacturing the same in accordance with example embodiments will be described more fully hereinafter with reference to the accompanying drawings. Hereinafter in the specifications (and not necessarily in the claims), two directions substantially parallel to an upper surface of a substrate and crossing each other may be referred to as first and second directions D1 and D2, respectively, and a direction substantially perpendicular to the upper surface of the substrate may be referred to as a third direction D3. In example embodiments, the first and second directions D1 and D2 may be substantially perpendicular to each other.

Figure 1:
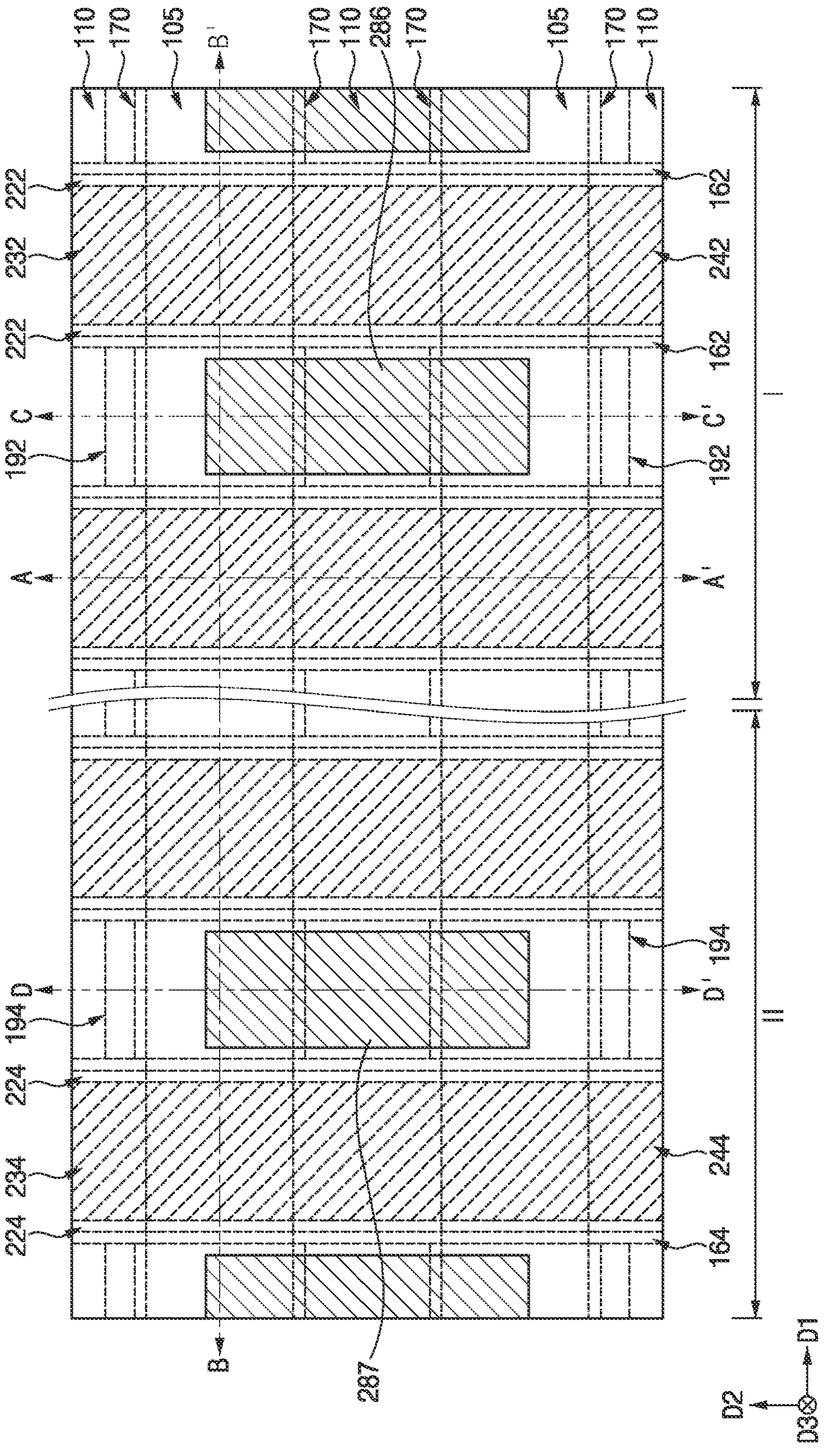
FIGS. 1 to 5 are a plan view and cross-sectional views illustrating a semiconductor device in accordance with example embodiments. Among these figures.
Figure 2:
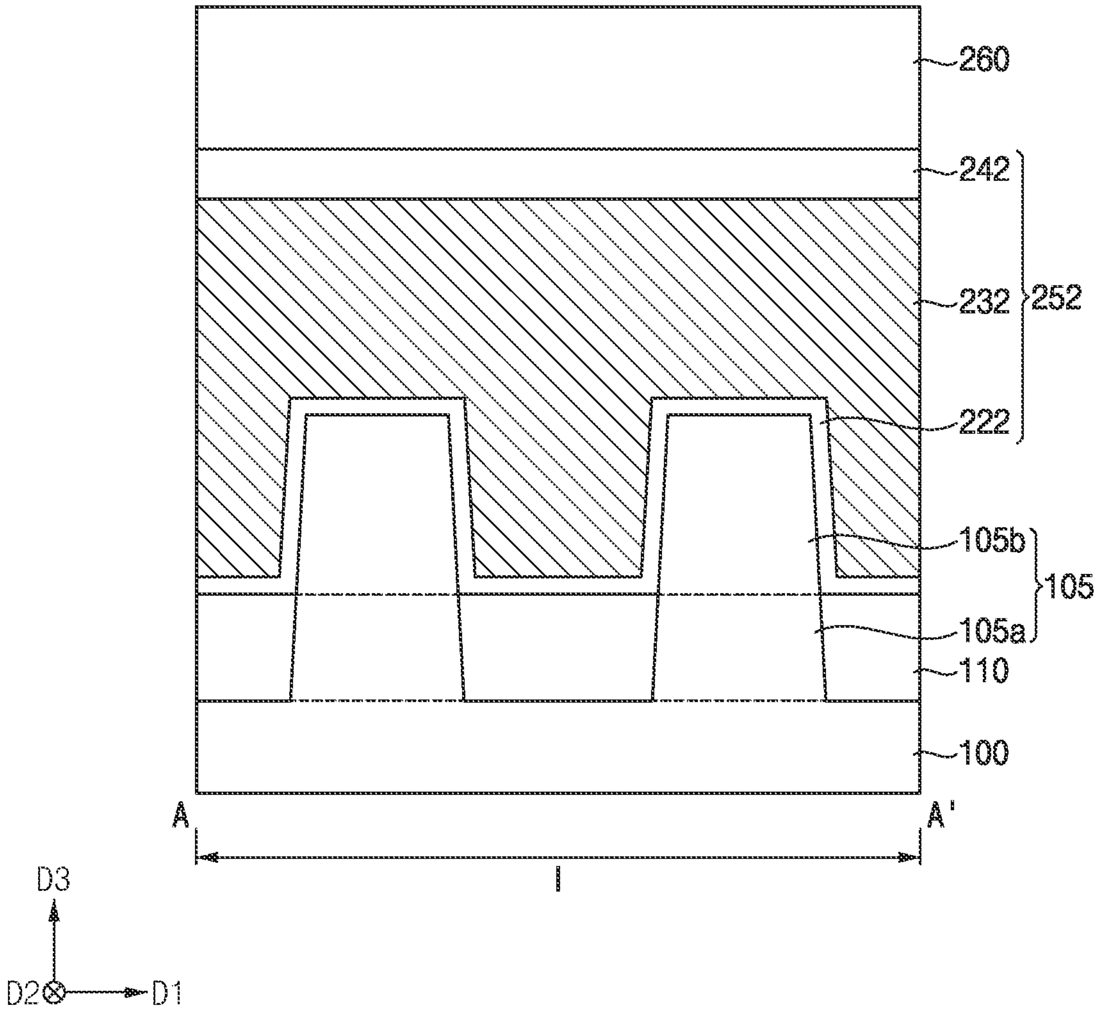
Figure 3:
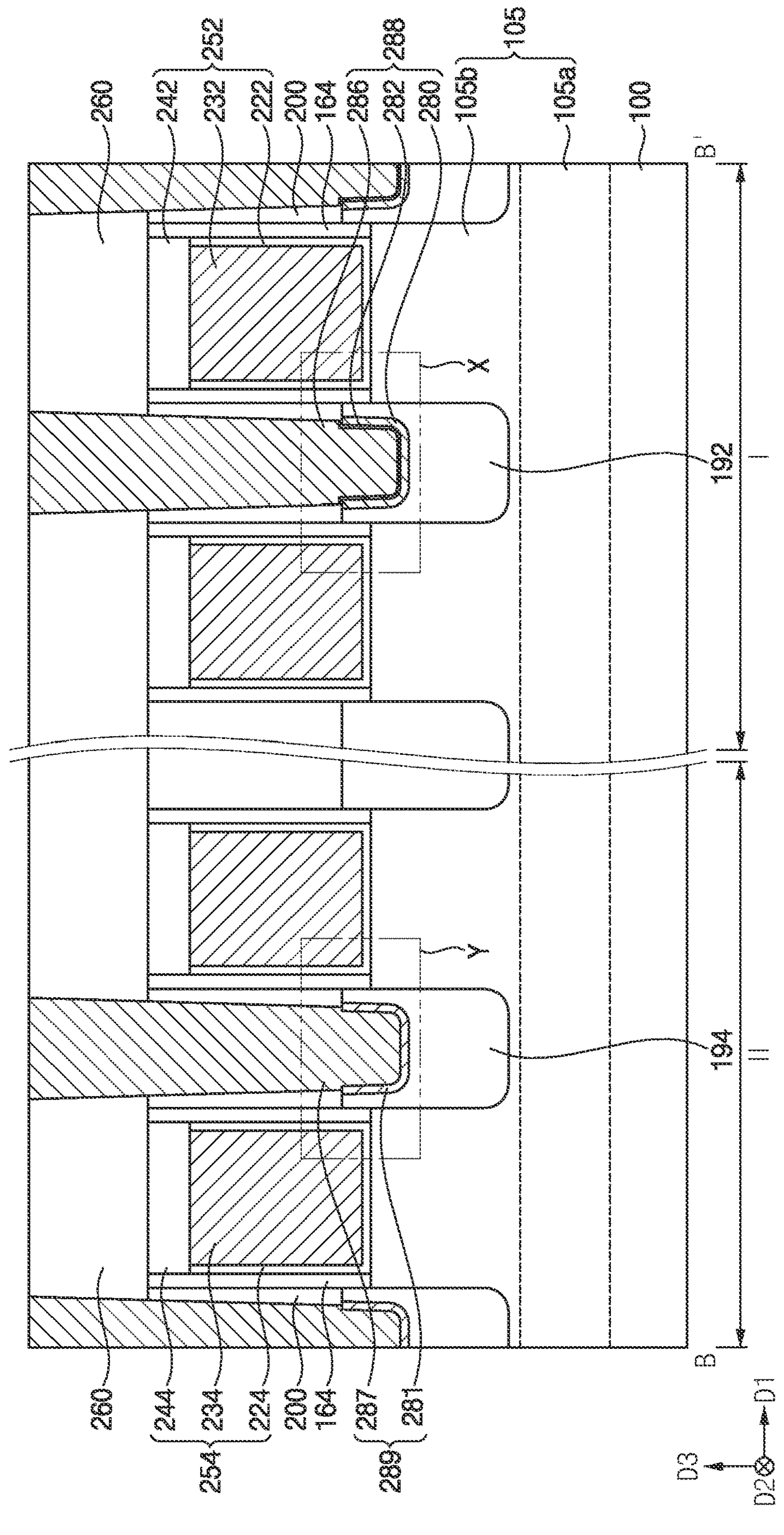
Figure 4:
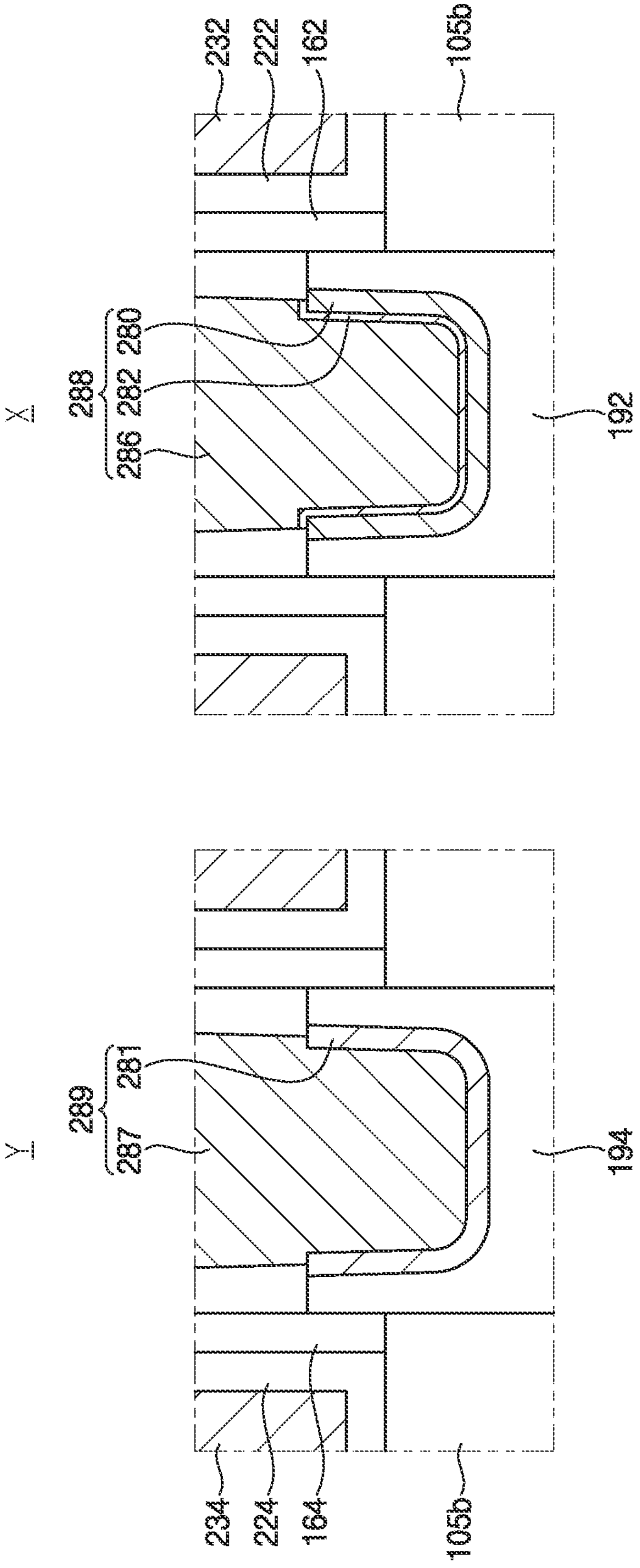
Figure 5:
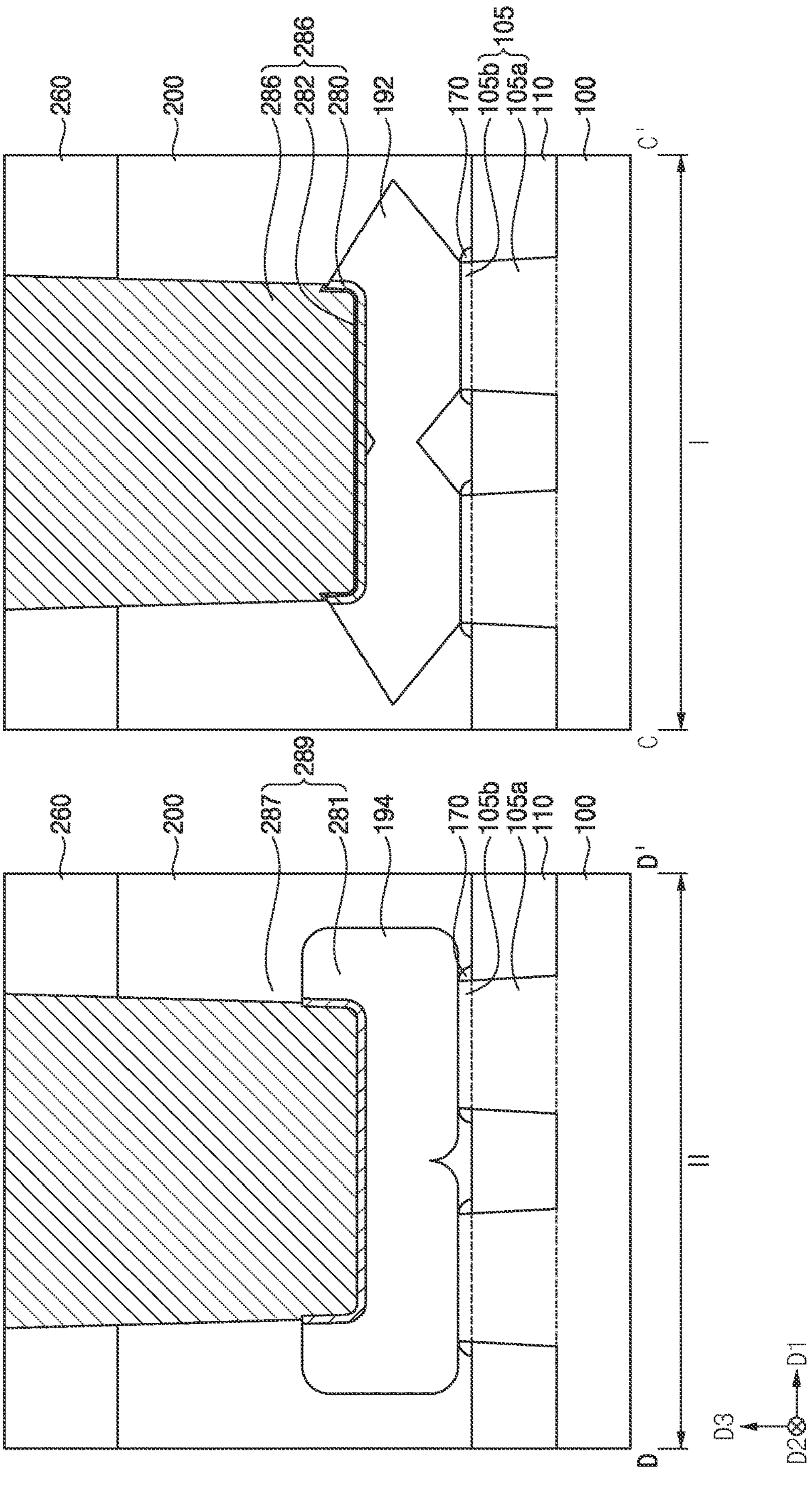

FIGS. 1 to 5 are a plan view and cross-sectional views illustrating a semiconductor device in accordance with example embodiments. Particularly, FIG. 1 is the plan view, and FIGS. 2, 3 and 5 are the cross-sectional views. FIG. 2 is a cross-sectional view taken along line A-A' of FIG. 1, FIG. 3 is a cross-sectional view taken along line B-B' of FIG. 1, and FIG. 5 includes cross-sectional views taken along lines C-C' and D-D', respectively, of FIG. 1. FIG. 4 is an enlarged cross-sectional view of regions X and Y of FIG. 3.

Referring to FIGS. 1 to 5, the semiconductor device may include a first active pattern 105, a first isolation pattern 110, first and second gate structures 252 and 254, first and second source/drain layers 192 and 194, first and second gate spacers 162 and 164, a fin spacer 170, first and second contact plug structures 288 and 289, and first and second insulating interlayers 200 and 260 on a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may include a silicon-on-insulator (SOI) substrate or a germanium-on-insulator (GOI) substrate.

The substrate 100 may include first and second regions I and II. The first region I may be a region on which PMOS transistors are disposed, and the second region II may be a region on which NMOS transistors are disposed.

FIGS. 1 to 5 show that the first and second regions I and II of the substrate 100 are disposed in the first direction D1, however, the inventive concept may not be limited thereto, and in some embodiments, the first and second regions I and II of the substrate 100 may be disposed in the second direction D2. For convenience below, an active pattern (or fin) 105 in the first region I is referred to as a first active pattern (or fin) 105, and an active pattern (or fin) 105 in the second region II is referred to as a second active pattern (or fin) 105. Likewise, an isolation pattern 110 in the first region I is referred to as a first isolation pattern 110, and an isolation pattern 110 in the second region II is referred to as a second isolation pattern 110. Other elements may be similarly described as a first element in the first region I and a corresponding second element in the second region II.

The first active pattern 105 may have a fin-like shape protruding from an upper surface of the substrate 100, and thus may also be referred to as a first active fin. A lower surface of the first active pattern 105 may be covered by the first isolation pattern 110. The substrate 100 may include a field region on which the first isolation pattern 110 is formed and an active region on which the first active pattern 105 is formed.

The first active pattern 105 may include a first lower active pattern 105*a* of which a sidewall is covered by the first isolation pattern 110 and a first upper active pattern 105*b* of which a sidewall is not covered by the first isolation pattern 110. In example embodiments, the first active pattern 105 may extend in the first direction D1, and a plurality of first active patterns 105 may be spaced apart from each other in the second direction D2.

The first active pattern 105 may include a material which is the same or substantially the same as that of the substrate 100, and the first isolation pattern 110 may include an oxide, e.g., silicon oxide.

In example embodiments, the first gate structure 252 may extend in the second direction D2 on the first active pattern 105 and the first isolation pattern 110 on the first region I of the substrate 100, and a plurality of first gate structures 252 may be spaced apart from each other in the first direction D1. Additionally, the second gate structure 254 may extend in the second direction D2 on the first active pattern 105 and the first isolation pattern 110 on the second region II of the substrate 100, and a plurality of second gate structures 254 may be spaced apart from each other in the first direction D1.

In example embodiments, the first gate structure 252 may include a first gate insulation pattern 222 and a first gate electrode 232 stacked on the first active pattern 105 and the first isolation pattern 110, and a first capping pattern 242 on the first gate insulation pattern 222 and the first gate electrode 232. The second gate structure 254 may include a second gate insulation pattern 224 and a second gate electrode 234 stacked on the second active pattern 105 and the second isolation pattern 110, and a second capping pattern 244 on the second gate insulation pattern 224 and the second gate electrode 234.

In example embodiments, the first gate insulation pattern 222 may cover a lower surface and a sidewall of the first gate electrode 232, and the first capping pattern 242 may contact upper surfaces of the first gate electrode 232 and the first gate insulation pattern 222. Additionally, the second gate insulation pattern 224 may cover a lower surface and a sidewall of the second gate electrode 234, and the second capping pattern 244 may contact upper surfaces of the second gate electrode 234 and the second gate insulation pattern 224.

In an example embodiment, the first gate structure 252 may further include a first interface pattern between the first gate insulation pattern 222 and the first active pattern 105 and/or the first isolation pattern 110. Additionally, the second gate structure 254 may further include a second interface pattern between the second gate insulation pattern 224 and the first active pattern 105 and/or the first isolation pattern 110. The first and second interface patterns may include an oxide, e.g., silicon oxide.

Each of the first and second gate insulation patterns 222 and 224 may include a metal oxide having a high dielectric constant, e.g., hafnium oxide, tantalum oxide, zirconium oxide, etc.

Each of the first and second gate electrodes 232 and 234 may include a metal nitride (e.g., titanium nitride, titanium aluminum nitride, tantalum nitride, tantalum aluminum nitride, etc.), a metal alloy (e.g., titanium aluminum, titanium aluminum carbide, titanium aluminum oxynitride, titanium aluminum carbonitride, titanium aluminum oxycarbonitride, etc.), a metal carbide, a metal oxynitride, a metal carbonitride, a metal oxycarbonitride, or a low resistance metal (e.g., tungsten, aluminum, copper, tantalum).

The first gate spacer 162 may be formed on each of opposite sidewalls in the first direction D1 of the first gate structure 252, and thus an outer sidewall of the first gate insulation pattern 222 and a sidewall of the first capping pattern 252 may contact an inner sidewall of the first gate spacer 162. Additionally, the second gate spacer 164 may be formed on each of opposite sidewalls in the first direction D1 of the second gate structure 254, and thus an outer sidewall of the second gate insulation pattern 224 and a sidewall of the second capping pattern 244 may contact an inner sidewall of the second gate spacer 164.

The fin spacer 170 may be formed on each of opposite sidewalls in the second direction D2 of the first active pattern 105.

The first and second gate spacers 162 and 164 and the fin spacer 170 may include an insulating nitride, e.g., silicon nitride (SiN), silicon oxynitride (SiON), silicon oxycarbonitride (SiOCN), etc.

The first source/drain layer 192 may be formed at each of opposite sides in the first direction D1 of the first gate structure 252, and may be interposed between ones of the first gate spacers 162 facing each other in the first direction D1. The second source/drain layer 194 may be formed at each of opposite sides in the first direction D1 of the second gate structure 254, and may be interposed between ones of the second gate spacers 164 facing each other in the first direction D1.

The first source/drain layer 192 may include single crystalline silicon-germanium doped with a p-type impurity, and thus may serve as a source/drain region of a PMOS transistor. The second source/drain layer 194 may include single crystalline silicon or single crystalline silicon carbide doped with n-type impurities, and thus may serve as a source/drain region of an NMOS transistor.

Each of the first and second source/drain layers 192 and 194 may be covered by the first insulating interlayer 200. The second insulating interlayer 260 may be formed on the first insulating interlayer 200, the first and second gate structures 252 and 254 and the first and second gate spacers 162 and 164.

Each of the first and second insulating interlayers 200 and 260 may include an insulating material, e.g., silicon oxycarbide (SiOC), silicon nitride (SiN), silicon oxynitride (SiON), silicon carbonitride (SiCN), silicon oxycarbonitride (SiOCN), etc.

The first and second contact plug structures 288 and 289 may extend through the first and second insulating interlayers 200 and 260, and may contact upper surfaces of the first and second source/drain layers 192 and 194, respectively. The first and second contact plug structures 288 and 289 may partially extend through upper portions of the first and second source/drain layers 192 and 194, respectively.

The first contact plug structure 288 may include a first metal silicide pattern 280, a first metal layer 282 and a first conductive pattern 286 sequentially stacked in the third direction D3.

The first metal silicide pattern 280 may be disposed on the upper surface of the first source/drain layer 192, and may include a silicide of a first metal and a germanide of the first metal. The first metal layer 282 may be disposed on the first metal silicide pattern 280, and may include a second metal. The first conductive pattern 286 may be disposed on the first metal layer 282.

In example embodiments, the first metal may include at least one metal having a work function that is greater than about 4.6 eV, such as molybdenum (Mo), tungsten (W), ruthenium (Ru), nickel (Ni), cobalt (Co), platinum (Pt), etc.

In example embodiments, the second metal may include at least one metal having a work function that is in a range of about 2.0 eV to about 4.5 eV, such as, titanium (Ti), yttrium (Y), lanthanum (La), hafnium (Hf), zirconium (Zr), scandium (Sc), manganese (Mn), aluminum (Al), erbium (Er), etc.

In example embodiments, the first conductive pattern 286 may include a third metal. The third metal may include, for example, molybdenum (Mo), cobalt (Co), tungsten (W), etc.

In example embodiments, the first metal silicide pattern 280 may further include a silicide of the second metal and a germanide of the second metal. In an example embodiment, a concentration of the second metal of a first portion of the first metal silicide pattern 280 that is nearer to the first metal layer 282 may be greater than a concentration of the second metal of a second portion of the first metal silicide pattern 280 that is farther to the first metal layer 282.

The second contact plug structure 289 may include a second metal silicide pattern 281 and a second conductive pattern 287 sequentially stacked in the third direction D3.

The second metal silicide pattern 281 may be disposed on the upper surface of the second source/drain layer 192, and may include a silicide of the first and second metals. The second conductive pattern 287 may be disposed on the second source/drain layer 192.

In an example embodiment, a concentration of the second metal of a first portion of the second metal silicide pattern 281 that is farther from the second source/drain layer 194 may be greater than a concentration of the second metal of a second portion of the second metal silicide pattern 281 that is nearer to the second source/drain layer 194.

In example embodiments, a first ratio R1 (molar ratio), which is a ratio of the first metal to the second metal in the first metal silicide pattern 280 may be greater than a second ratio R2 (molar ratio), which is a ratio of the first metal to the second metal in the second metal silicide pattern 281. Accordingly, a work function of the first metal silicide pattern 280 on the first source/drain layer 192 may be greater than a work function of the second metal silicide pattern 281 on the second source/drain layer 194.

In other words, a work function of a first ohmic contact structure, that is, the first metal silicide pattern 280, which may be disposed between the first source/drain layer 192 and the first conductive pattern 286, may be different from a work function of a second ohmic contact structure, that is, the second metal silicide pattern 281, which may be disposed between the second source/drain layer 194 and the second conductive pattern 287.

Specifically, the first metal silicide pattern 280 on the first source/drain layer 192, which may include silicon-germanium doped with a p-type impurity and serve as a source/drain of a PMOS transistor, may include a higher proportion of the first metal with a relatively large work function than the second metal with a relatively small work function. The second metal silicide pattern 281 on the second source/drain layer 194, which may include silicon or silicon carbide doped with n-type impurities and serve as a source/drain of an NMOS transistor, may include a lower proportion of the first metal with a relatively large work function than the second metal with a relatively small work function. Accordingly, the work function of the first metal silicide pattern 280 may be greater than the work function of the second metal silicide pattern 281.

Accordingly, a contact resistance between the first source/drain layer 192 and the first contact plug structure 288 and a contact resistance between the second source/drain layer 194 and the second contact plug structure 289 may decrease.

The semiconductor device may include the first gate structure 252 on the first active fin 105 serving as a channel and the first source/drain layers 192 on portions of the first active fin 105 adjacent to the first gate structure 252, and may include the second gate structure 254 on the first active fin 105 and the second source/drain layers 194 on portions of the first active fin 105 adjacent to the second gate structure 254. Thus, the semiconductor device may include a finFET.

Vias and wirings that may apply electrical signals to the first and contact plugs 288 and 289 may be further formed thereon.

FIGS. 6 to 20 are plan views and cross-sectional views for reference in describing a method of manufacturing a semiconductor device in accordance with example embodiments. Particularly, FIGS. 6, 9, 13 and 16 are the plan views, and FIGS. 7-8, 10-12, 14-15 and 17-20 are the cross-sectional views.

Figure 7:
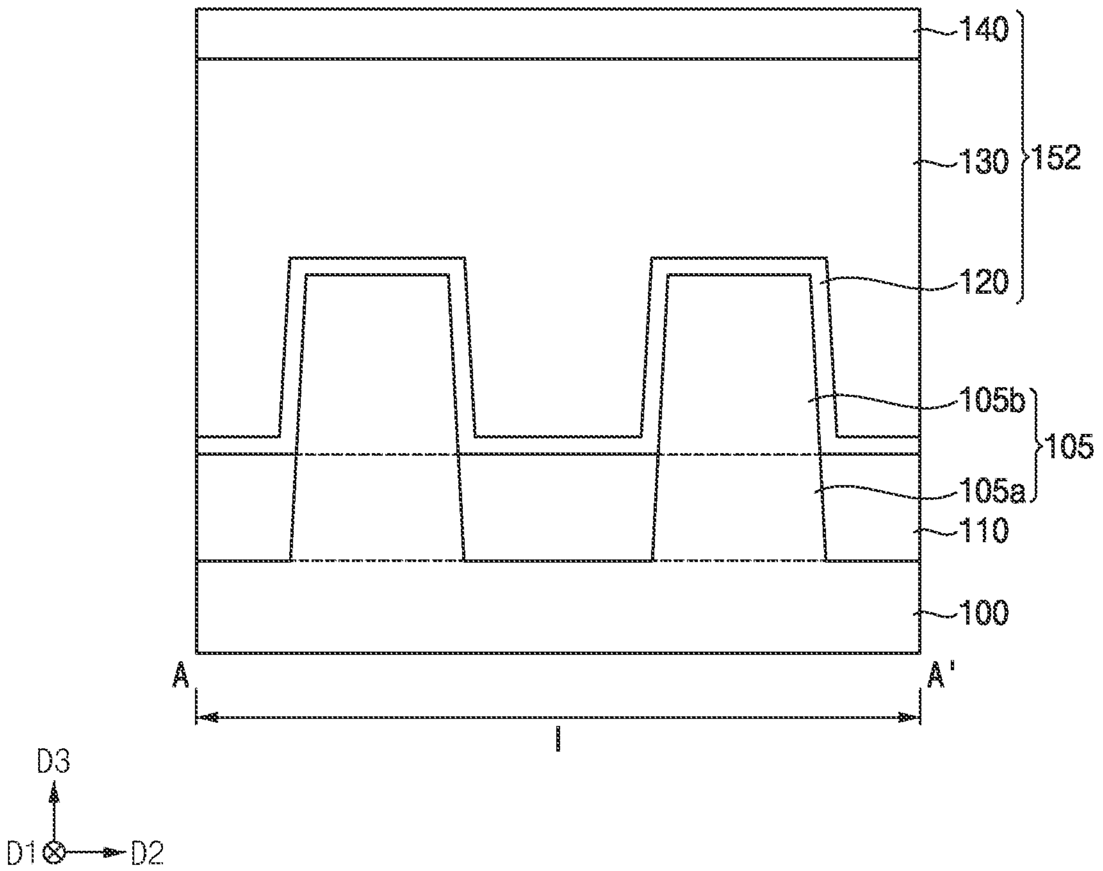
Figure 8:
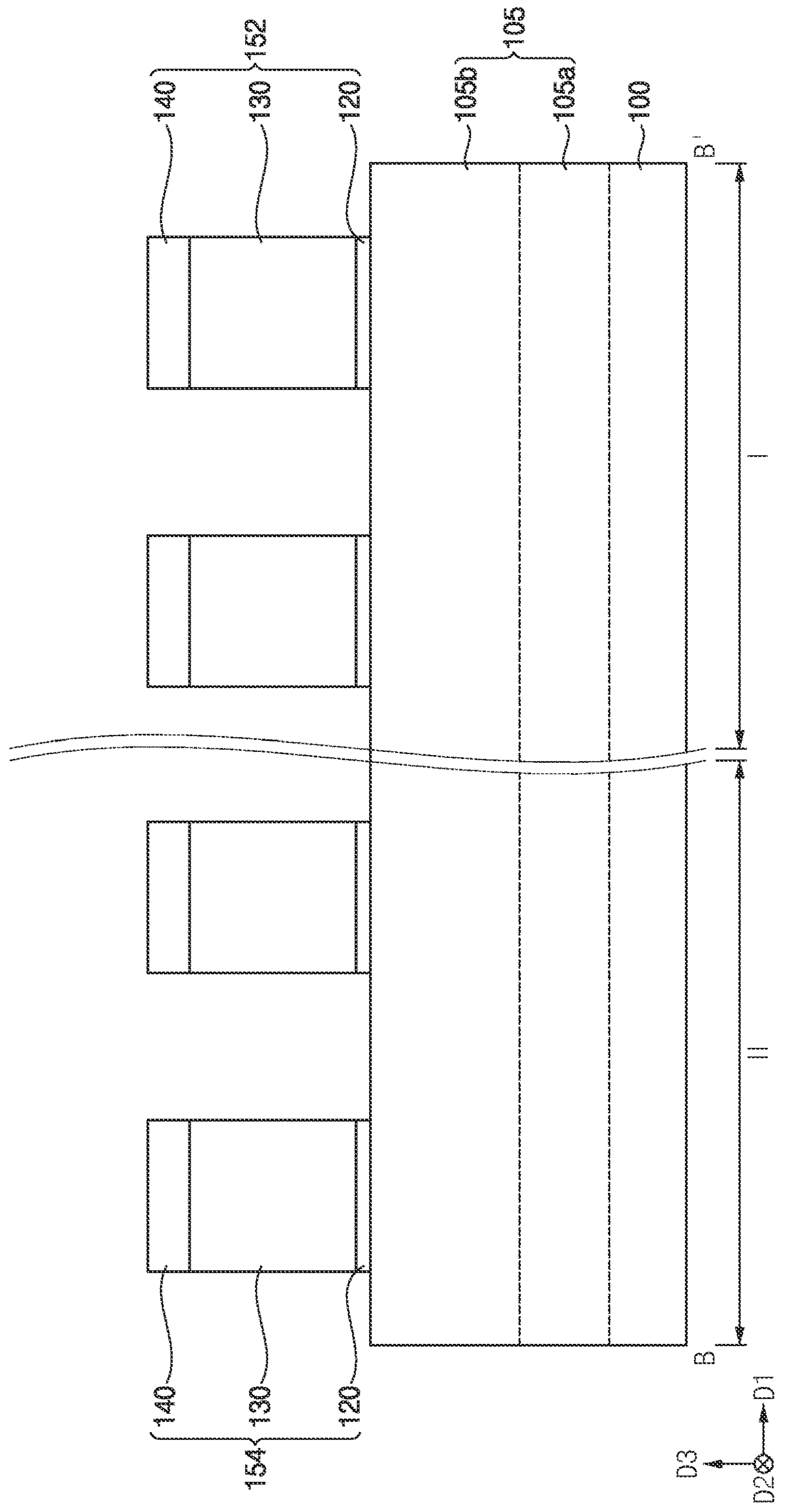
Figure 9:
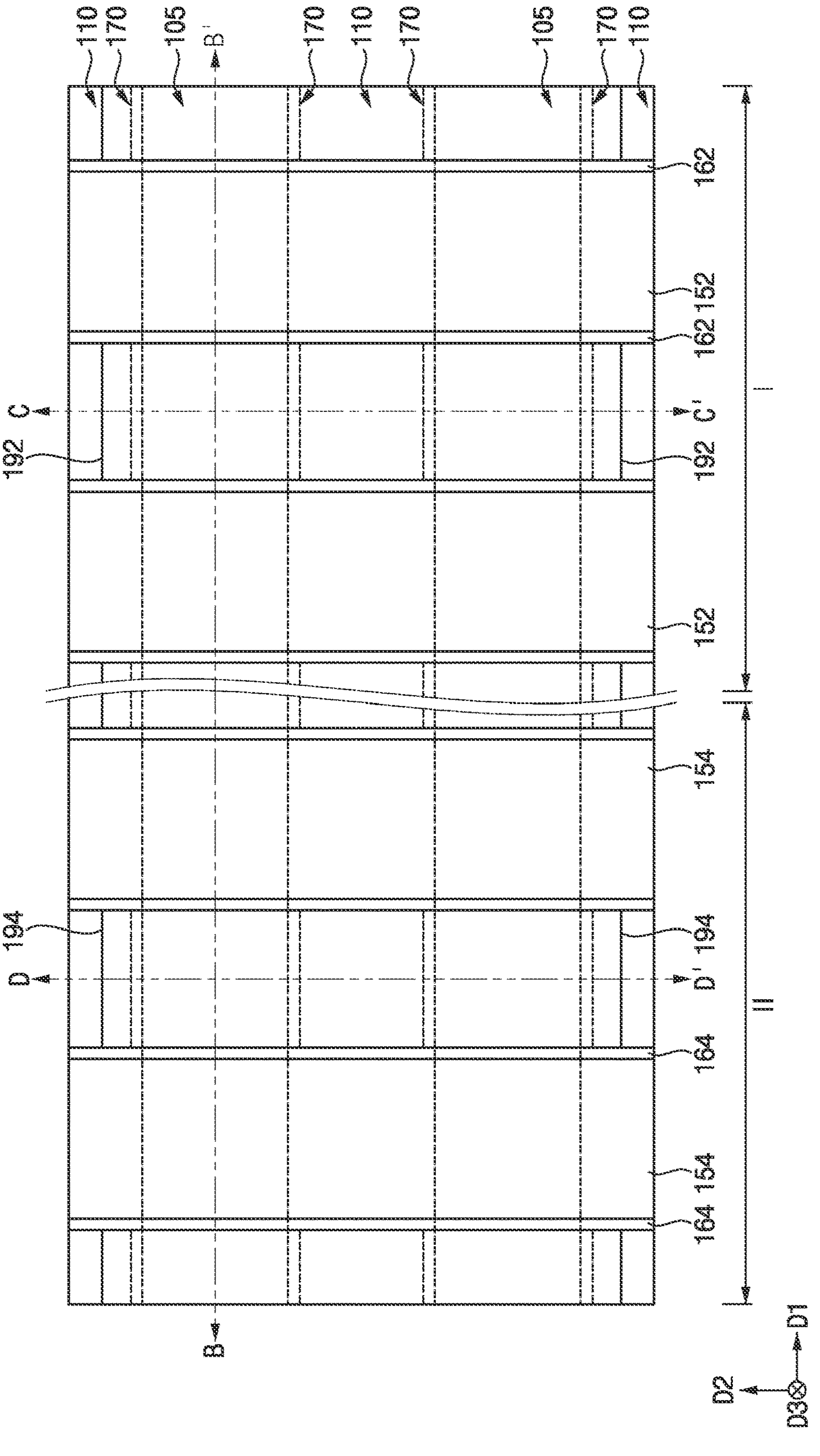
Figure 10:
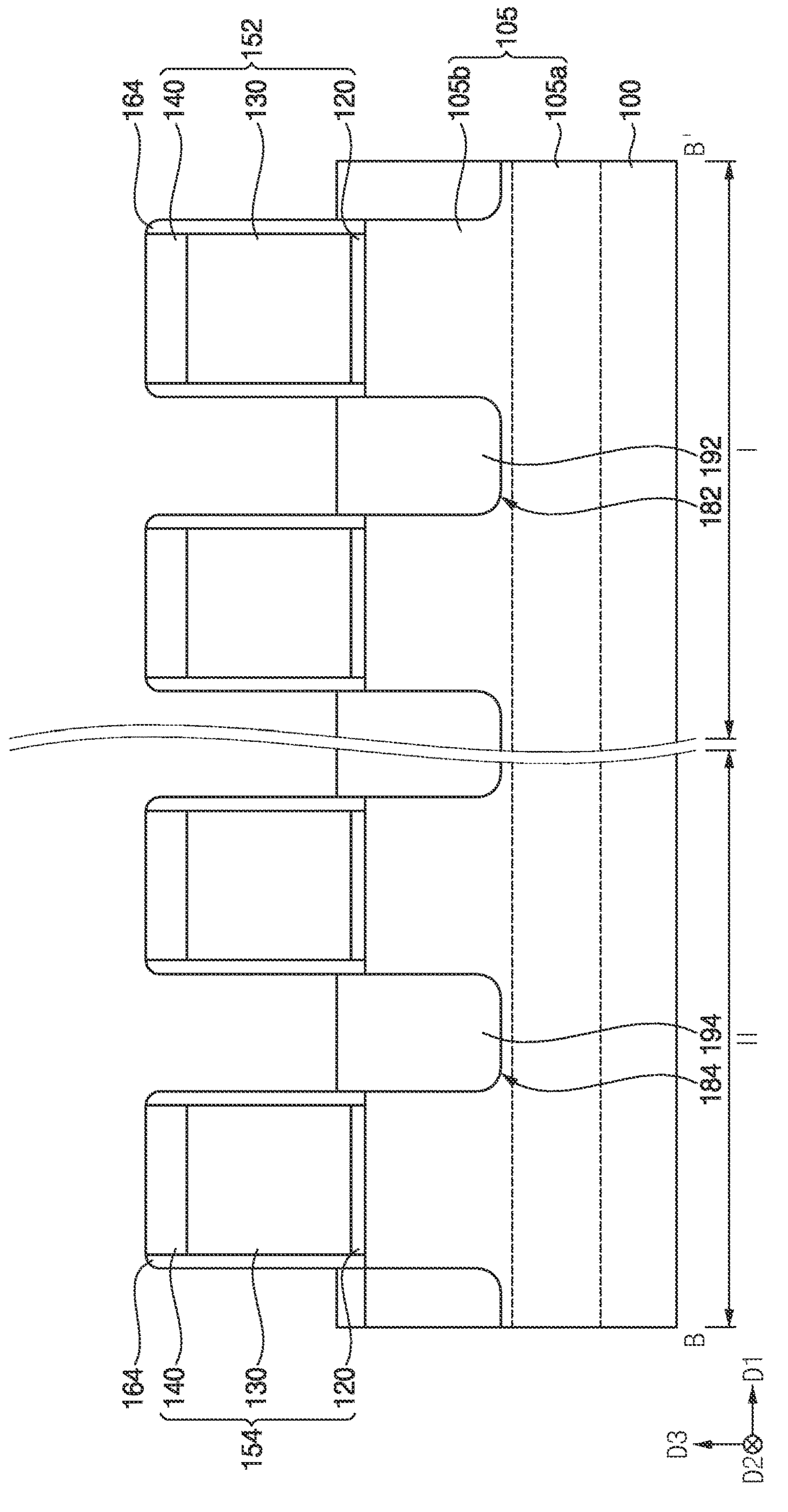
Figure 11:
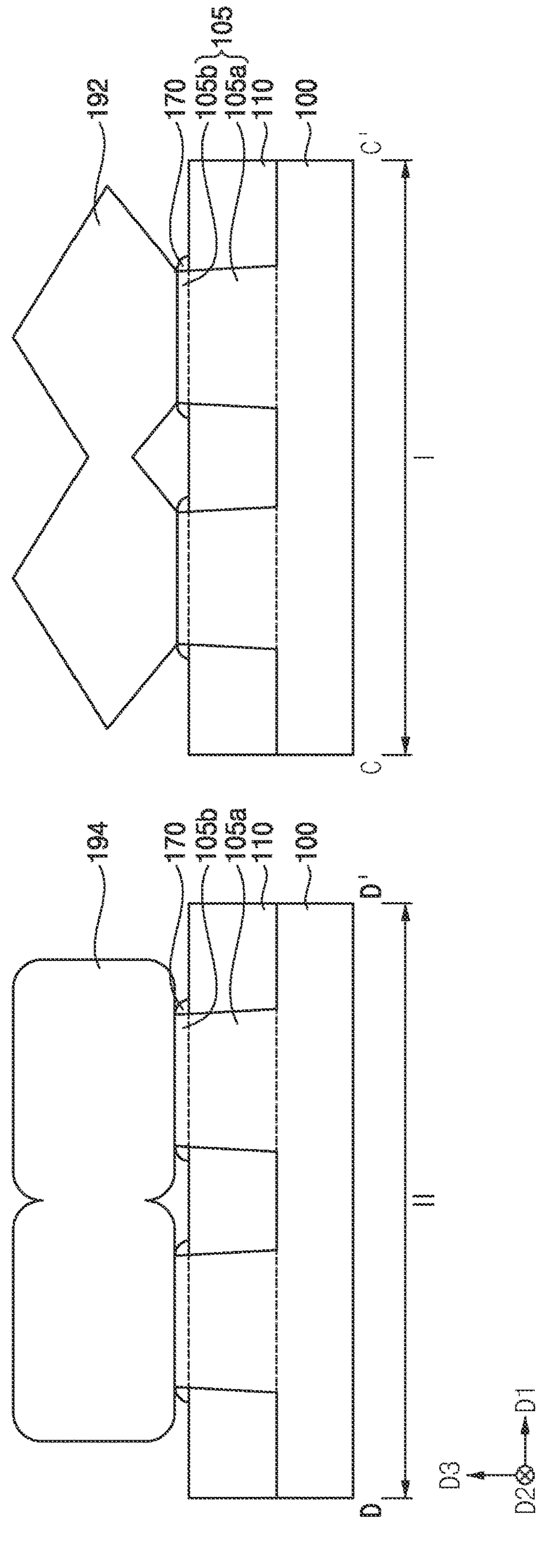
Figure 14:
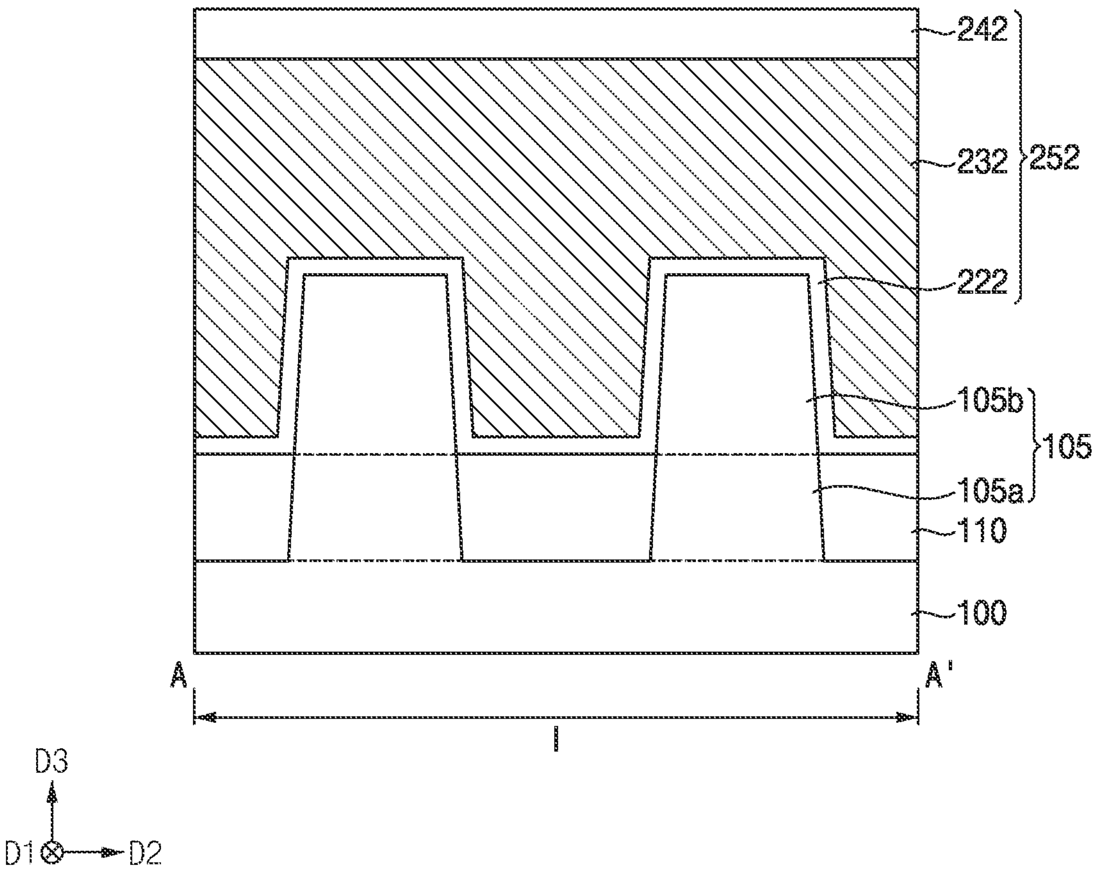
Figure 19:
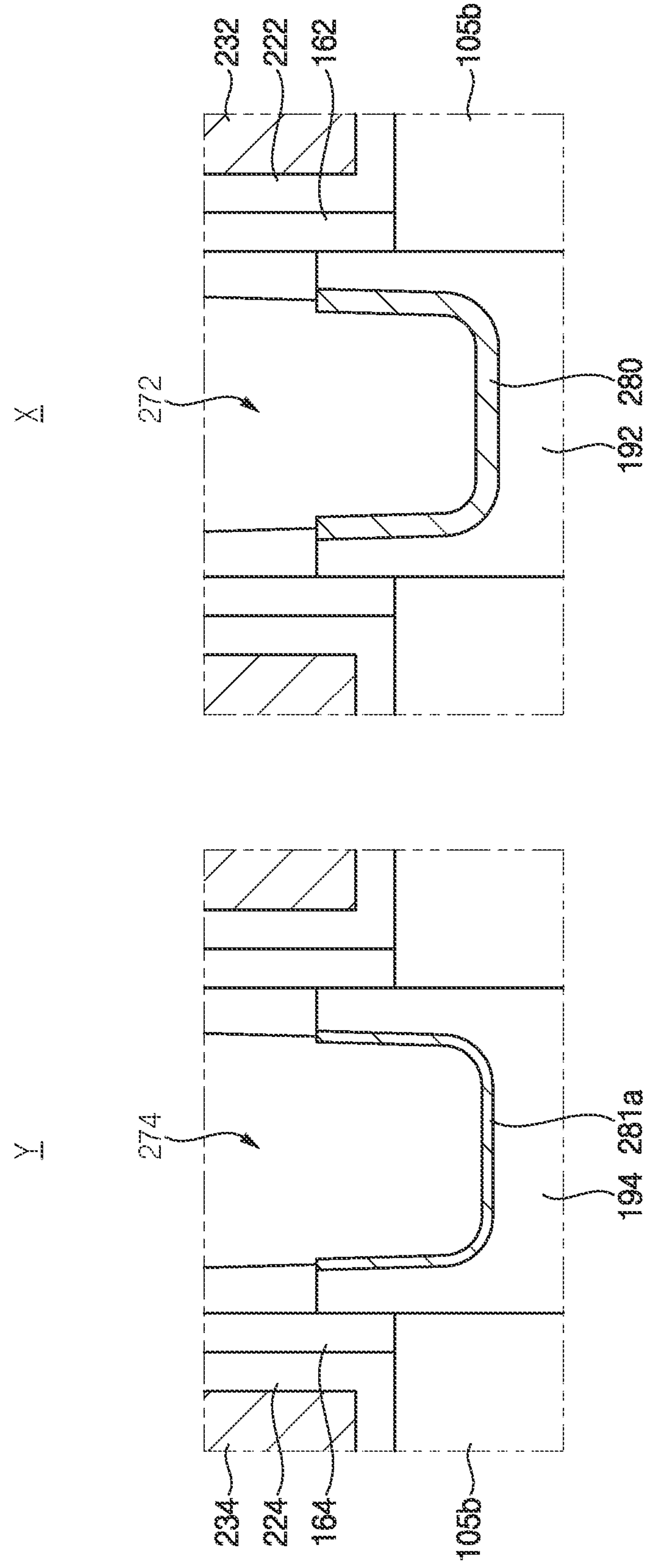
Figure 20:
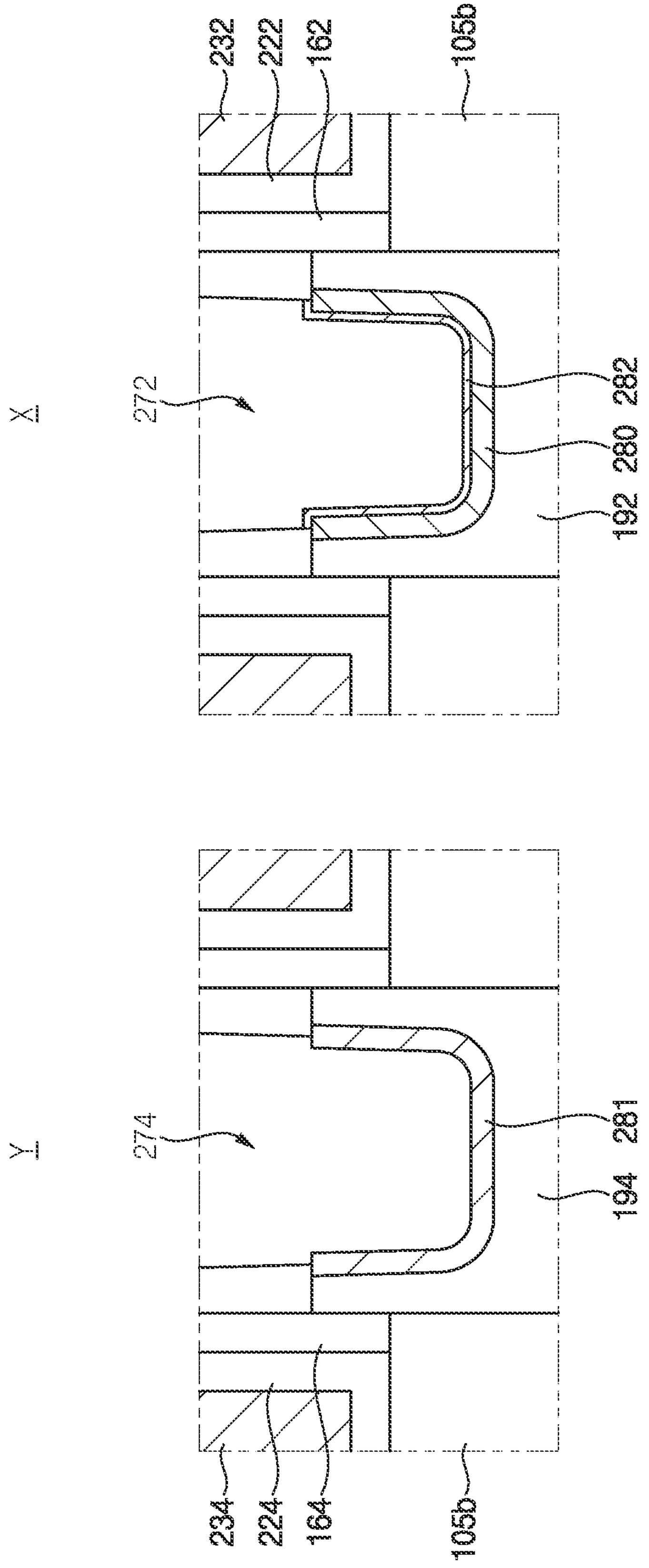

FIGS. 7 and 14 are cross-sectional views taken along lines A-A' of corresponding plan views, respectively, FIGS. 8, 10, 12, 15 and 17 are cross-sectional views taken along lines B-B' of corresponding plan views, respectively, and FIG. 11 includes cross-sectional views taken along lines C-C' and D-D', respectively, of FIG. 9. FIGS. 18 to 20 are enlarged cross-sectional views of regions X and Y of FIG. 17.

Figure 6:
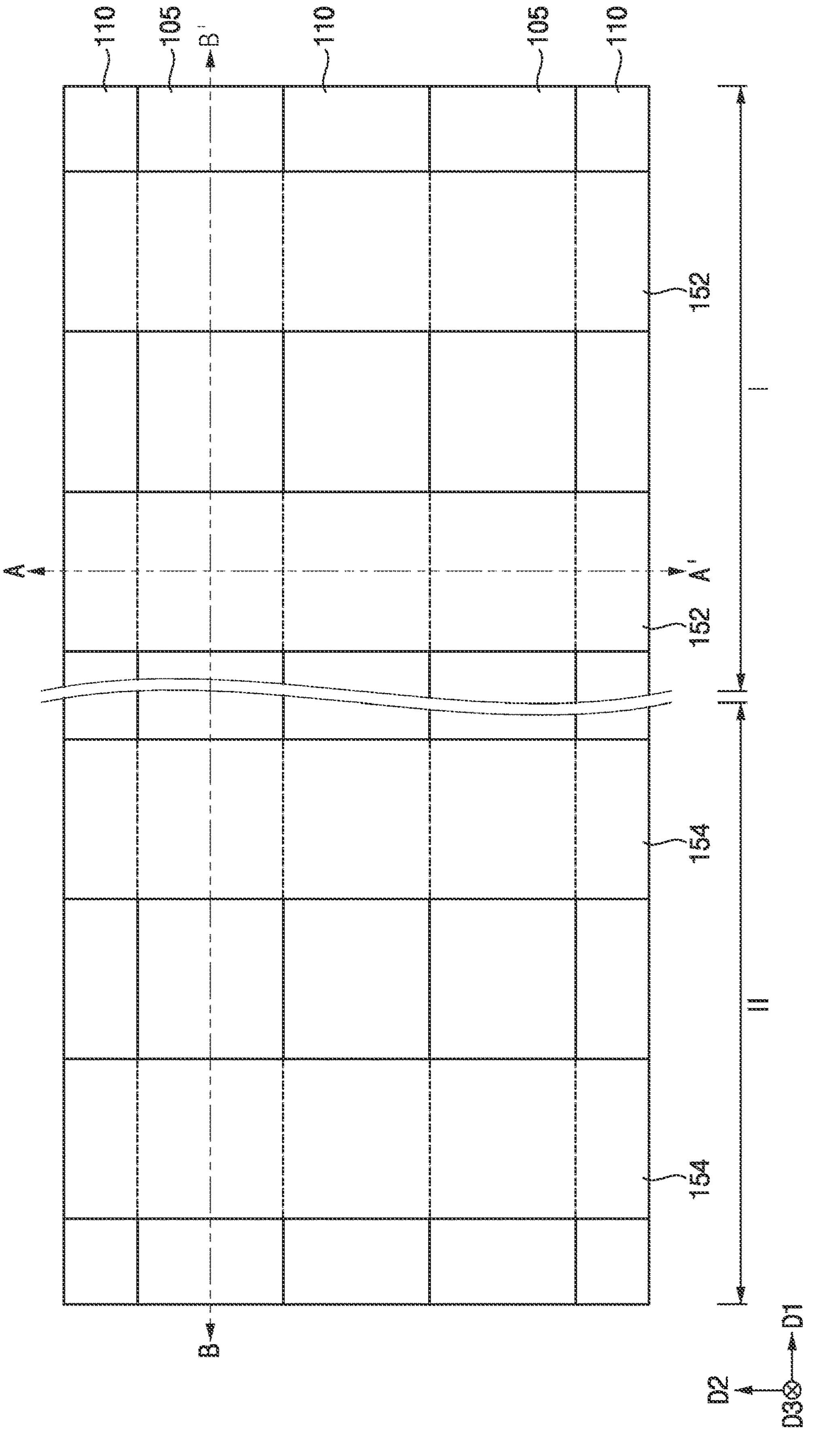
FIGS. 6 to 20 are plan views and cross-sectional views for reference in describing a method of manufacturing a semiconductor device in accordance with example embodiments.

Referring to FIGS. 6 to 8, an upper portion of a substrate 100 including first and second regions I and II may be removed to form a first trench, and an isolation pattern 110 may be formed in a lower portion of the first trench.

FIGS. 6 to 8 show that the first and second regions I and II are arranged in the first direction D1, however, the inventive concept is not limited thereto, and, for example, the first and second regions I and II of the substrate 100 may be arranged in the second direction D2.

In example embodiments, the isolation pattern 110 may be formed by forming a first isolation layer on the substrate 100 to fill the first trench, planarizing the first isolation layer until an upper surface of the substrate 100 is exposed, and removing an upper portion of the first isolation layer to expose an upper portion of the first trench. As the isolation pattern 110 is formed on the substrate 100, an active pattern 105 may be defined on the substrate 100.

The planarization process may include, e.g., a chemical mechanical polishing (CMP) process and/or an etch back process.

In example embodiments, the active pattern 105 may extend in the first direction D1, and a plurality of active patterns (or fins) 105 may be spaced apart from each other in the second direction D2.

First and second dummy gate structures 152 and 154 may be formed on the first and second regions I and II, respectively, of the substrate 100 having the active pattern 105 and the isolation pattern 110 thereon. Each of the first and second dummy gate structures 152 and 154 may include a first dummy gate insulation pattern 120, a first dummy gate electrode 130 and a first dummy gate mask 140 sequentially stacked.

The first dummy gate insulation pattern 120 may include an oxide, e.g., silicon oxide, the first dummy gate electrode 130 may include, e.g., polysilicon, and the first dummy gate mask 140 may include an insulating nitride, e.g., silicon nitride.

In example embodiments, each of the first and second dummy gate structures 152 and 154 may extend in the second direction D2. A plurality of first dummy gate structures 152 may be spaced apart from each other in the first direction D1 on the first region I of the substrate 100, and a plurality of second dummy gate structures 154 may be spaced apart from each other in the first direction D1 on the second region II of the substrate 100.

Referring to FIGS. 9 to 11, a first gate spacer 162 may be formed on each of opposite sidewalls in the first direction D1 of the first dummy gate structure 152, and a second gate spacer 164 may be formed on each of opposite sidewalls in the first direction D1 of the second dummy gate structure 154. Additionally, a fin spacer 170 may be formed on each of opposite sidewalls in the second direction D2 of the active pattern 105.

The first and second gate spacers 162 and 164 and the fin spacer 170 may be formed by forming a first spacer layer on the substrate 100 having the active pattern 105, the first isolation pattern 110 and the first and second dummy gate structures 152 and 154 thereon, and anisotropically etching the first spacer layer. The first and second gate spacers 162 and 164 and the fin spacer 170 may include an insulating nitride, e.g., silicon nitride (SiN), silicon oxynitride (SiON), silicon oxycarbonitride (SiOCN), etc.

Upper portions of the active pattern 105 may be etched using the first and second dummy gate structures 152 and 154 and the first and second gate spacers 162 and 164 as an etching mask to form first and second recesses 182 and 184, respectively.

FIG. 10 shows that each of the first and second recesses 182 and 184 is formed by partially removing the upper active pattern 105*b*. However, the inventive concept is not limited thereto, and, for example, each of the first and second recesses 182 and 184 may be formed by partially removing the lower active pattern 105*a* as well as the upper active pattern 105*b*.

The anisotropic etching process of the first spacer layer and the etching process for forming the first and second recesses 182 and 184 may be performed in-situ.

First and second selective epitaxial growth (SEG) processes may be performed using respective upper surfaces of the active pattern 105 exposed by the first and second recesses 182 and 184 as a seed to form first and second source/drain layers 192 and 194, respectively, on portions of the active pattern 105 on the first and second regions I and II, respectively, of the substrate 100.

The first SEG process may be performed using a silicon source gas, e.g., dichlorosilane ($SiH_2Cl_2$) gas, a germanium source gas (e.g., germane ($GeH_4$) gas), and a p-type impurity source gas (e.g., diborane ($B_2H_6$) gas), so that a single crystalline silicon-germanium layer doped with p-type impurities may be formed as the first source/drain layer 192.

The second SEG process may be performed using a silicon source gas, e.g., disilane ($Si_2H_6$) gas and an n-type impurity source gas, e.g., $PH_3$, $POCl_3$, $P_2O_5$, etc., so that a single crystalline silicon layer doped with n-type impurities or a single crystalline silicon carbide layer doped with n-type impurities may be formed as the second source/drain layer 194.

The first and second source/drain layers 192 and 194 may fill the first and second recesses 182 and 184, respectively, and may further grow to contact lower sidewalls of the first and second gate spacers 162 and 164, respectively. Each of the first and second source/drain layers 192 and 194 may grow in a horizontal direction as well as a vertical direction. The first source/drain layer 192 may have a cross-section in the second direction D2 having a shape of a pentagon or a rhombus, and the second source/drain layer 194 may have a cross-section in the second direction D2 having a shape of a rectangle with rounded corners or a circle.

If a distance between ones of the first active patterns 105 neighboring in the second direction D2 on the first region I of the substrate 100 is small, ones of the first source/drain layers 192 grown from upper surfaces of the neighboring ones of the first active patterns 105 may be merged with each other. Likewise, if a distance between ones of the second active patterns 105 neighboring in the second direction D2 on the second region II of the substrate 100 is small, ones of the second source/drain layers 194 grown from upper surfaces of the neighboring ones of the second active patterns 105 may be merged with each other.

Figure 12:
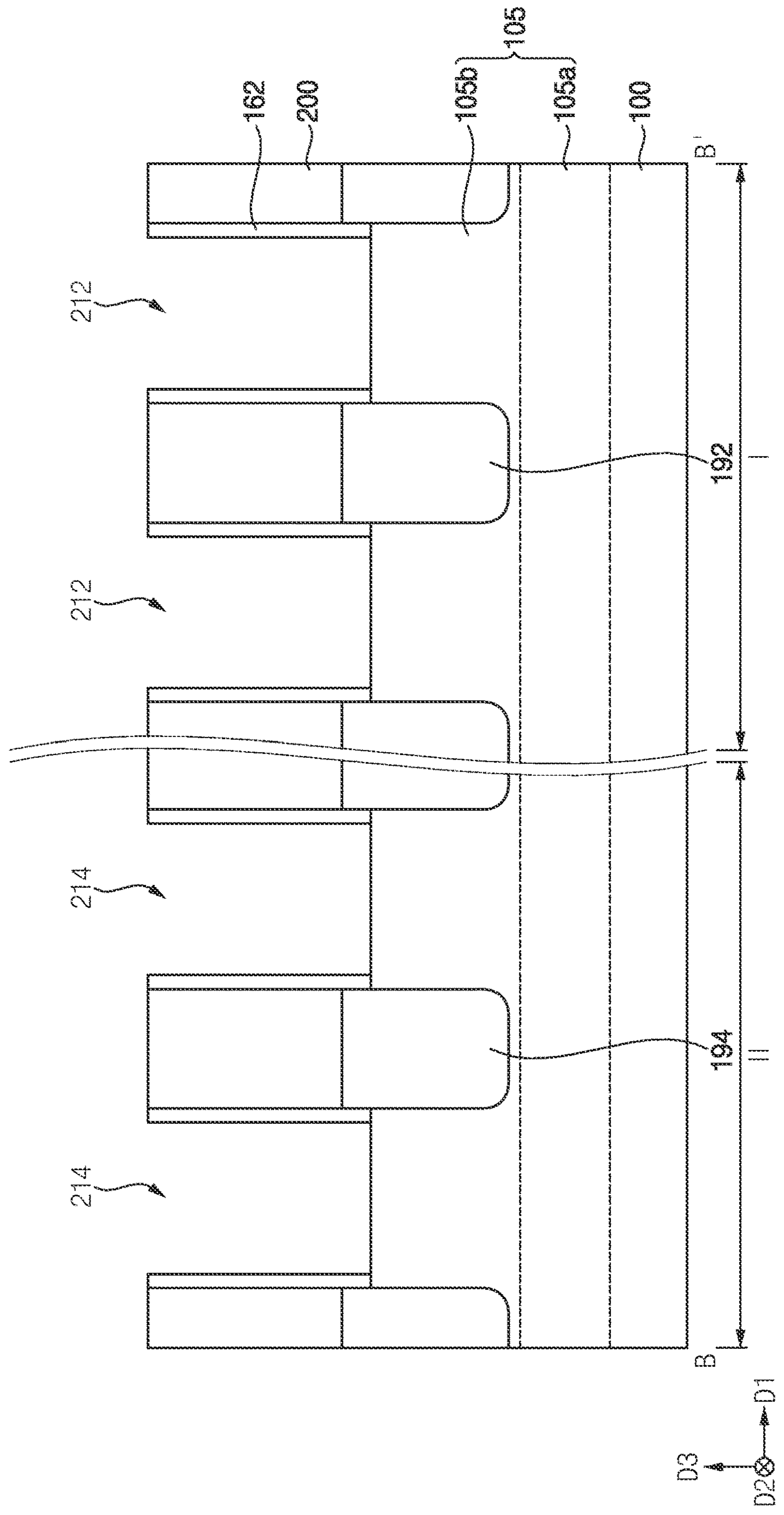

Referring to FIG. 12, a first insulating interlayer 200 may be formed on the substrate 100 having the first and second dummy gate structures 152 and 154, the first and second gate spacers 162 and 164, the fin spacer 170, the first and second source/drain layers 192 and 194 and the first isolation pattern 110 thereon to have an upper surface higher than upper surfaces of the first and second dummy gate structures 152 and 154 and the first and second gate spacers 162 and 164.

A planarization process may be performed until an upper surface of the first dummy gate electrode 130 included in each of the first and second dummy gate structures 152 and 154 is exposed to remove an upper portion of the first insulating interlayer 200 and the first dummy gate mask 140 included in each of the first and second dummy gate structures 152 and 154, and upper portions of the first and second gate spacers 162 and 164 may also be removed.

The first dummy gate electrode 130 and the first dummy gate insulation pattern 120 may be removed to form first and second openings 212 and 214 on the first and second regions I and II, respectively, of the substrate 100, which may expose upper surfaces of the active pattern 105 and the isolation pattern 110.

In example embodiments, the first dummy gate electrode 130 and the first dummy gate insulation pattern 120 may be removed by sequentially performing a dry etching process and a wet etching process. The wet etching process may be performed using, e.g., hydrofluoric acid (HF) as an etching solution.

Figure 13:
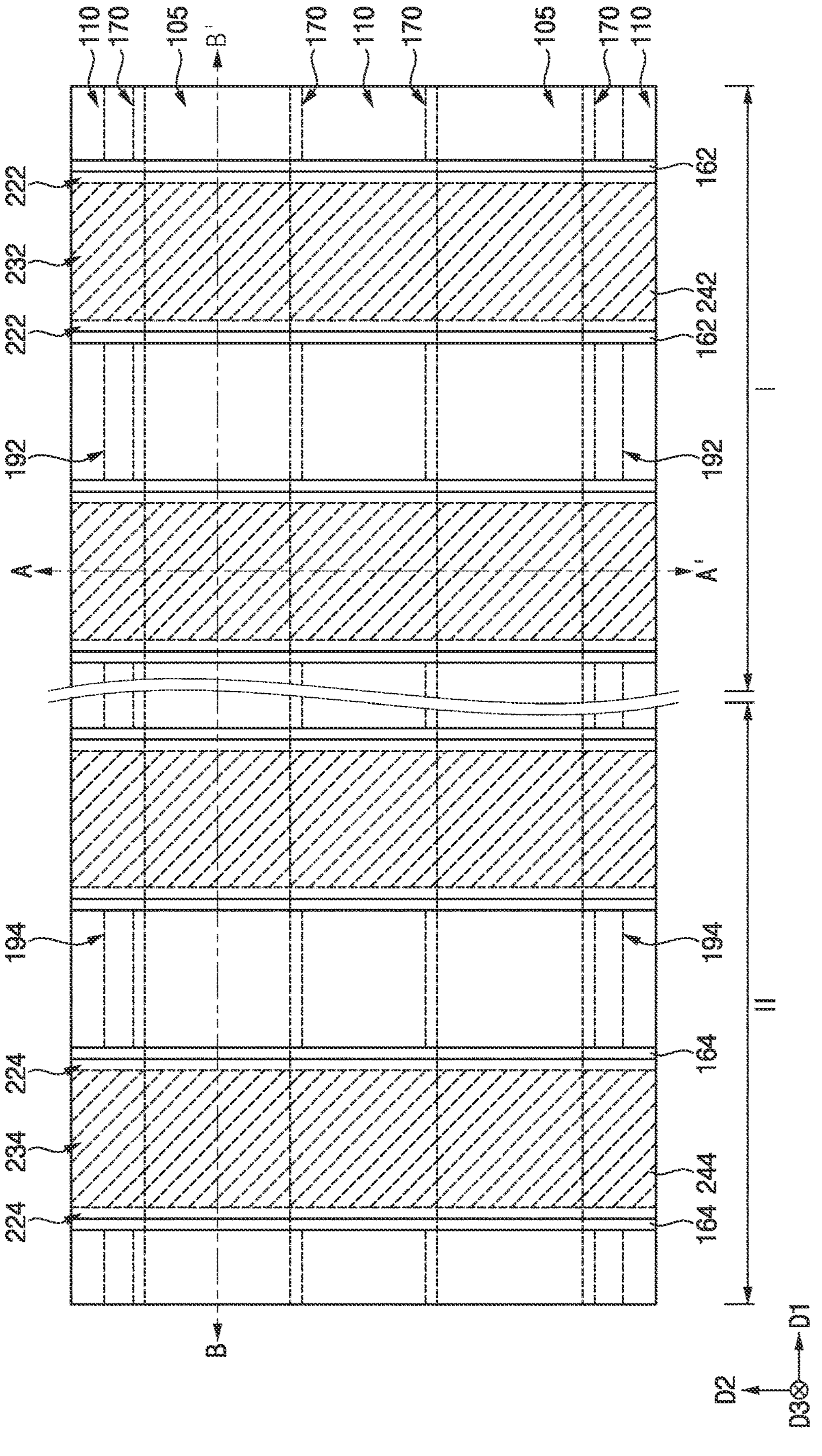
Figure 15:
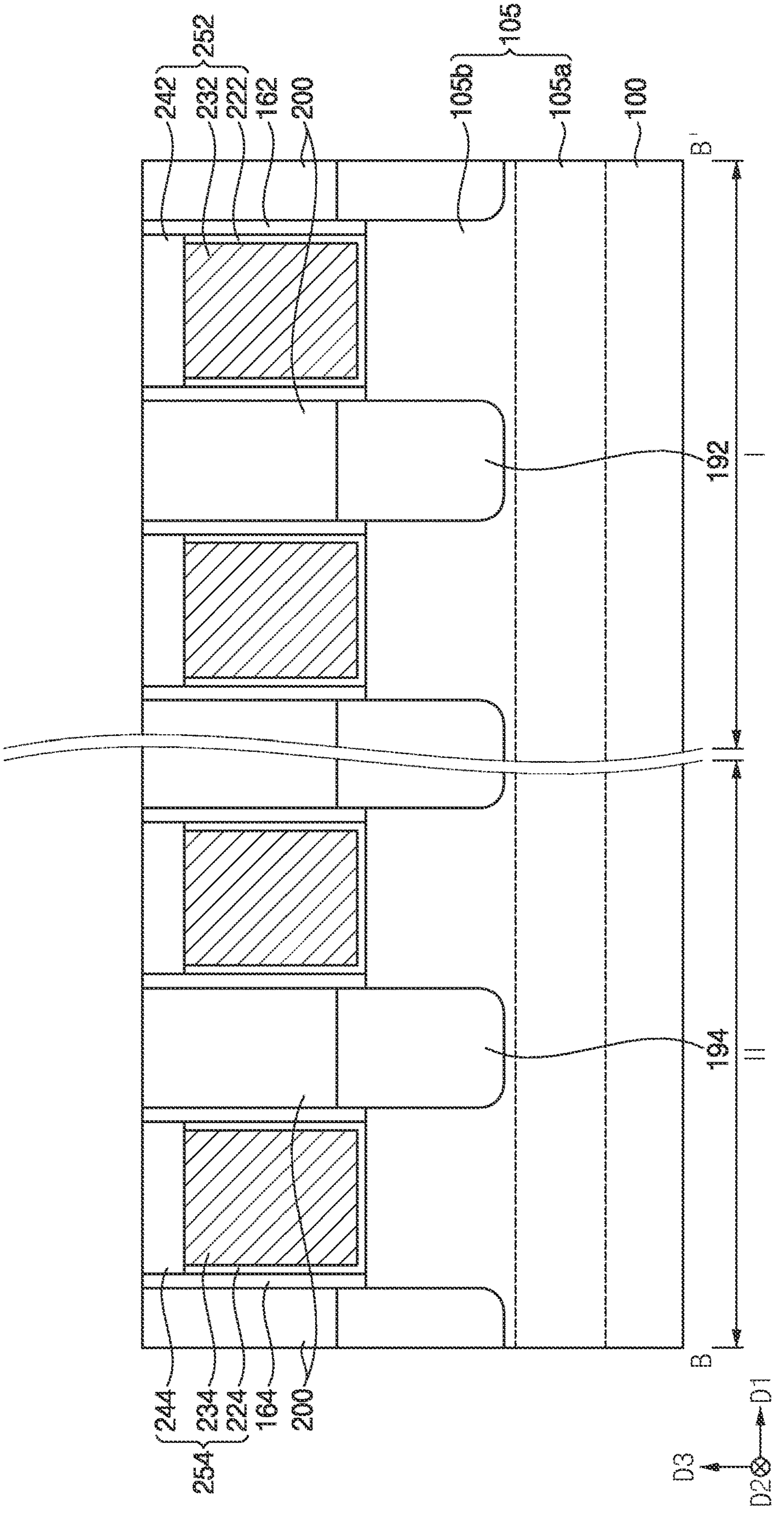

Referring to FIGS. 13 to 15, a first gate insulation layer may be formed on bottoms and sidewalls of the first and second openings 212 and 214 and an upper surface of the first insulating interlayer 200, a first gate electrode layer may be formed on the first gate insulation layer to fill remaining portions of the first and second openings 212 and 214, and the first gate electrode layer and the first gate insulation layer may be planarized until the upper surface of the first insulating interlayer 200 is exposed.

Thus, a first gate electrode 232 and a first gate insulation pattern 222 covering a lower surface and a sidewall of the first gate electrode 232 may be formed in the first opening 212, and a second gate electrode 234 and a second gate insulation pattern 224 covering a lower surface and a sidewall of the second gate electrode 234 may be formed in the second opening 214.

In an example embodiment, the first gate electrode layer may include a barrier layer and a gate conductive layer, and in this case, each of the first and second gate electrodes 232 and 234 may include a barrier pattern and a conductive pattern.

Upper portions of the first gate electrode 232 and the first gate insulation pattern 222 may be removed to form a third recess, and upper portions of the second gate electrode 234 and the second gate insulation pattern 224 may be removed to form a fourth recess.

Additionally, first and second capping patterns 242 and 244 may be formed in the third and fourth recesses, respectively.

Thus, a first gate structure 252 including the first gate insulation pattern 222 on upper surfaces of the first active pattern 105 and the first isolation pattern 110 and a lower inner sidewall of the first gate spacer 162 in the first opening 212, the first gate electrode 232 on the first gate insulation pattern 222 in a lower portion of the first opening 212, and the first capping pattern 242 on the first gate insulation pattern 222 and the first gate electrode 232 in an upper portion of the first opening 212 and contacting an upper inner sidewall of the first gate spacer 162 may be formed on the first region I of the substrate 100.

Additionally, a second gate structure 254 including the second gate insulation pattern 224 on upper surfaces of the second active pattern 105 and the second isolation pattern 110 and a lower inner sidewall of the second gate spacer 164 in the second opening 214, the second gate electrode 234 on the second gate insulation pattern 224 in a lower portion of the second opening 214, and the second capping pattern 244 on the second gate insulation pattern 224 and the second gate electrode 234 in an upper portion of the second opening 214 and contacting an upper inner sidewall of the second gate spacer 164 may be formed on the second region II of the substrate 100.

Figure 16:
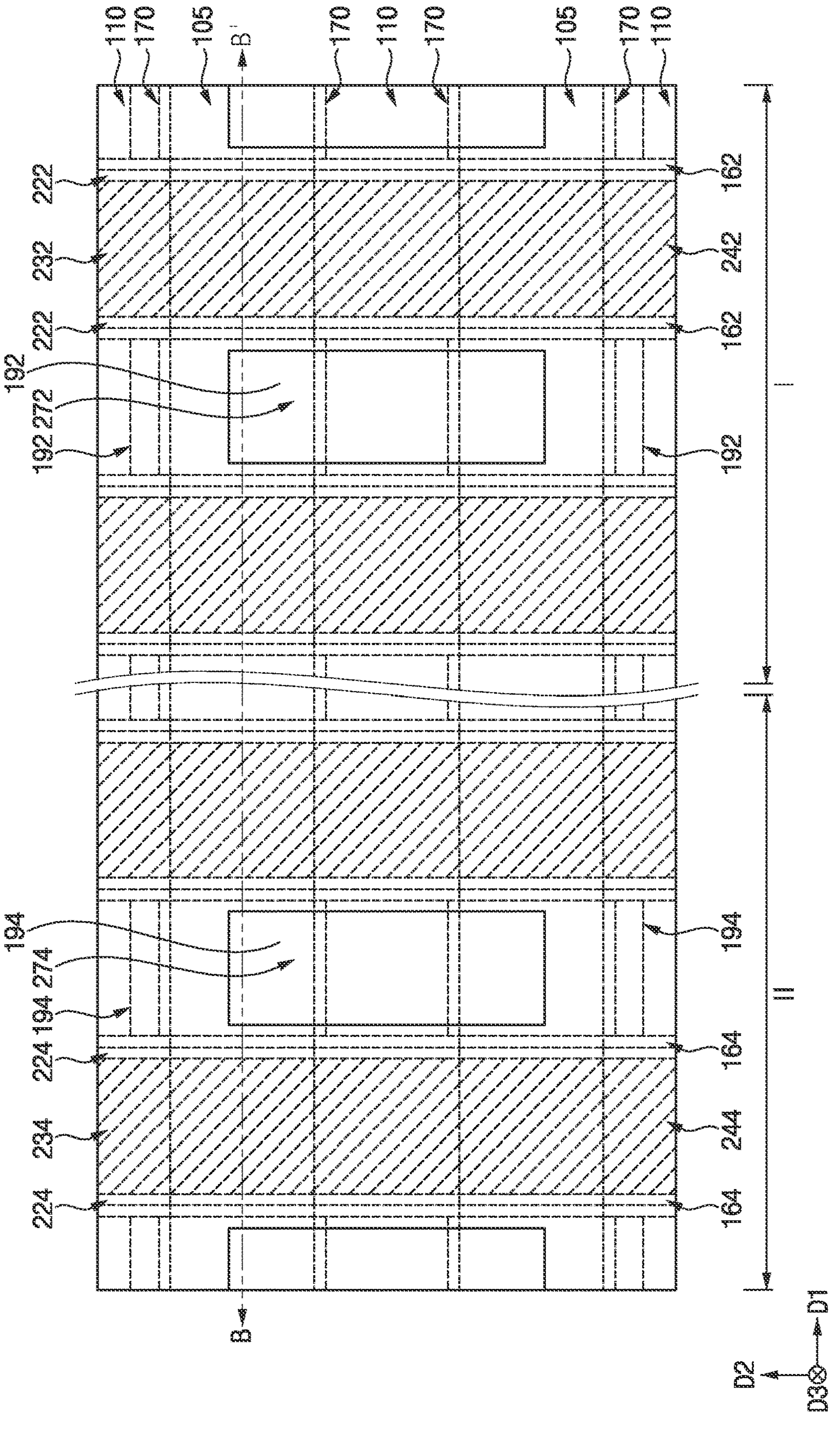
Figure 17:
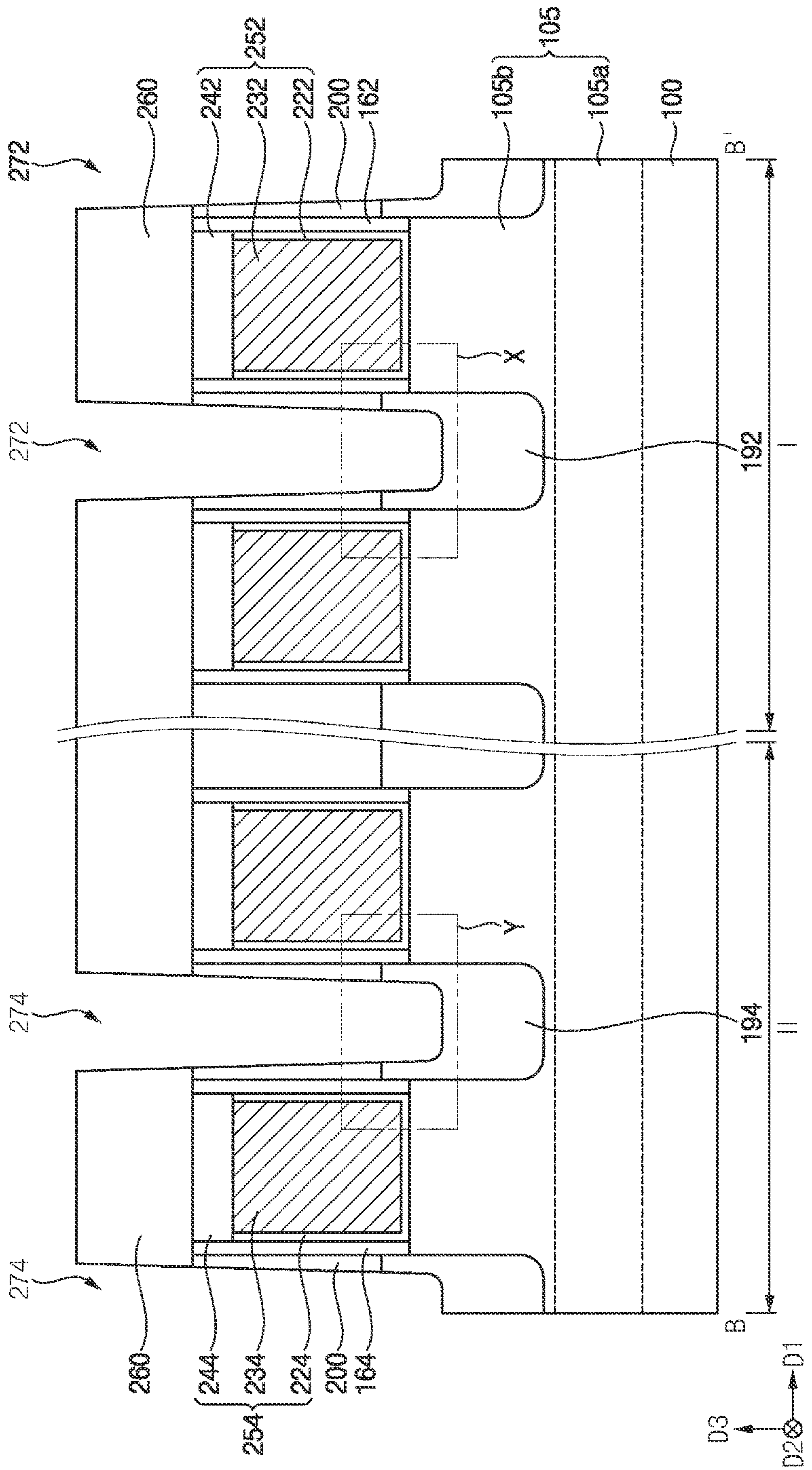
Figure 18:
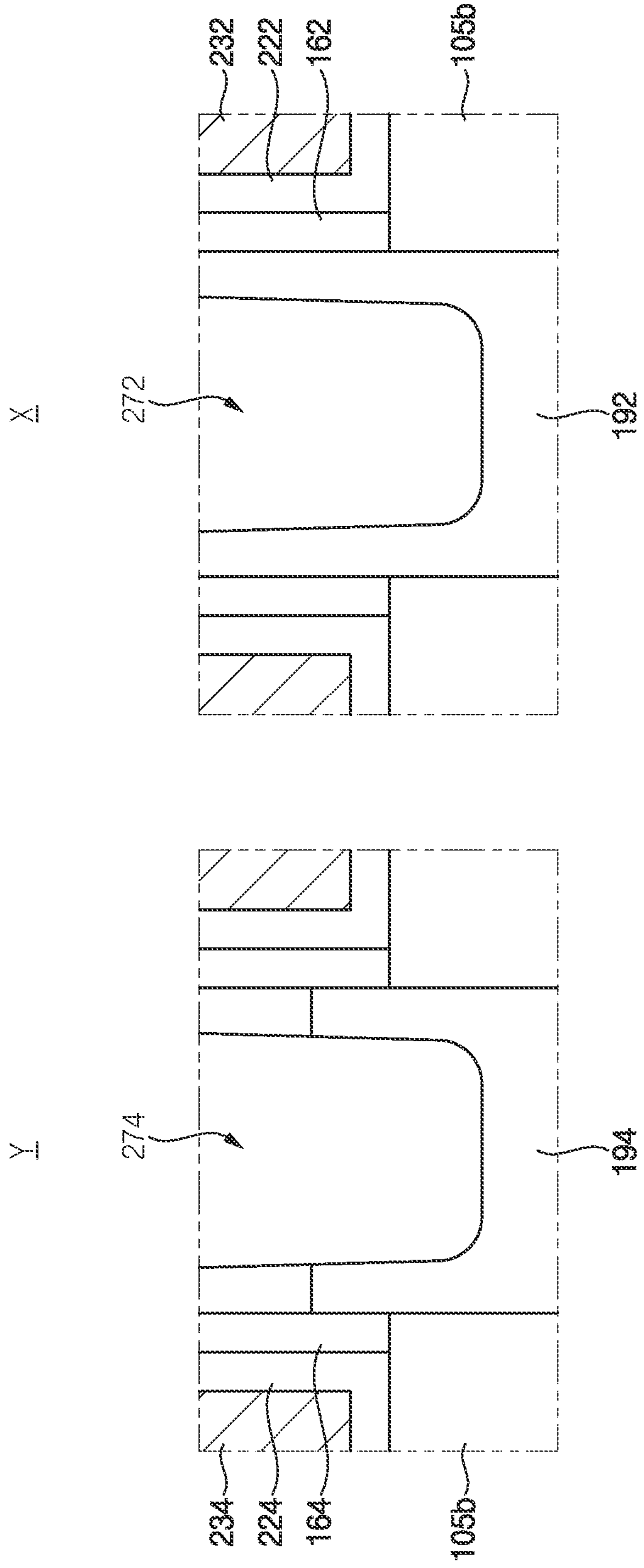

Referring to FIGS. 16 to 18, a second insulating interlayer 260 may be formed on the first and second gate structures 252 and 254, the first and second gate spacers 162 and 164, and the first insulating interlayer 200, and portions of the first and second insulating interlayers 200 and 260 between the first gate structures 252 may be partially removed to form a third opening 272 exposing an upper surface of the first source/drain layer 192, and portions of the first and second insulating interlayers 200 and 260 between the second gate structures 254 may be partially removed to form a fourth opening 274 exposing an upper surface of the second source/drain layer 194.

The third and fourth openings 272 and 274 may partially extend through upper portions of the first and second source/drain layers 192 and 194, respectively.

Referring to FIG. 19, a first chemical vapor deposition (CVD) process may be performed so that a first metal silicide pattern 280 may be formed on the upper surface of the first source/drain layer 192 exposed by the third opening 272, and a second preliminary metal silicide pattern 281*a* may be formed on the upper surface of the second source/drain layer 194 exposed by the fourth opening 274.

The first CVD process may be performed by using a source gas containing a first metal, and the first metal may be reacted with each of the first and second source/drain layers 192 and 194 containing silicon. Thus, the first metal silicide pattern 280 and the second preliminary metal silicide pattern 281*a* including a silicide of the first metal may be formed on the first and second source/drain layers 192 and 194, respectively. However, the first source/drain layer 192 may also include germanium, and thus the first metal silicide pattern 280 may also include a germanide of the first metal.

In example embodiments, the first CVD process may be selectively performed depending on a material and an impurity concentration of a layer on which the first CVD process is performed. Accordingly, a thickness of the first metal silicide pattern 280 that may be formed on the first source/drain layer 192 including silicon-germanium and a thickness of the second preliminary metal silicide patterns 281*a* that may be formed on the second source/drain layer 194 including silicon carbide or silicon may be different from each other.

In an example embodiment, the thickness of the first metal silicide pattern 280 may be greater than the thickness of the second preliminary metal silicide pattern 281*a*. Specifically, the thickness of the first metal silicide pattern 280 may be about 1 to about 25 times the thickness of the second preliminary metal silicide pattern 281*a*.

Referring to FIG. 20, a second CVD process may be performed so that a first metal layer 282 may be formed on the first metal silicide pattern 280 and the second preliminary metal silicide pattern 281*a* may be converted into a second metal silicide pattern 281.

In example embodiments, the second CVD process may be performed using a source gas including a second metal having a work function smaller than a work function of the first metal.

The second CVD process may be performed selectively or non-selectively. If the second CVD process is performed selectively, for example, an amount of the second metal deposited on the second preliminary metal silicide pattern 281*a* may be greater than an amount of the second metal deposited on the first metal silicide pattern 280.

The second metal provided in the second CVD process may be deposited on the first metal silicide pattern 280 to form the first metal layer 282, and the second metal may partially diffuse into the first metal silicide pattern 280 by heat generated during the CVD process and/or by a separate annealing process. Accordingly, at least a portion of the first metal silicide pattern 280 may include the second metal. However, the first metal silicide pattern 280 may have a relatively large thickness, and thus the second metal may not diffuse into an entire portion of the first metal silicide pattern 280.

In an example embodiment, a concentration of the second metal of a first portion of the first metal silicide pattern 280 that is nearer to the first metal layer 282 may be greater than a concentration of the second metal of a second portion of the first metal silicide pattern 280 that is farther from the first metal layer 282.

The second metal provided in the second CVD process may be deposited on the second preliminary metal silicide pattern 281*a*. The second metal may be entirely diffused into the second preliminary metal silicide pattern 281*a*, which may have a relatively small thickness, by the heat generated during the CVD process and/or by a separate annealing process.

Accordingly, instead of a separate metal layer including the second metal remaining on the second preliminary metal silicide pattern 281*a*, the second preliminary metal silicide pattern 281*a* may be converted into the second metal silicide pattern 281 including not only the first metal but also the second metal.

In an example embodiment, a concentration of the second metal of a first portion of the second metal silicide pattern 281 that is farther from the second source/drain layer 194 may be greater than a concentration of the second metal of a second portion of the second metal silicide pattern 281 that is nearer to the second source/drain layer 194.

As described above, the thickness of the first metal silicide pattern 280 may be greater than the thickness of the second preliminary metal silicide pattern 281*a*, which may be formed by the first CVD process. Thus, an amount of the first metal included in the silicide pattern 280 may be greater than an amount of the first metal included in the second preliminary metal silicide pattern 281*a*. In addition, an amount of the second metal diffused into the second preliminary metal silicide pattern 281*a* may be greater than an amount of the second metal diffused into the first metal silicide pattern 280 in the second CVD process.

Accordingly, a first ratio R1, which is a ratio of the first metal to the second metal in the first metal silicide pattern 280, may be greater than a second ratio R2, which is a ratio of the first metal to the second metal in the second metal silicide pattern 281. Accordingly, a work function of the first metal silicide pattern 280 may be greater than a work function of the second metal silicide pattern 281.

Referring back to FIGS. 1 to 5, a third CVD process may be performed using a source gas including a third metal to form first and second conductive layers on the second insulating interlayer 260 to fill the third and fourth openings 272 and 274, respectively, and the first and second conductive layers may be planarized until an upper surface of the second insulating interlayer 260 is exposed. Accordingly, first and second conductive patterns 286 and 287 may be formed to fill remaining portions of the third and fourth openings 272 and 274, respectively.

The first metal silicide pattern 280, the first metal layer 282 and the first conductive pattern 286 in the third opening 272 may collectively form a first contact plug structure 288, and the second metal silicide pattern 281 and the second conductive pattern 287 in the fourth opening 274 may collectively form a second contact plug structure 289.

Manufacturing of the semiconductor device may be completed by performing the above-described processes.

As described above, the first and second contact plug structures 288 and 289 on the first and second source/drain layers 192 and 194, respectively, may be formed by the same processes, that is, the first to third CVD processes. However, the first ohmic contact structure between the first source/drain layer 192 and the first conductive pattern 286 and the second ohmic contact structure between the second source/drain layer 194 and the second conductive pattern 287 may have different work functions from each other.

That is, the first CVD process may be selectively performed using the source gas including the first metal with a relatively large work function, so that the first metal silicide pattern 280 may be formed on the first source/drain layer 192 to have a relatively large thickness, and the second preliminary metal silicide pattern 281*a* may be formed on the second source/drain layer 194 to have a relatively small thickness. Thereafter, the second CVD process may be performed using the source gas including the second metal with a relatively small work function, so that the second metal may be partially diffused only into a portion of the first metal silicide pattern 280, but may be entirely diffused into the second preliminary metal silicide pattern 281*a*.

Accordingly, the first metal silicide pattern 280 on the first source/drain layer 192, which may include silicon-germanium doped with a p-type impurity and serve as a source/drain of a PMOS transistor, may include a higher proportion of the first metal with a relatively large work function than the second metal with a relatively small work function. The second metal silicide pattern 281 on the second source/drain layer 194, which may include silicon or silicon carbide doped with n-type impurities and serve as a source/drain of an NMOS transistor, may include a lower proportion of the first metal with a relatively large work function than the second metal with a relatively small work function. Accordingly, the work function of the first metal silicide pattern 280 may be greater than the work function of the second metal silicide pattern 281.

Hence, a contact resistance between the first source/drain layer 192 and the first contact plug structure 288 and a contact resistance between the second source/drain layer 194 and the second contact plug structure 289 may decrease.

The first and second ohmic contact structures may be formed by separate deposition processes so that the first and second ohmic contact structures may have optimized work functions to reduce the contact resistance. However, such an approach increases the number of deposition processes so that the overall process may become complicated and costly. In example embodiments, the first and second ohmic contact structures may be formed by the same etching processes and the same deposition processes, and thus, the overall process may be simplified and costs reduced.

Additionally, the first to third CVD processes may be performed in-situ. Thus, each of the first and second contact plug structures 288 and 289 may not include a barrier pattern, and accordingly, may have a relatively low resistance.

Figure 21:
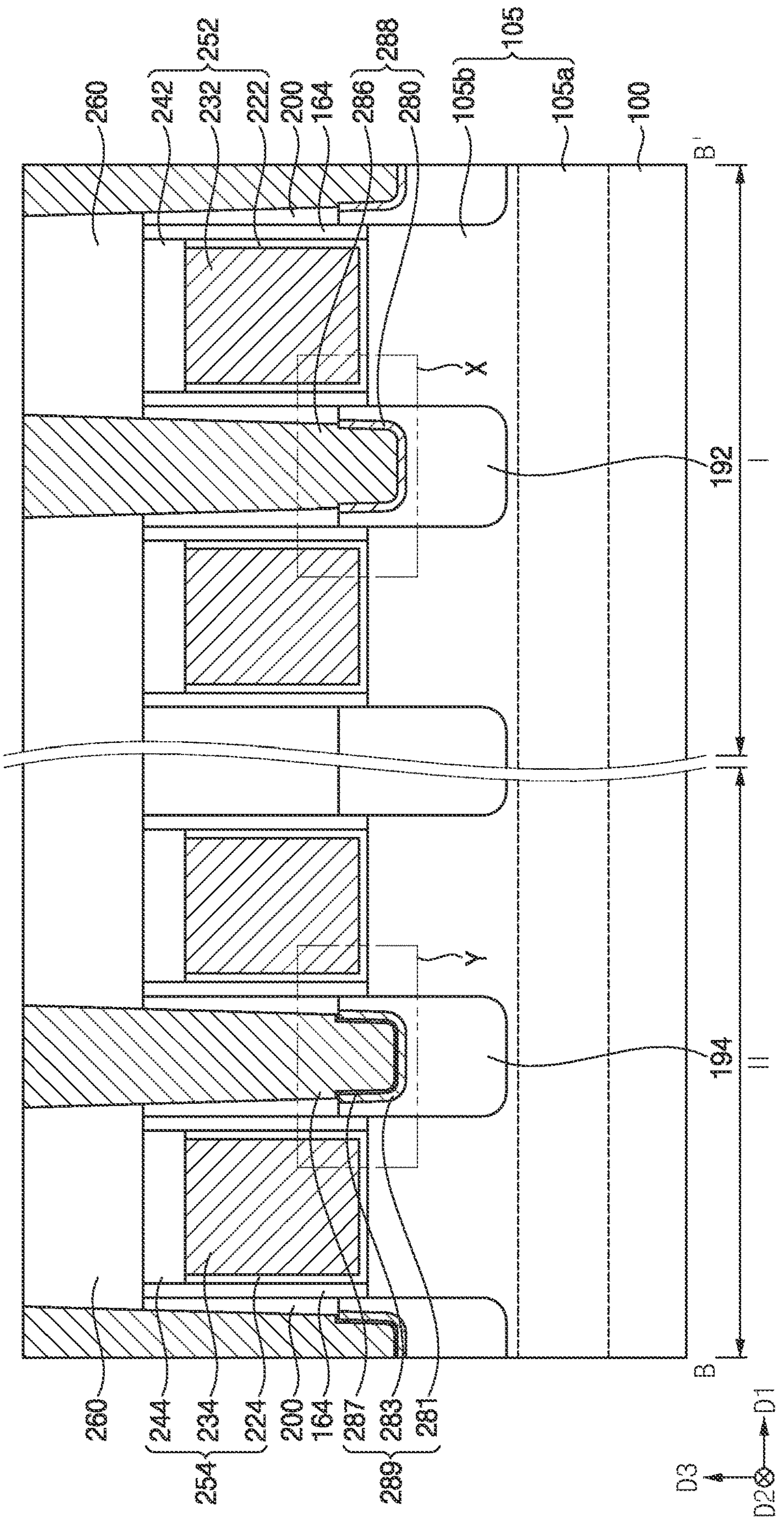
FIGS. 21 and 22 are cross-sectional views illustrating a semiconductor device in accordance with example embodiments, and may correspond to FIGS. 3 and 4, respectively.
Figure 22:
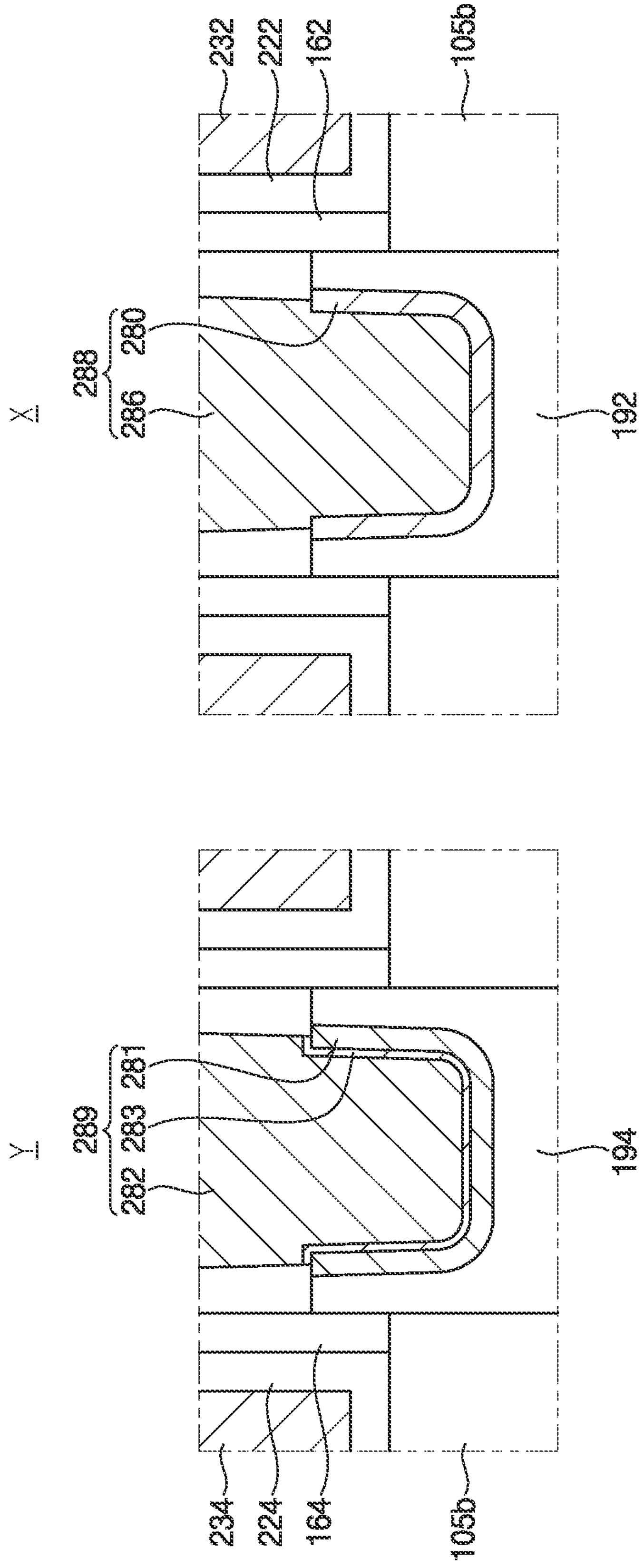

FIGS. 21 and 22 are cross-sectional views illustrating a semiconductor device in accordance with example embodiments, and may correspond to FIGS. 3 and 4, respectively.

This semiconductor device may be substantially the same as or similar to that of FIGS. 1 to 5, except for the first and second contact plug structures 288 and 289, and thus repeated explanations of already described elements are omitted herein.

Referring to FIGS. 21 and 22, the first contact plug structure 288 may not include the first metal layer 282, and thus, an upper surface of the first metal silicide pattern 280 may contact a lower surface of the first conductive pattern 286.

The first metal silicide pattern 280 may include a silicide of the first and second metals and a germanide of the first and second metals. In an example embodiment, a concentration of the first metal of a first portion of the first metal silicide pattern 280 that is farther from the first source/drain layer 192 may be greater than a concentration of the first metal of a second portion of the first metal silicide pattern 280 that is nearer to the first source/drain layer 192.

The second contact plug structure 289 may further include a second metal layer 283 disposed between the second metal silicide pattern 281 and the second conductive pattern 287. The second metal layer 283 may include the first metal.

The second metal silicide pattern 281 may include a silicide of the first and second metals. In an example embodiment, a concentration of the first metal of a first portion of the second metal silicide pattern 281 that is nearer to the second metal layer 283 may be greater than a concentration of the first metal of a second portion of the second metal silicide pattern 281 that is farther from the second metal layer 283.

In example embodiments, a ratio of the first metal to the second metal included in the first metal silicide pattern 280 may be greater than a ratio of the first metal to the second metal included in the second metal silicide pattern 281, and accordingly, a work function of the first metal silicide pattern 280 may be greater than a work function of the second metal silicide pattern 281. Thus, a contact resistance between the first source/drain layer 192 and the first contact plug structure 288 and a contact resistance between the second source/drain layer 194 and the second contact plug structure 289 may be reduced.

Figure 23:
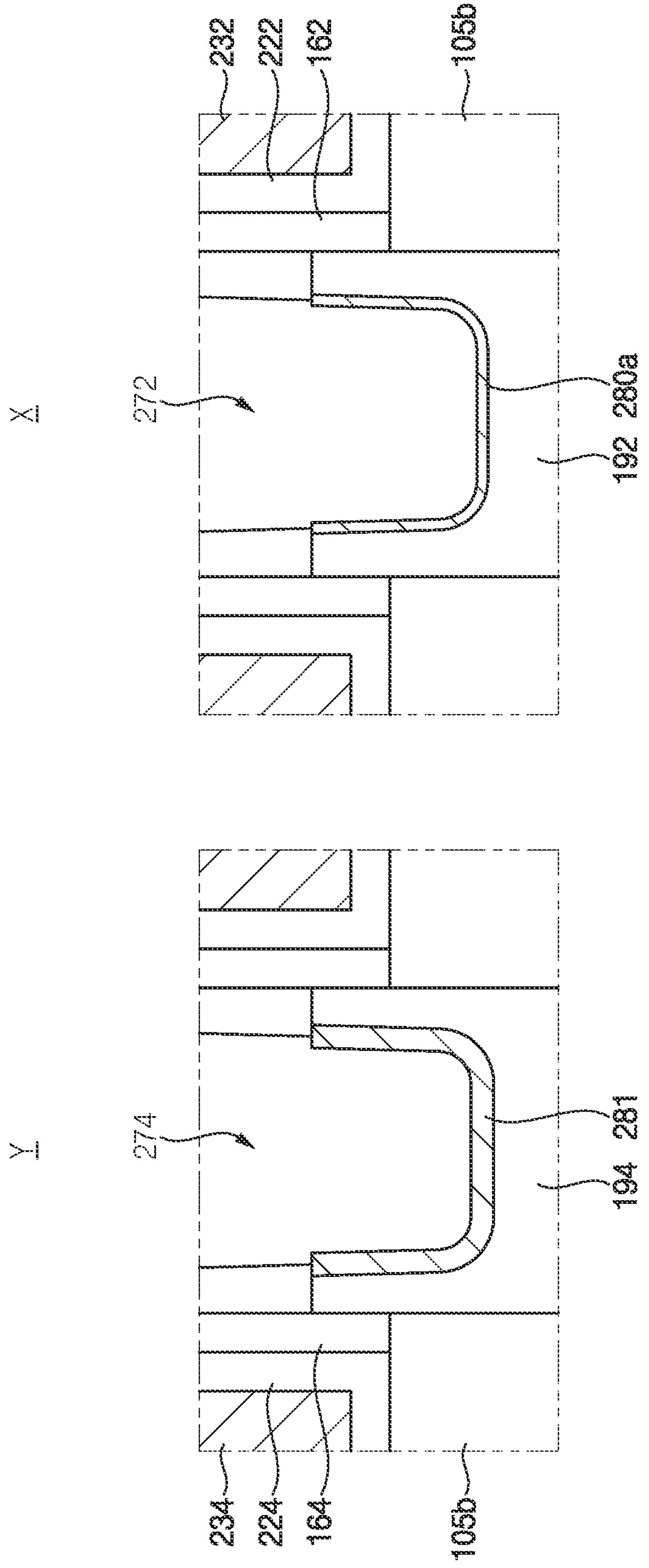
FIGS. 23 to 24 are cross-sectional views for reference in describing a method of manufacturing a semiconductor device in accordance with example embodiments, and may correspond to FIGS. 19 and 20, respectively.
Figure 24:
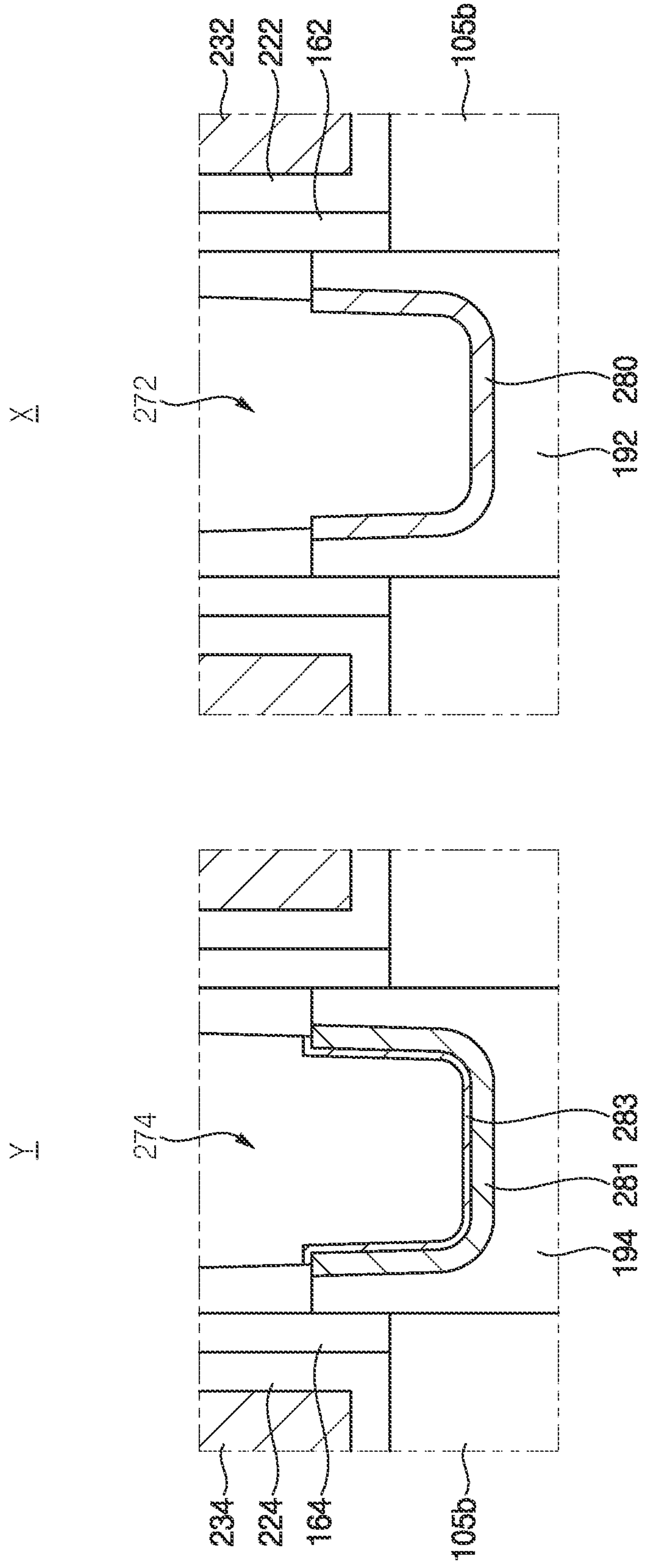

FIGS. 23 and 24 are cross-sectional views for reference in describing a method of manufacturing the semiconductor device of FIGS. 21 and 22, and may correspond to FIGS. 19 and 20, respectively.

This method of manufacturing the semiconductor device of FIGS. 21 and 22 may include processes substantially the same as or similar to those of FIGS. 6 to 20 and FIGS. 1 to 5, and thus repeated explanations of already described elements are omitted herein.

Referring to FIG. 23, unlike the processes illustrated with reference to FIG. 19, the first CVD process may be performed using a source gas containing the second metal.

Accordingly, a first preliminary metal silicide pattern 280*a* including a silicide of the second metal may be formed on the upper surface of the first source/drain layer 192 exposed by the third opening 272, and the second metal silicide pattern 281 including a silicide of the second metal may be formed on the upper surface of the second source/drain layer 194 exposed by the fourth opening 274. The first preliminary metal silicide pattern 280*a* may also include a germanide of the second metal.

In an example embodiment, the first CVD process may be performed selectively, and a thickness of the second metal silicide pattern 281 may be formed to be greater than a thickness of the first preliminary metal silicide pattern 280*a*.

Referring to FIG. 24, unlike the processes illustrated with reference to FIG. 20, the second CVD process may be performed using a source gas containing the first metal.

Accordingly, a second metal layer 283 including the first metal may be formed on the second metal silicide pattern 281, and the first preliminary metal silicide pattern 280*a* may be converted into a first metal silicide pattern 280 including a silicide of the first and second metals and a germanide of the first and second metals.

The first metal may diffuse into the second metal silicide pattern 281. However, the second metal silicide pattern 281 may have a relatively large thickness, and thus, the first metal may not diffuse into an entire portion of the second metal silicide pattern 281. Accordingly, a portion of the first metal may remain on the second metal silicide pattern 281 to form the second metal layer 283.

The first metal may be diffused into an entire portion of the first preliminary metal silicide pattern 280*a*, and thus the first preliminary metal silicide pattern 280*a* may be converted into the first metal silicide pattern 280. Accordingly, a ratio of the first metal to the second metal included in the first metal silicide pattern 280 may be greater than a ratio of the first metal to the second metal included in the second metal silicide pattern 281.

In an example embodiment, a concentration of the first metal of a first portion of the first metal silicide pattern 280 that is farther from the first source/drain layer 192 may be greater than a concentration of the first metal of a second portion of the first metal silicide pattern 280 that is nearer to the first source/drain layer 192. In addition, a concentration of the first metal of a first portion of the second metal silicide pattern 281 that is nearer to the second metal layer 283 may be greater than a concentration of the first metal of a second portion of the second metal silicide pattern 281 that is farther from the second metal layer 283.

Figure 25:
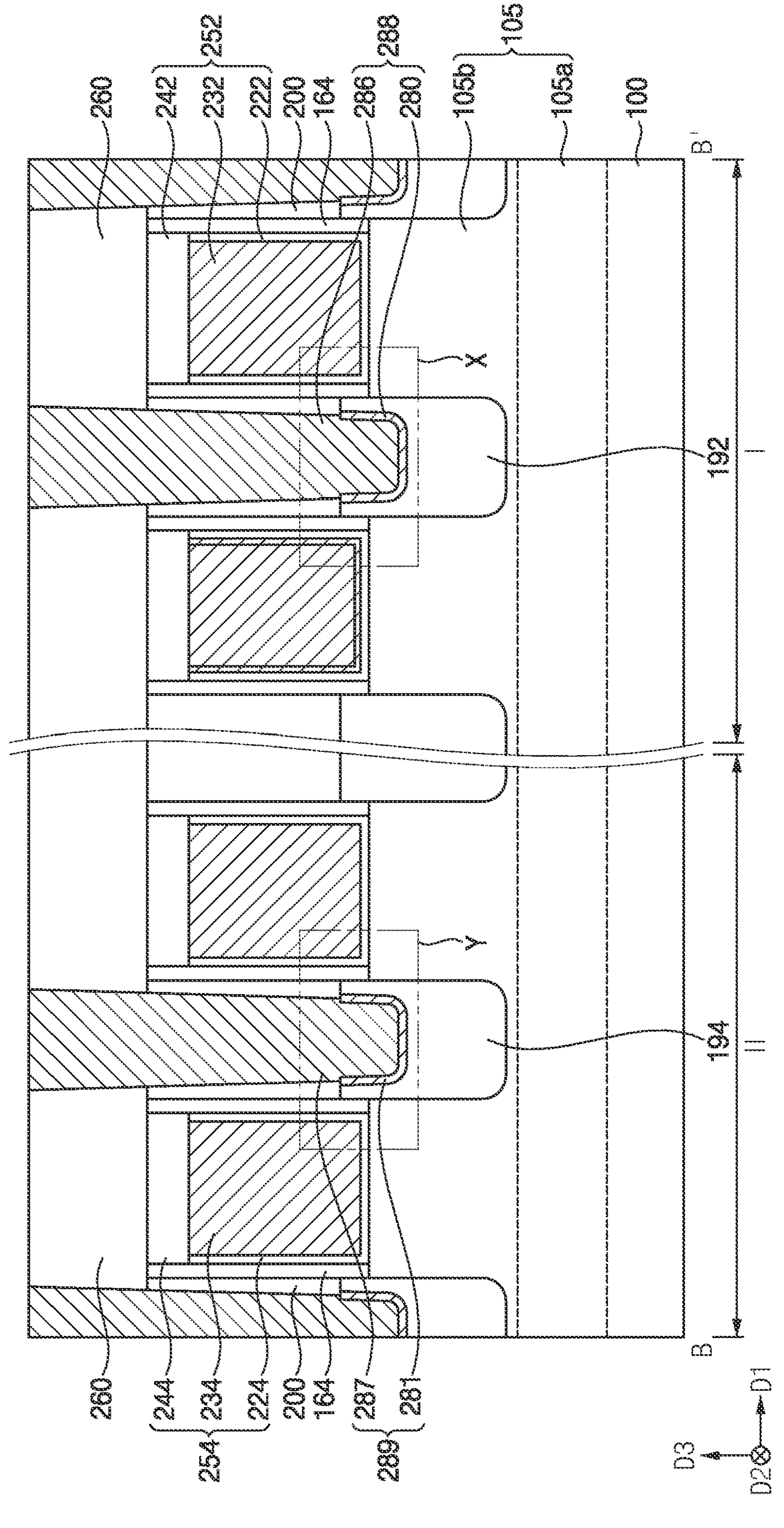
FIGS. 25 and 26 are cross-sectional views illustrating a semiconductor device in accordance with example embodiments, and may correspond to FIGS. 3 and 4, respectively.
Figure 26:
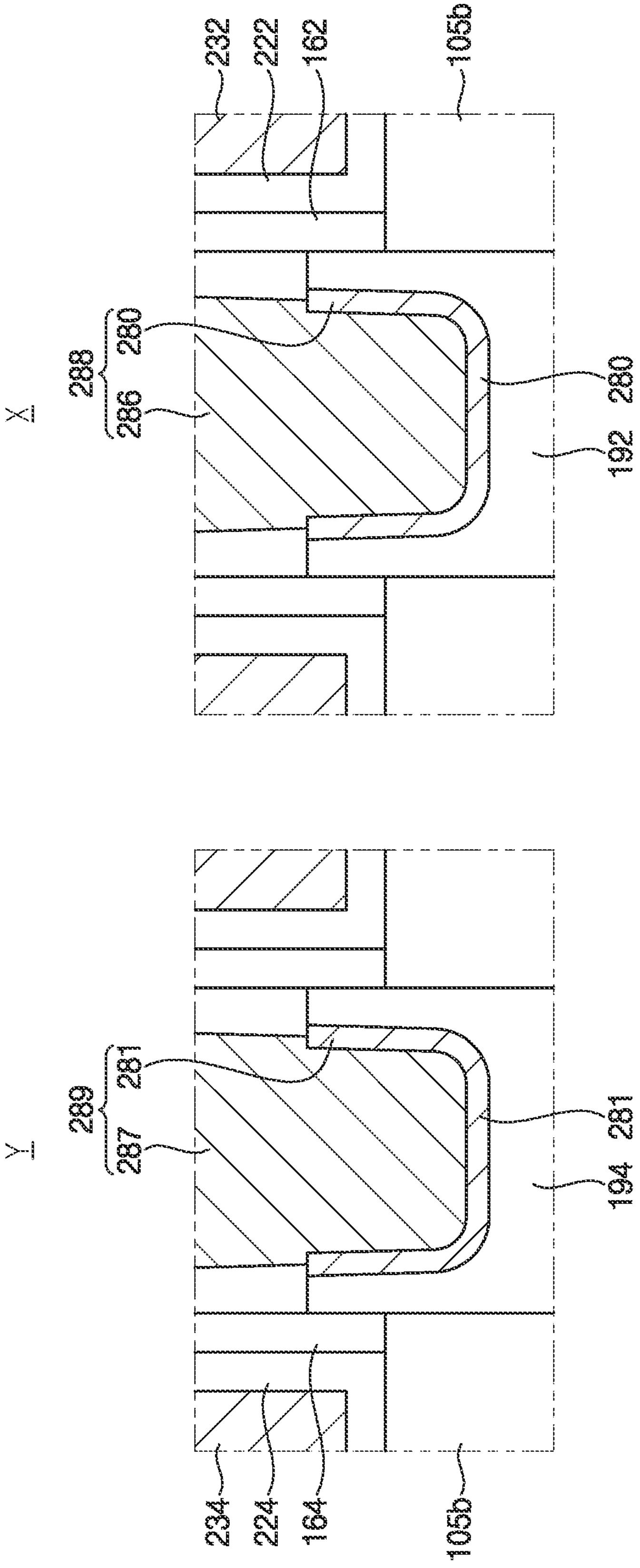

FIGS. 25 and 26 are cross-sectional views illustrating a semiconductor device in accordance with example embodiments, and may correspond to FIGS. 3 and 4, respectively.

This semiconductor device may be substantially the same as or similar to that of FIGS. 1 to 5, except that the first contact plug structure 288 may not include the first metal layer 282, and thus repeated explanations of already described elements are omitted herein.

Referring to FIGS. 25 and 26, the first metal layer 282 may not be formed on the first metal silicide pattern 280, and thus, an upper surface of the first metal silicide pattern 280 may contact a lower surface of the first conductive pattern 286.

When the semiconductor device shown in FIGS. 25 and 26 is manufactured, the second metal may be diffused into an entire portion of the first metal silicide pattern 280 so that the first metal layer 282 including the second metal may not remain on the first metal silicide pattern 280 during the second CVD process described with reference to FIG. 20.

However, by adjusting the selectivity of the first CVD process and/or performing the second CVD process selectively, a ratio of the first metal to the second metal included in the first metal silicide pattern 280 may be greater than a ratio of the first metal to the second metal in the second metal silicide pattern 281.

In an example embodiment, a concentration of the second metal of a first portion of the first metal silicide pattern 280 that is nearer to the first conductive pattern 286 may be greater than a concentration of the second metal of a second portion of the first metal silicide pattern 280 that is farther from the first conductive pattern 286, and a concentration of the second metal of a first portion of the second metal silicide pattern 281 that is nearer to the second conductive pattern 287 may be greater than a concentration of the second metal of a second portion of the second metal silicide pattern 281 that is farther from the second conductive pattern 287.

The first and second CVD processes may be performed using the source gases including the first and second metals, respectively, however, the inventive concept is not limited thereto. That is, for example, the first and second CVD processes may also be performed using source gases including the second and first metals, respectively.

In this case, a concentration of the first metal of a first portion of the second metal silicide pattern 281 that is nearer to the second conductive pattern 287 may be greater than a concentration of the first metal of a second portion of the second metal silicide pattern 281 that is farther from the second conductive pattern 287, and a concentration of the first metal of a first portion of the first metal silicide pattern 280 that is nearer to the first conductive pattern 286 may be greater than a concentration of the first metal of a second portion of the first metal silicide pattern 280 that is farther from the first conductive pattern 286.

Figure 27:
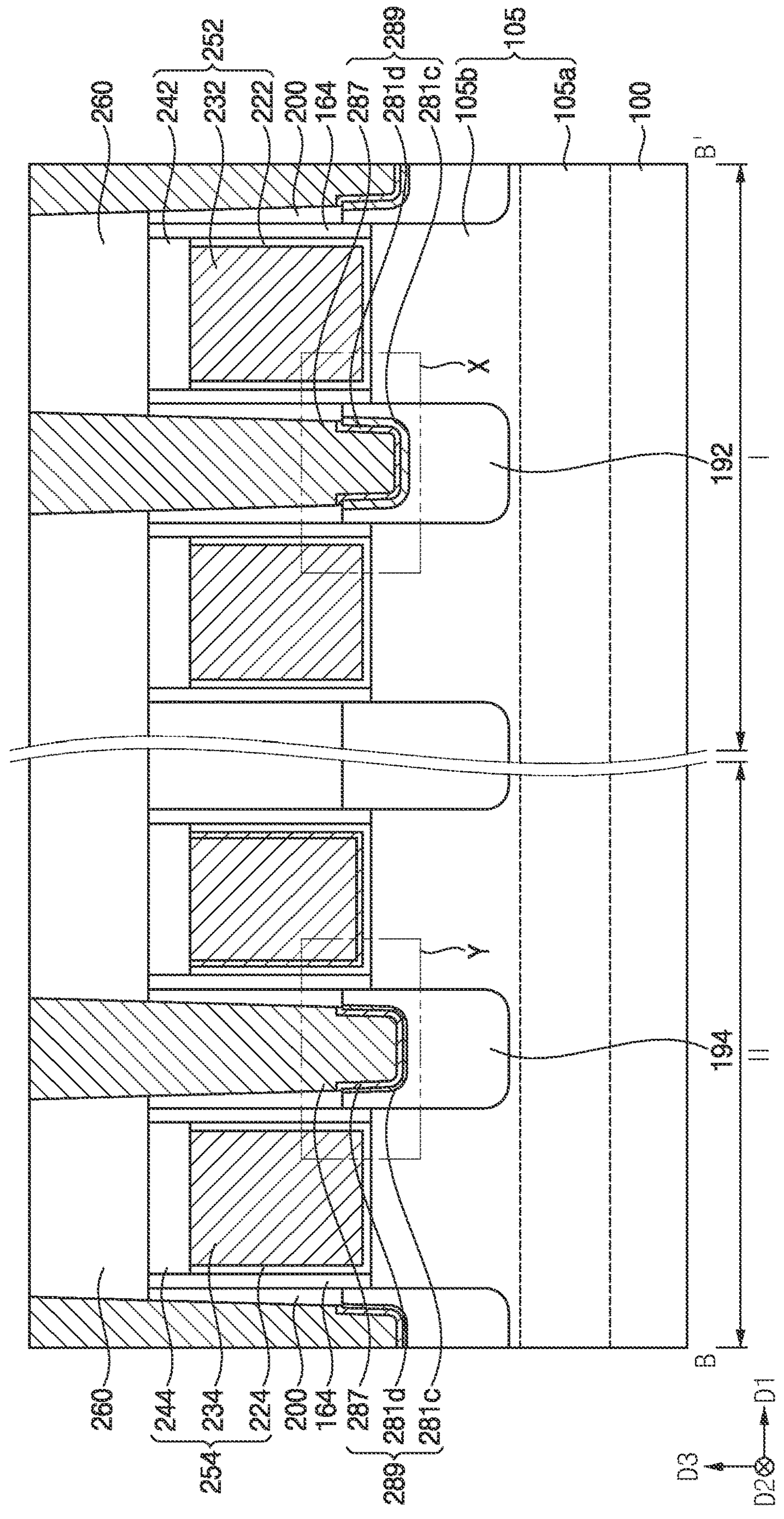
FIGS. 27 and 28 are cross-sectional views illustrating a semiconductor device in accordance with example embodiments, and may correspond to FIGS. 3 and 4, respectively.
Figure 28:
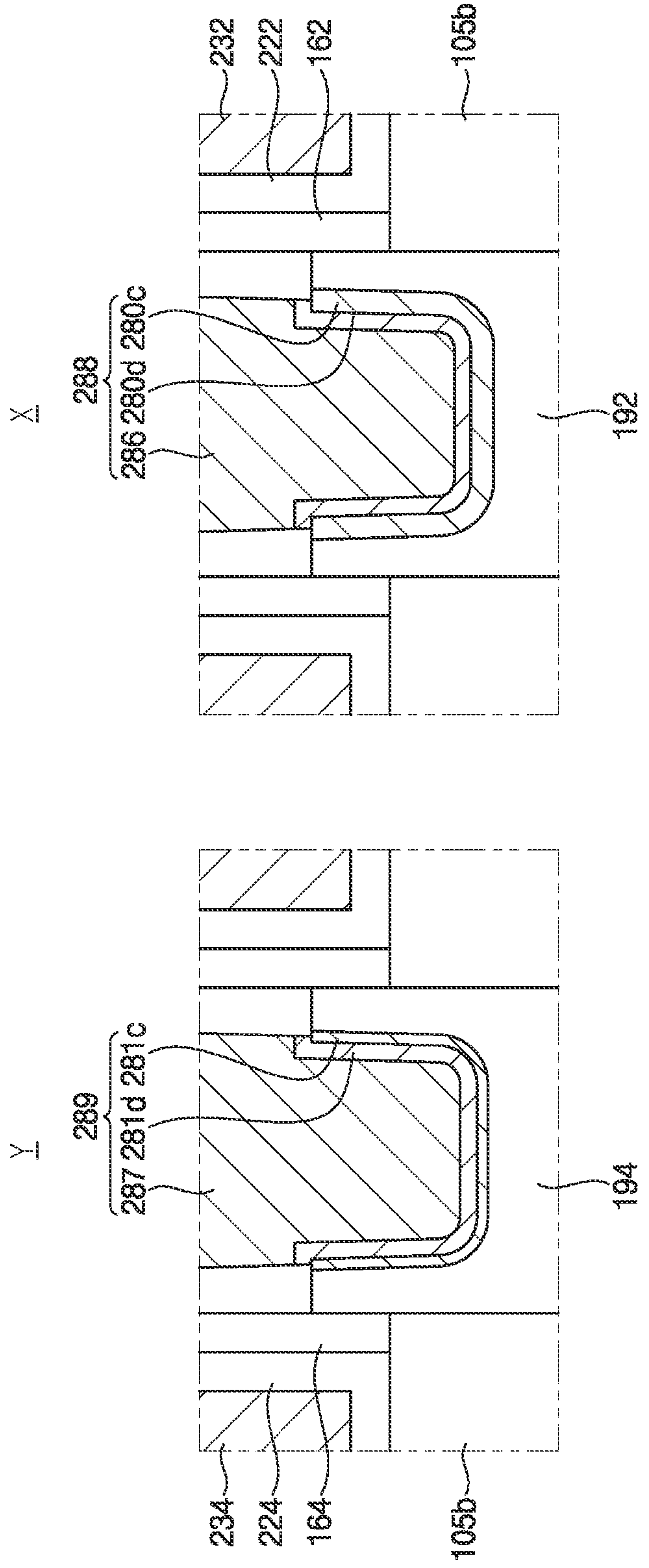

FIGS. 27 and 28 are cross-sectional views illustrating a semiconductor device in accordance with example embodiments, and may correspond to FIGS. 3 and 4, respectively.

This semiconductor device may be substantially the same as or similar to that of FIGS. 1 to 5, except for the first and second silicide patterns 280 and 281, and thus repeated explanations of already described elements are omitted herein.

Referring to FIGS. 27 and 28, the first metal silicide pattern 280 may include a first lower portion 280*c* and a first upper portion 280*d* sequentially stacked, and the second metal silicide pattern 281 may include a second lower portion 281*c* and a second upper portion 281*d* sequentially stacked.

In example embodiments, the first lower portion 280*c* may include a silicide of the first metal and a germanide of the first metal, and the first upper portion 280*d* may include a silicide of the second metal. However, the first lower portion 280*c* may further include a silicide of the second metal and a germanide of the second metal, and the first upper portion 280*d* may further include a silicide of the first metal. In an example embodiment, a concentration of the second metal of a first portion of the first lower portion 280*c* that is nearer to the first upper portion 280*d* may be greater than a concentration of the second metal of a second portion of the first lower portion 280*c* that is farther from the first upper portion 280*d*.

In example embodiments, the second lower portion 281*c* may include a silicide of the first metal, and the second upper portion 281*d* may include a silicide of the second metal. However, the second lower portion 281*c* may further include a silicide of the second metal, and the second upper portion 281*d* may further include a silicide of the first metal. In an example embodiment, a concentration of the second metal of a first portion of the second lower portion 281*c* that is nearer to the second upper portion 281*d* may be greater than a concentration of the second metal of a second portion of the second lower portion 281*c* that is farther from the second upper portion 281*d*.

In example embodiments, a thickness of the first lower portion 280*c* included in the first metal silicide pattern 280 may be greater than a thickness of the second lower portion 281*c* included in the second metal silicide pattern 281.

When the semiconductor device illustrated in FIGS. 27 and 28 is manufactured, the second CVD process described with reference to FIG. 20 may be performed using a silicon source gas together with the source gas including the second metal.

That is, the first CVD process may be performed to form the first lower portion 280*c* including a silicide of the first metal and a germanide of the first metal on the upper surface of the first source/drain layer 192, and to form the second lower portion 281*c* including a silicide of the first metal on the upper surface of the second source/drain layer 194.

The first CVD process may be performed selectively, and a thickness of the first lower portion 280*c* may be formed to be greater than a thickness of the second lower portion 281*c*.

Thereafter, the second CVD process described with reference to FIG. 20 may be performed by using a silicon source gas such as silane ($SiH_4$) together with the source gas containing the second metal. Accordingly, the first upper portion 280*d* including a silicide of the second metal may be formed on the first lower portion 280*c*, and the second upper portion 281*d* including a silicide of the second metal may be formed on the second lower portion 281*c* may be formed.

However, in example embodiments, the first metal included in the first and second lower portions 280*c* and 281*c* may be diffused into the first and second upper portions 280*d* and 281*d* by a heat accompanying the second CVD process and/or a subsequent annealing process. Similarly, the second metal included in the first and second upper portions 280*d* and 281*d* may be diffused into the first and second lower portions 280*c* and 281*c*.

Accordingly, concentrations of the second metal of first portions of the first and second lower portions 280*c* and 281*c* that are nearer to the first and second upper portions 280*d* and 281*d*, respectively, may be greater than concentrations of the second metal of second portions of the first and second lower portions 280*c* and 281*c* that are farther from the first and second upper portions 280*d* and 281*d*, respectively, and concentrations of the first metal of first portions of the first and second upper portions 280*b* and 281*b* that are nearer to the first and second lower portions 280*c* and 281*c*, respectively, may be greater than concentrations of the first metal of second portions of the first and second upper portions 280*b* and 281*b* that are farther from the first and second lower portions 280*c* and 281*c*, respectively.

The first and second CVD processes may be performed using the source gas of the first and second metals, respectively, however, the inventive concept is not limited thereto, and, for example, the first and second CVD processes may also be performed using source gases of the second and first metals, respectively.

In this case, in an example embodiment, concentrations of the first metal of first portions of the first and second lower portions 280*c* and 281*c* that are nearer to the first and second upper portions 280*d* and 281*d*, respectively, may be greater than concentrations of the first metal of second portions of the first and second lower portions 280*c* and 281*c* that are farther from the first and second upper portions 280*d* and 281*d*, respectively, and concentrations of the second metal of first portions of the first and second upper portions 280*b* and 281*b* that are nearer to the first and second lower portions 280*c* and 281*c*, respectively, may be greater than concentrations of the second metal of second portions of the first and second upper portions 280*b* and 281*b* that are farther from the first and second lower portions 280*c* and 281*c*, respectively.

Figure 29:
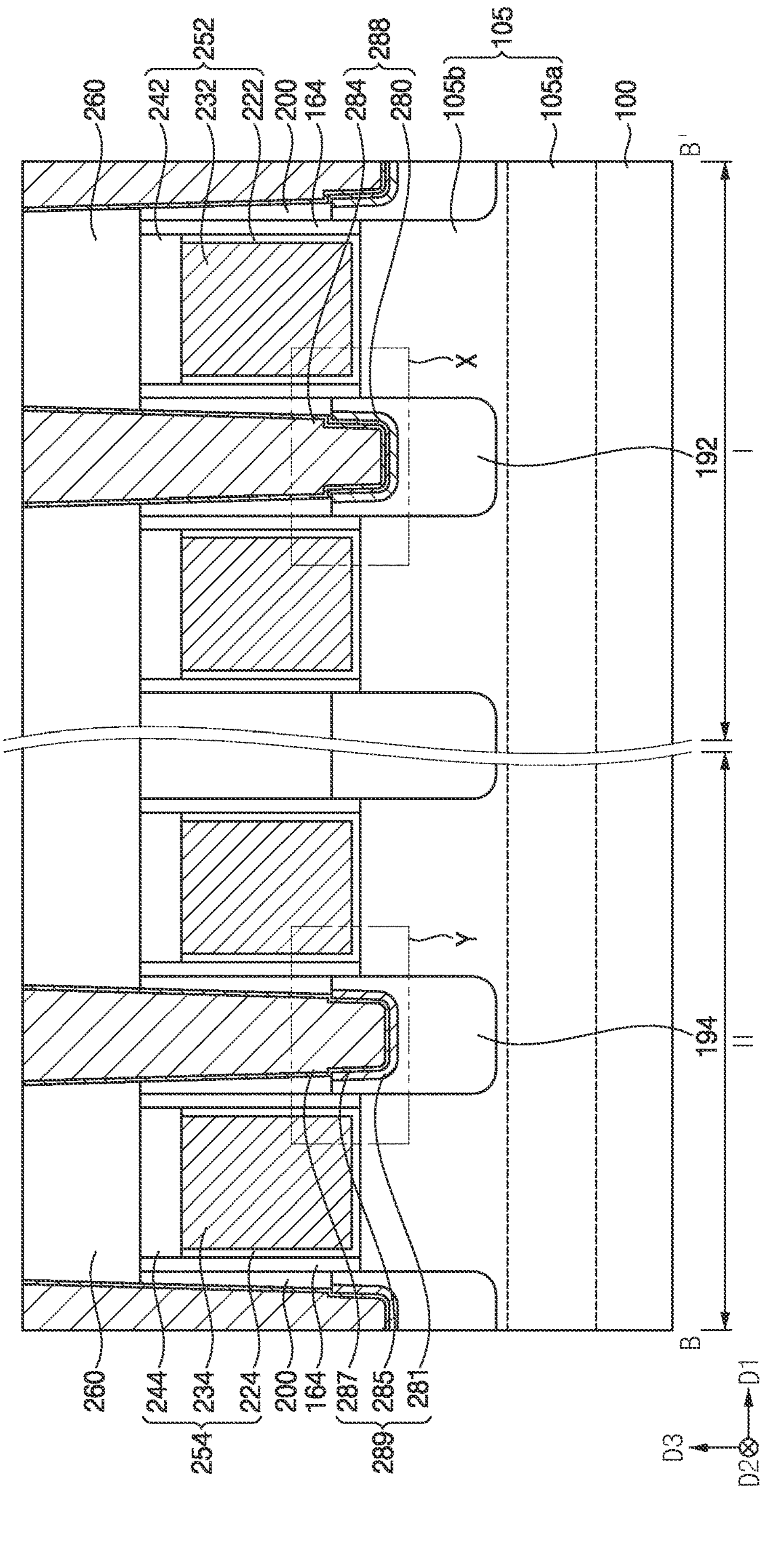
FIGS. 29 and 30 are cross-sectional views illustrating a semiconductor device in accordance with example embodiments, and may correspond to FIGS. 3 and 4, respectively.
Figure 30:
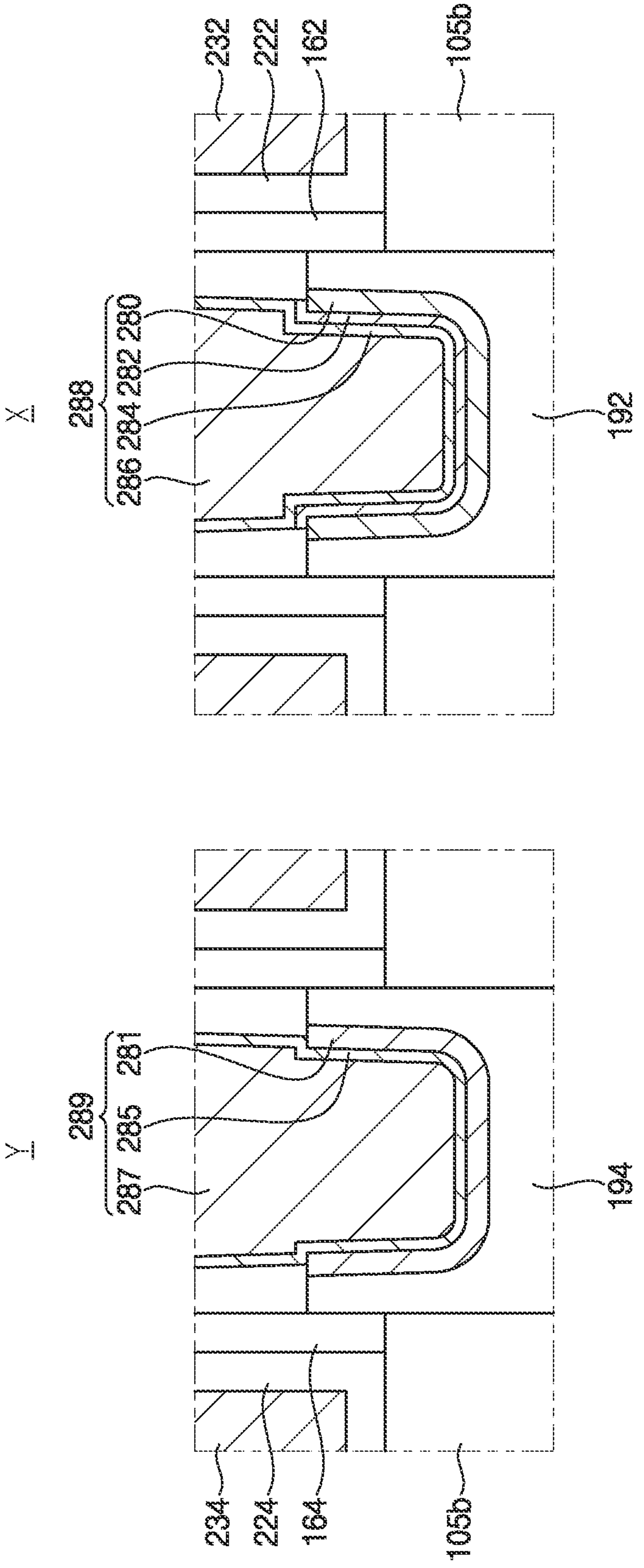

FIGS. 29 and 30 are cross-sectional views illustrating a semiconductor device in accordance with example embodiments, and may correspond to FIGS. 3 and 4, respectively.

This semiconductor device may be substantially the same as or similar to that of FIGS. 1 to 5, except that the first and second contact plug structures 288 and 289 may further include first and second barrier patterns 284 and 285, respectively, and thus repeated explanations of already described elements are omitted herein.

Referring to FIGS. 29 and 30, the first barrier pattern 284 may be formed on the first metal layer 282 to cover a lower surface and sidewalls of the first conductive pattern 286, and the second barrier pattern may be formed on the second metal silicide pattern 281 to cover a lower surface and sidewalls of the second conductive pattern 287.

Each of the first and second barrier patterns 284 and 285 may include, for example, a metal nitride such as titanium nitride, tantalum nitride, tungsten nitride, etc.

Figure 31:
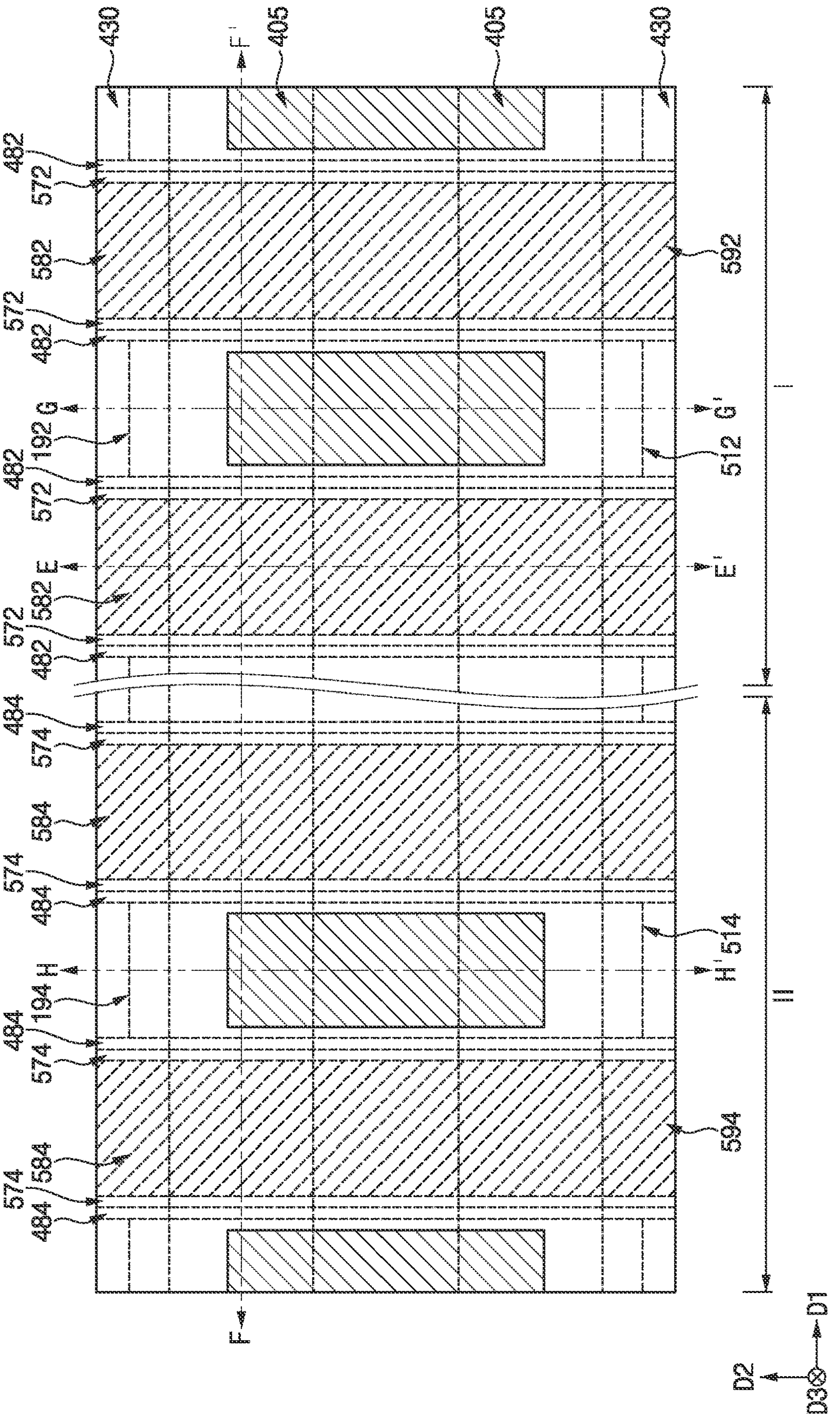
FIGS. 31 to 34 are a plan view and cross-sectional views illustrating a semiconductor device in accordance with example embodiments.
Figure 32:
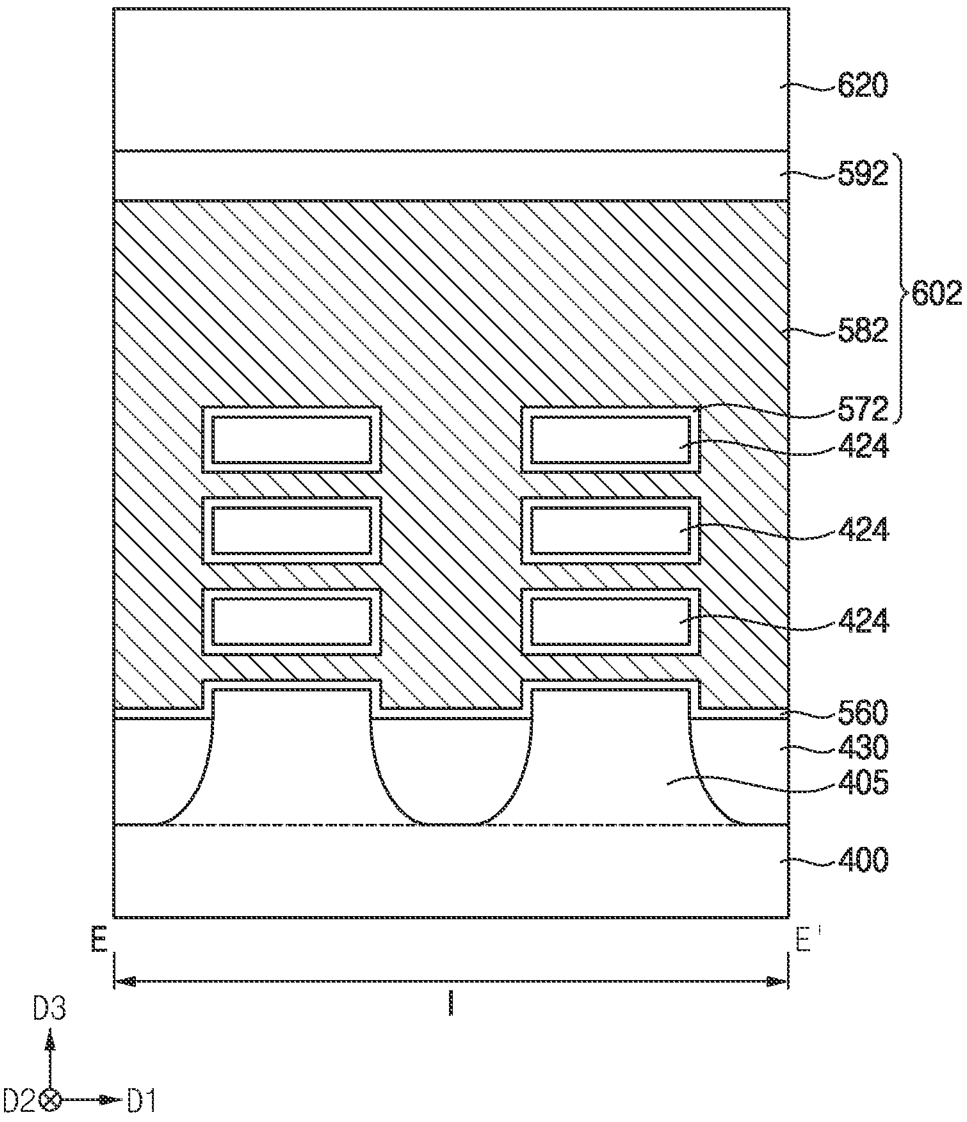
Figure 33:
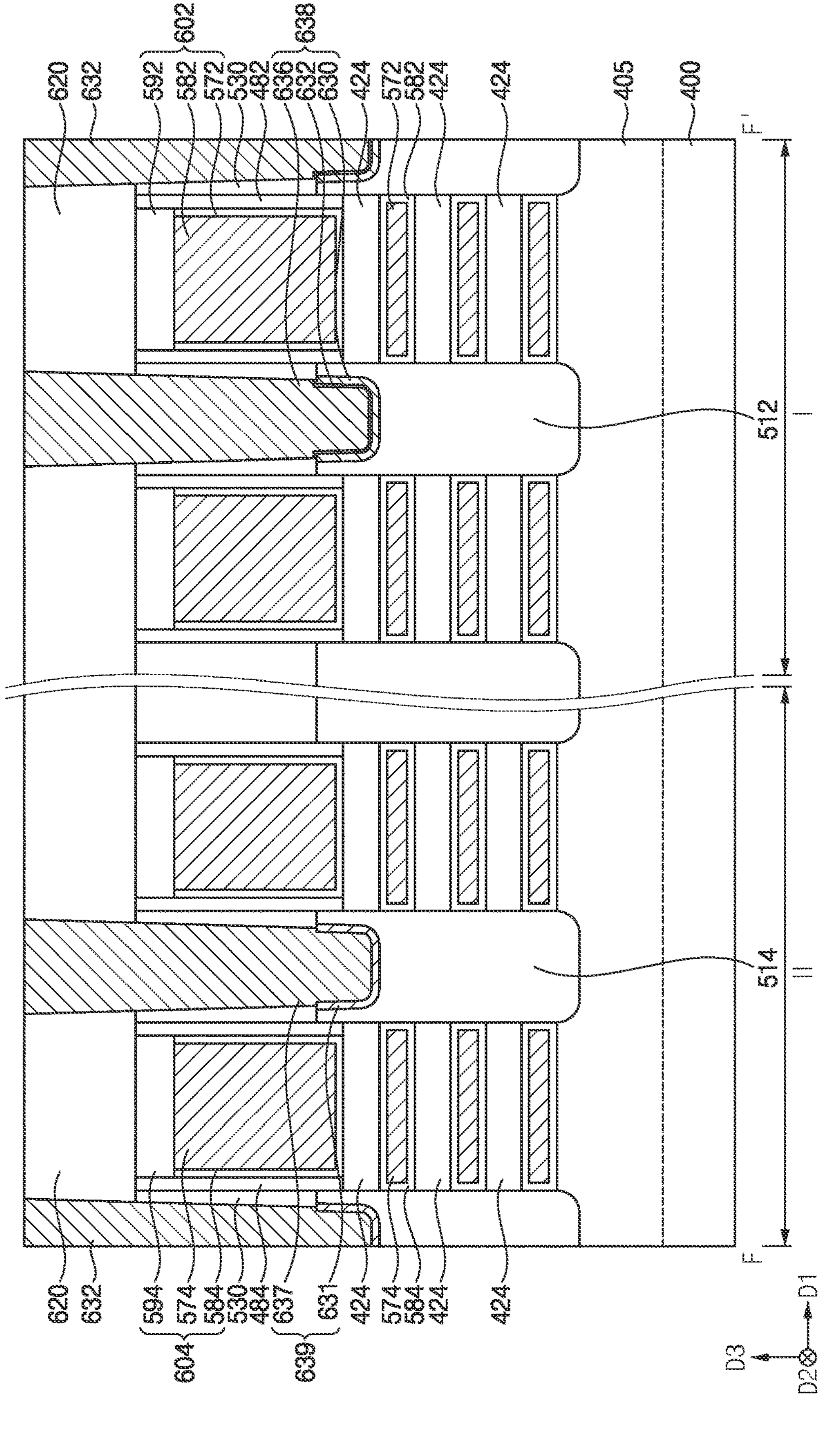
Figure 34:
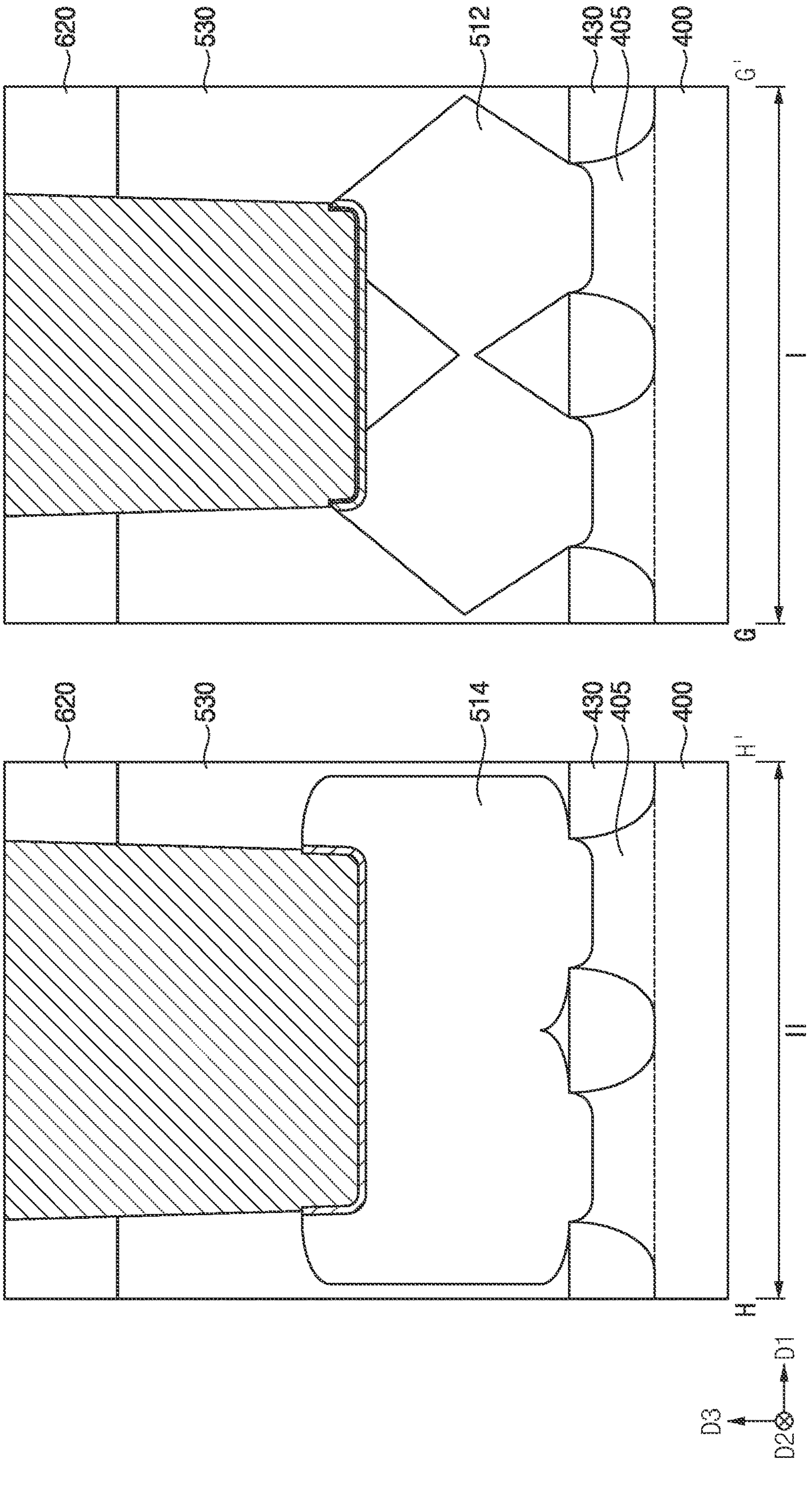

FIGS. 31 to 34 are a plan view and cross-sectional views illustrating a semiconductor device in accordance with example embodiments. Particularly, FIG. 31 is the plan view, FIG. 32 is a cross-sectional view taken along line E-E' of FIG. 31, FIG. 33 is a cross-sectional view taken along line F-F' of FIG. 31, and FIG. 34 includes cross-sectional views taken along lines G-G' and H-H' of FIG. 31, respectively.

This semiconductor device may include elements substantially the same as or similar to those illustrated with reference to FIGS. 1 to 5, and thus repeated explanations of already described elements are omitted herein.

As illustrated below, the semiconductor device may be a multi-bridge channel field effect transistor (MBCFET) including seniconductor patterns 424 that may be spaced apart from each other in the third direction D3 and serve as channels, respectively. Other elements except for the semiconductor patterns 424 may have similar functions and structures as corresponding elements included in the finFET of FIGS. 1 to 5, and thus repeated explanations of already described elements are omitted herein.

Referring to FIGS. 31 to 34, the semiconductor device may include a second active pattern 405, a second isolation pattern 430, third and fourth gate structures 602 and 604, the semiconductor patterns 424, third and fourth source/drain layers 512 and 514, third and fourth gate spacers 482 and 484, third and fourth contact plug structures 638 and 639, and third and fourth insulating interlayers 530 and 620 on a substrate 400.

The second active pattern 405 and the second isolation pattern 430 may correspond to the first active pattern 105 and the first isolation pattern 110, respectively, of FIGS. 1 to 5.

In example embodiments, a plurality of semiconductor patterns 424 may be formed at a plurality of levels, respectively, and may be spaced apart from each other in the third direction D3 from an upper surface of the second active pattern 405. Each of the plurality of semiconductor patterns 424 may extend in the first direction D1. FIGS. 32 and 33 show three semiconductor patterns 424 at three levels, respectively, however, the inventive concept is not limited thereto.

In example embodiments, the semiconductor pattern 424 may be a nano-sheet or nano-wire including a semiconductor material, e.g., silicon, germanium, etc. In example embodiments, the semiconductor pattern 424 may serve as a channel in a transistor, and thus may also be referred to as a channel.

The third gate structure 602 and the third gate spacer 482 may correspond to the first gate structure 252 and the first gate spacer 162, respectively, of FIGS. 1 to 5, and the fourth gate structure 604 and the fourth gate spacer 484 may correspond to the second gate structure 254 and the second gate spacer 164, respectively, of FIGS. 1 to 5.

Thus, the third gate structure 602 may extend in the second direction D2 on the second active pattern 405 and the second isolation pattern 430, and may include a third gate insulation pattern 572 and a third gate electrode 582, and a third capping pattern 592 on the third gate insulation pattern 572 and the third gate electrode 582. Additionally, the fourth gate structure 604 may extend in the second direction D2 on the second active pattern 405 and the second isolation pattern 430, and may include a fourth gate insulation pattern 574 and a fourth gate electrode 584, and a fourth capping pattern 594 on the fourth gate insulation pattern 574 and the fourth gate electrode 584.

Each of the third and fourth gate structures 602 and 604 may surround a central portion in the first direction D1 of each of the semiconductor patterns 424, and may cover lower and upper surfaces and opposite sidewalls in the second direction D2 of each of the semiconductor patterns 424.

Thus, the third gate insulation pattern 572 may be formed on a surface of each semiconductor pattern 424, upper surfaces of the second active pattern 405 and the second isolation pattern 430, a sidewall of the third source/drain layer 512 and an inner sidewall of the third gate spacer 482, and each of the third gate electrode 582 may fill a space between the semiconductor patterns 424 spaced apart from each other in the third direction D3, a space between the second active pattern 405 and a lowermost one of the semiconductor patterns 424, and a space between the third gate spacers 482 on an uppermost one of the semiconductor patterns 424.

Additionally, the fourth gate insulation pattern 574 may be formed on a surface of each semiconductor pattern 424, upper surfaces of the second active pattern 405 and the second isolation pattern 430, a sidewall of the fourth source/drain layer 514 and an inner sidewall of the fourth gate spacer 484, and each of the fourth gate electrode 584 may fill a space between the semiconductor patterns 424 spaced apart from each other in the third direction D3, a space between the second active pattern 405 and a lowermost one of the semiconductor patterns 424, and a space between the fourth gate spacers 484 on an uppermost one of the semiconductor patterns 424.

The third and fourth source/drain layers 512 and 514 may correspond to the first and second source/drain layers 192 and 194, respectively, of FIGS. 1 to 5. The third and fourth source/drain layers 512 and 514 may be formed in fifth and sixth openings 492 and 494, respectively, that may be formed on portions of the second active pattern 405 adjacent to the third and fourth gate structures 602 and 604, respectively.

The third and fourth contact plug structures 638 and 639 may correspond to the first and second contact plug structures 288 and 289, respectively, of FIGS. 1 to 5. Accordingly, the third and fourth contact plug structures 638 and 639 may extend through the third and fourth insulating interlayer 530 and 620 to contact upper surfaces of the third and fourth source/drain layers 512 and 514, respectively. The third and fourth contact plug structures 638 and 639 may partially extend though upper portions of the third and fourth source/drain layers 512 and 514, respectively.

A third metal silicide pattern 630, a third metal layer 632 and a third conductive pattern 636 included in the third contact plug structure 638 may correspond to the first metal silicide pattern 280, the first metal layer 282 and the first conductive pattern 286, respectively, of FIGS. 1 to 5. A fourth metal silicide pattern 631 and a fourth conductive pattern 637 included in the fourth contact plug structure 639 may correspond to the second metal silicide pattern 281 and the second conductive pattern 287, respectively, of FIGS. 1 to 5.

FIGS. 35 to 46 are plan views and cross-sectional views for reference in describing a method of manufacturing a semiconductor device in accordance with example embodiments. Particularly, FIGS. 35, 37, 40 and 44 are the plan views, and FIGS. 36, 38-39, 41-43 and 45-46 are the cross-sectional views.

Figure 36:
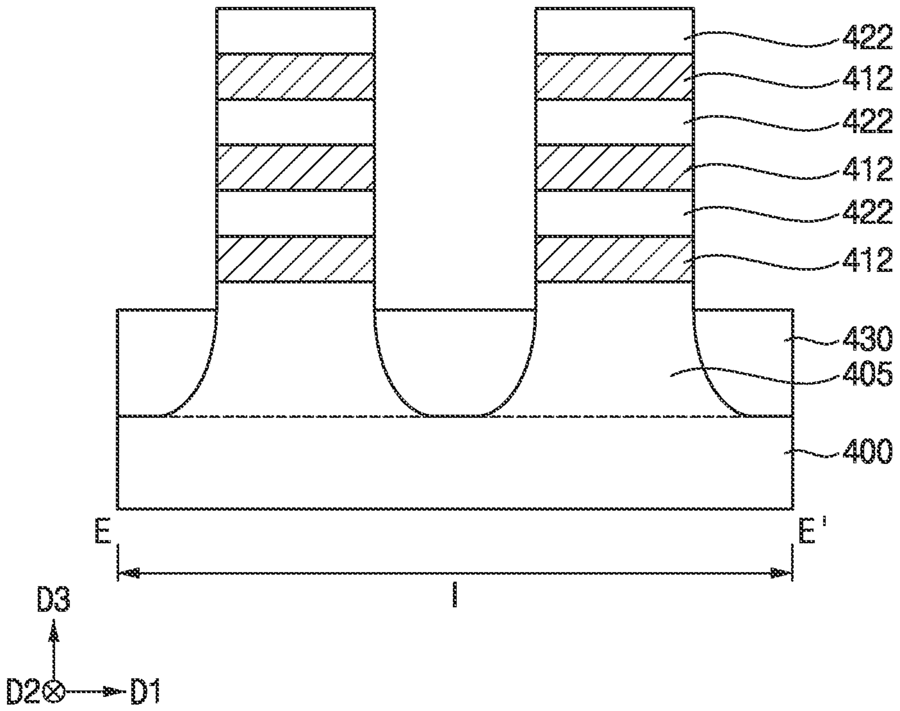
Figure 38:
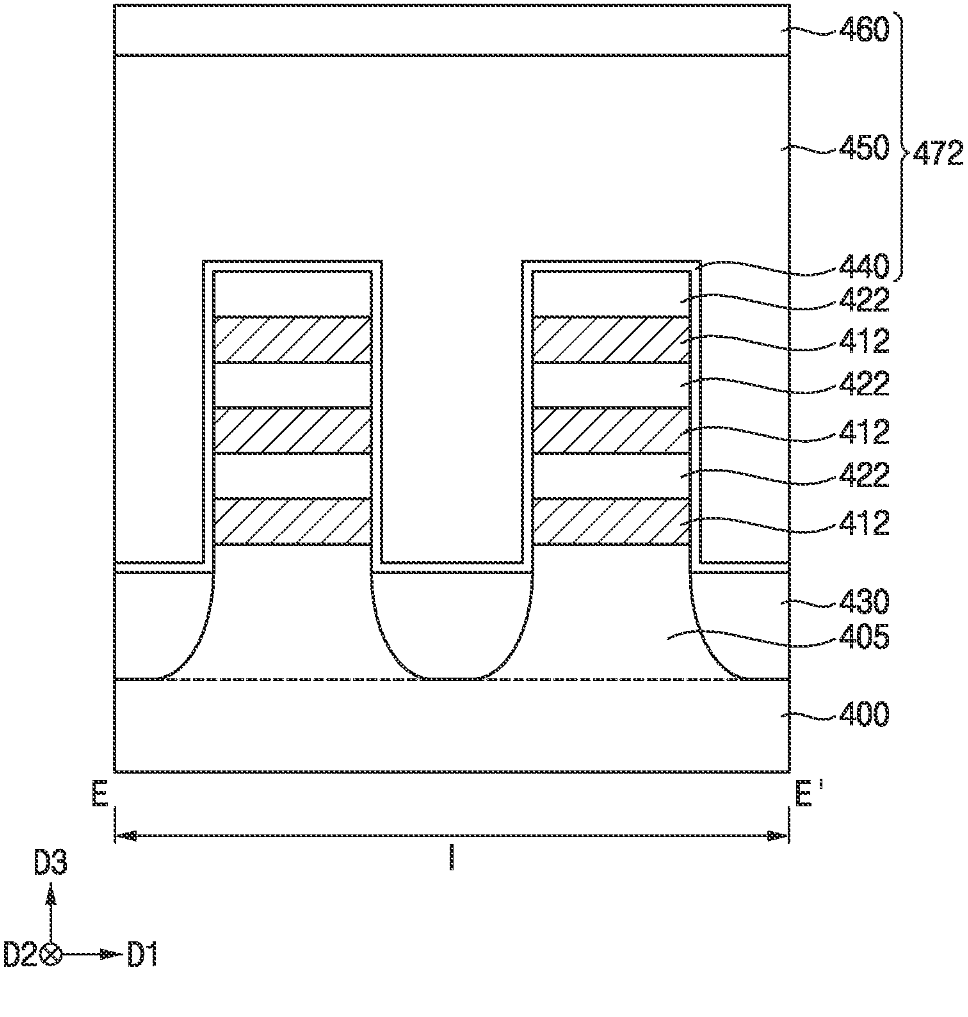
Figure 39:
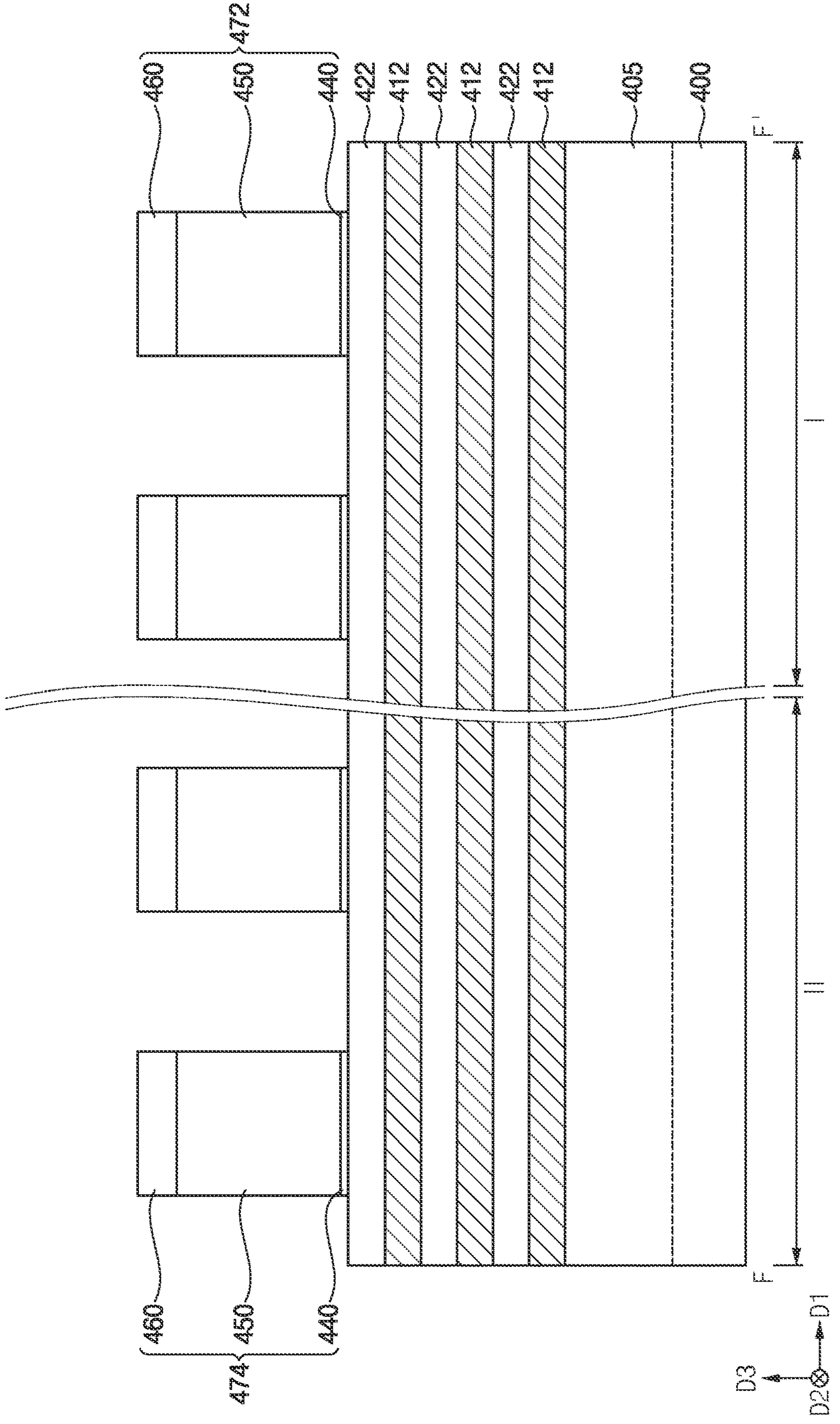
Figure 40:
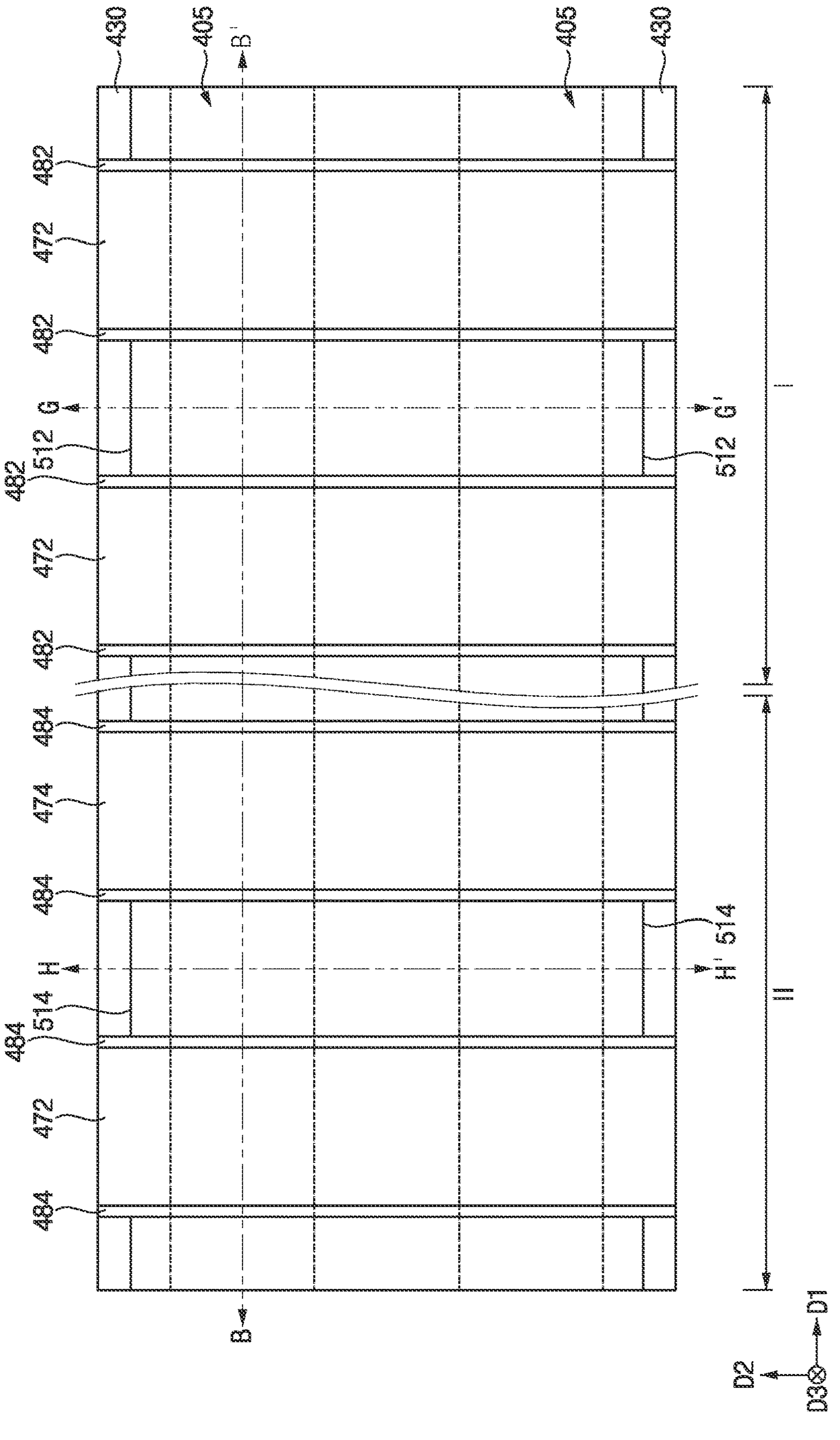
Figure 41:
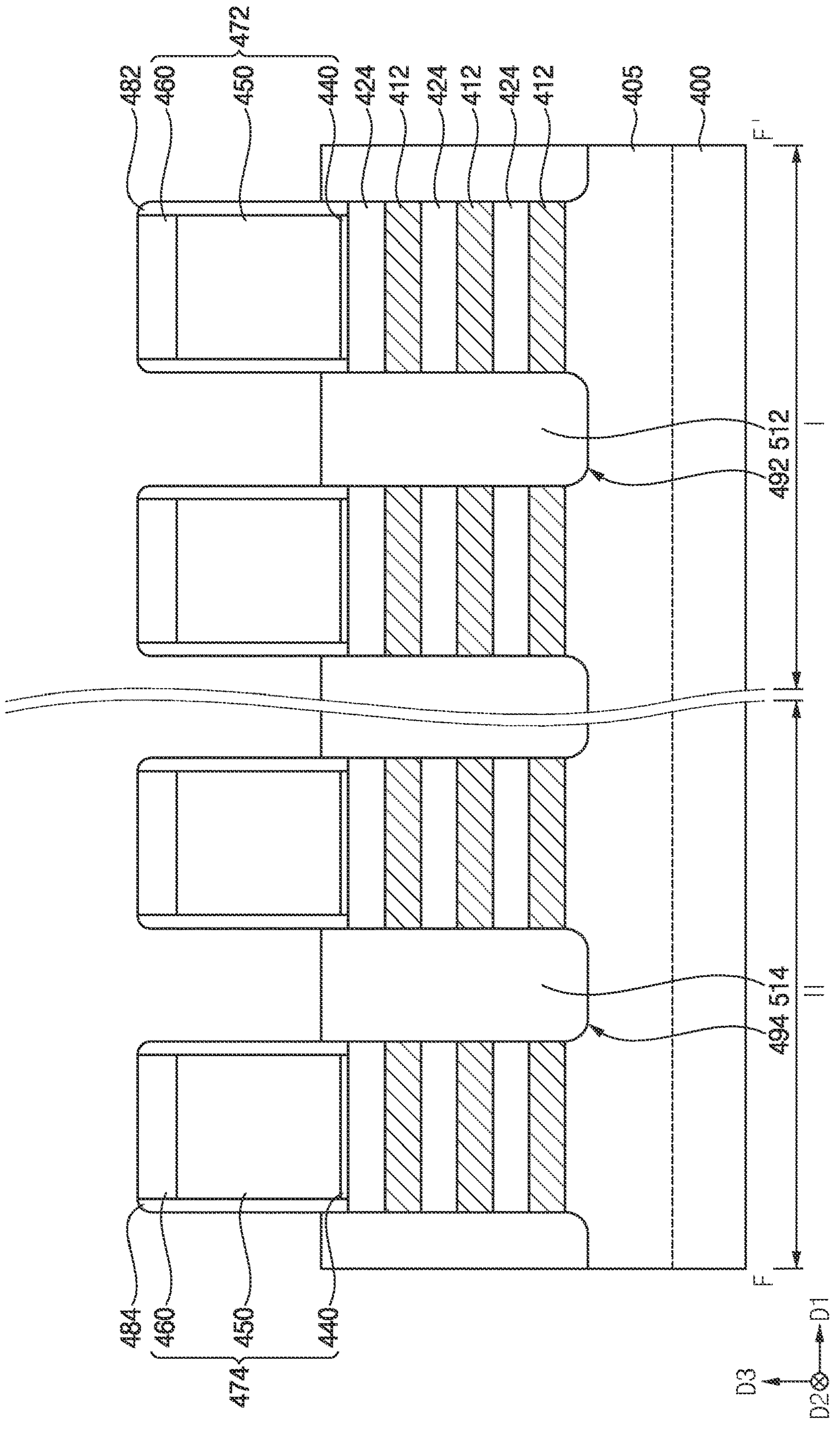
Figure 42:
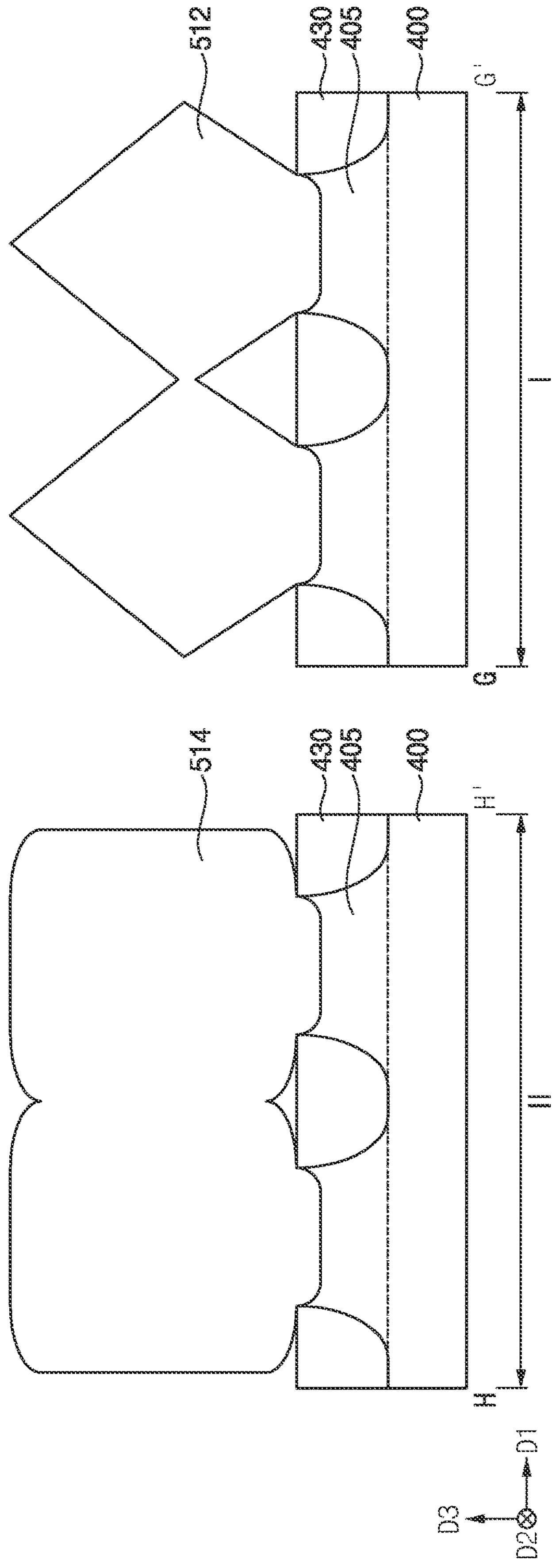
Figure 45:
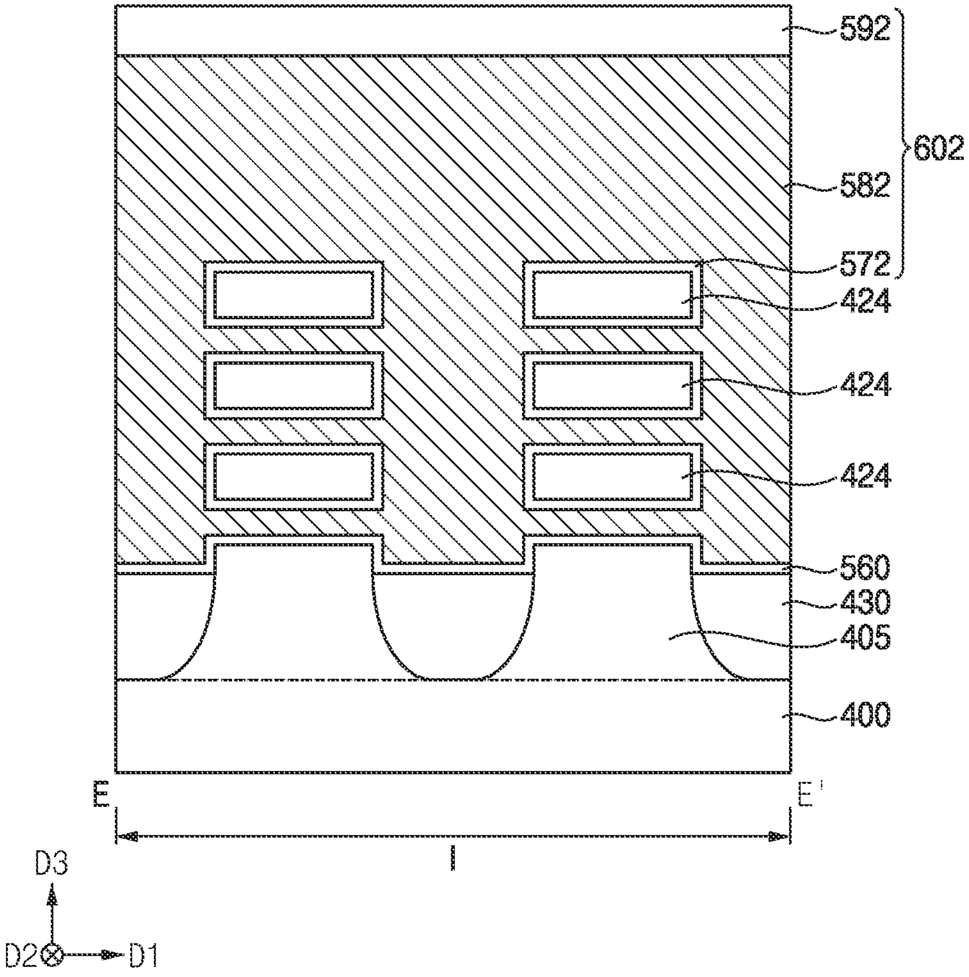

FIGS. 36, 38 and 45 are cross-sectional views taken along lines E-E' of corresponding plan views, respectively, FIGS. 39, 41, 43 and 46 are cross-sectional views taken along lines F-F' of corresponding plan views, respectively, and FIG. 42 is a cross-sectional view taken along line G-G' and H-H' of FIG. 40.

This method may include processes substantially the same as or similar to those illustrated with reference to FIGS. 6 to 20 and FIGS. 1 to 5, and thus repeated explanations of already described elements are omitted herein.

Figure 35:
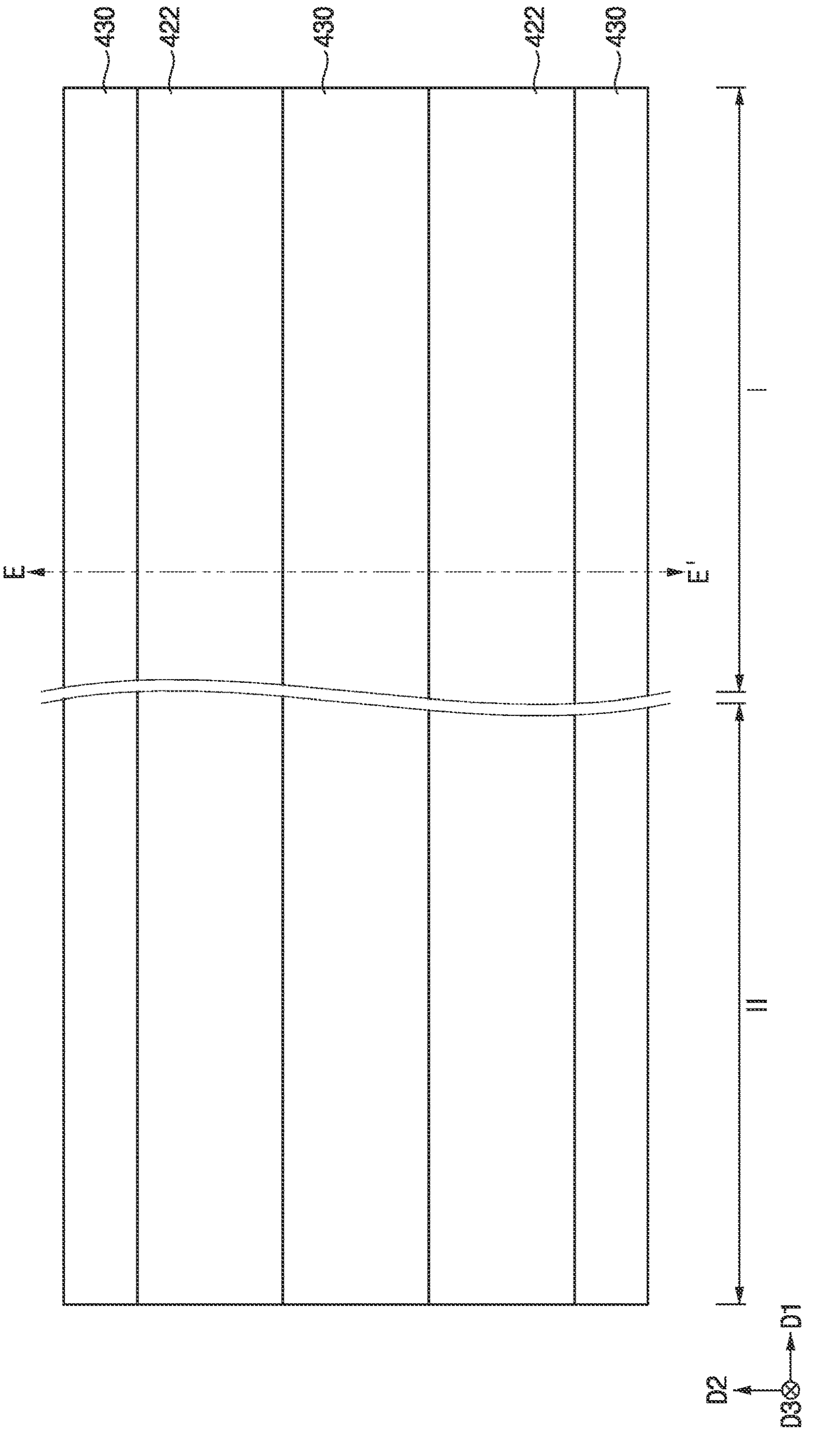
FIGS. 35 to 46 are plan views and cross-sectional views for reference in describing a method of manufacturing a semiconductor device in accordance with example embodiments.

Referring to FIGS. 35 and 36, a sacrificial layer and a semiconductor layer may be alternately and repeatedly stacked on a substrate 400, a first etching mask extending in the first direction D1 may be formed on an uppermost one of the semiconductor layers, and the semiconductor layers, the sacrificial layers and an upper portion of the substrate 400 may be etched using the third etching mask.

Thus, a second active pattern 405 extending in the first direction D1 may be formed on the substrate 400, and a fin structure including sacrificial lines 412 and semiconductor lines 422 alternately and repeatedly stacked in the third direction D3 may be formed on the second active pattern 405. In example embodiments, a plurality of fin structures may be spaced apart from each other in the second direction D2 on the substrate 400.

FIG. 36 shows three sacrificial lines 412 at three levels, respectively, and three semiconductor lines 422 at three levels, respectively, however, the inventive concept may not be limited thereto. The sacrificial lines 412 may include a material having an etching selectivity with respect to the substrate 400 and the semiconductor lines 422, e.g., silicon-germanium.

A second isolation pattern 430 may be formed on the substrate 400 to cover a sidewall of the second active pattern 405.

Figure 37:
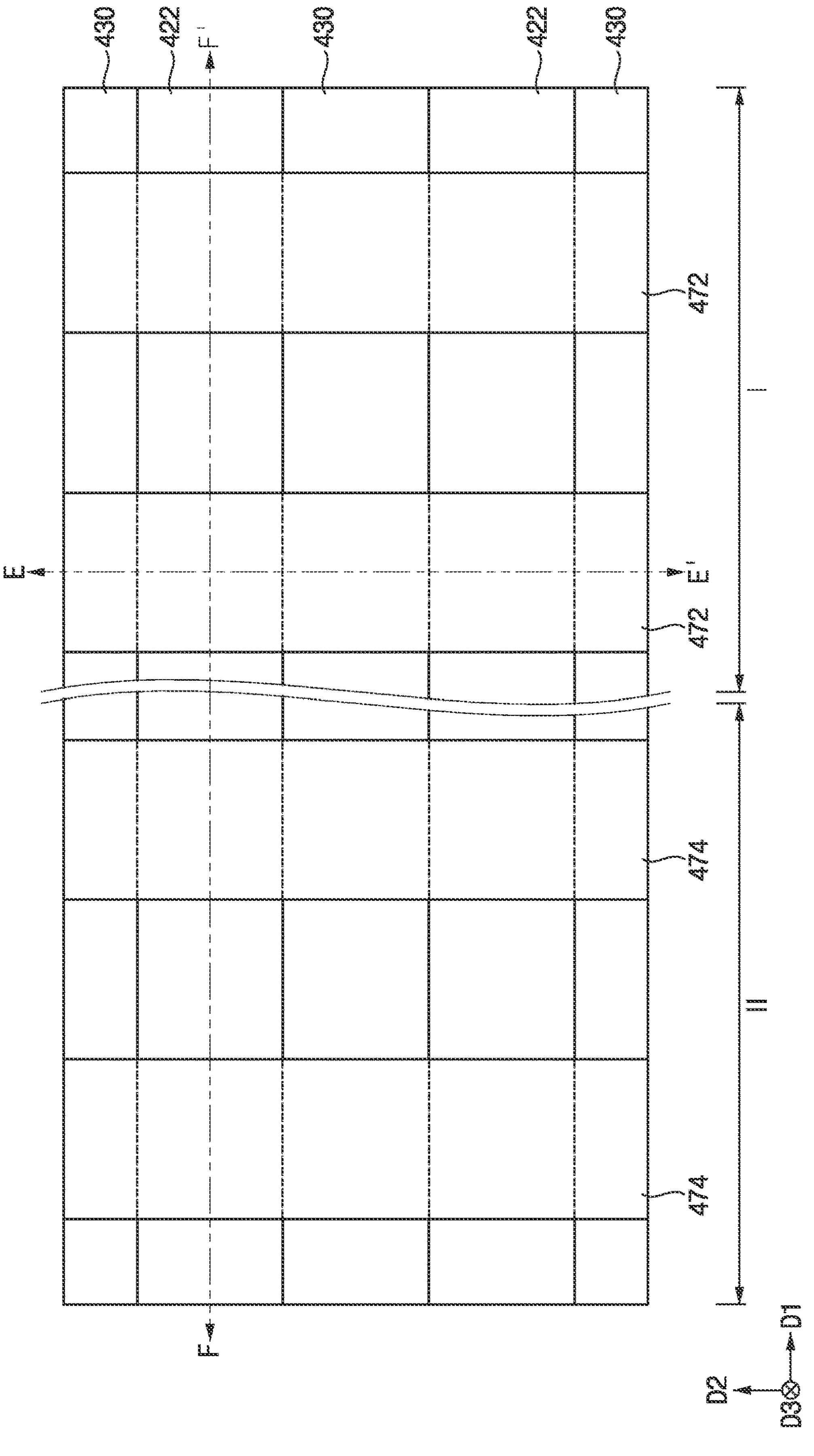

Referring to FIGS. 37 to 39, third and fourth dummy gate structures 472 and 474 may be formed on the first and second regions I and II, respectively, of the substrate 400 to partially cover the fin structure and the second isolation pattern 430.

Particularly, a second dummy gate insulation layer, a second dummy gate electrode layer and a second dummy gate mask layer may be sequentially formed on the substrate 400 having the fin structure and the second isolation pattern 430 thereon, a second etching mask extending in the second direction D2 may be formed on the second dummy gate mask layer, and the second dummy gate mask layer may be etched using the second etching mask to form a second dummy gate mask 460.

The second dummy gate electrode layer and the second dummy gate insulation layer may be etched using the second dummy gate mask 460 as an etching mask to form a second dummy gate electrode 450 and a second dummy gate insulation pattern 440, respectively, on the substrate 400.

The second dummy gate insulation pattern 440, the second dummy gate electrode 450 and the second dummy gate mask 460 sequentially stacked in the third direction D3 on the second active pattern 405 and a portion of the second isolation pattern 430 adjacent thereto on the first region I of the substrate 400 may form a third dummy gate structure 472, and the second dummy gate insulation pattern 440, the second dummy gate electrode 450 and the second dummy gate mask 460 sequentially stacked in the third direction D3 on the second active pattern 405 and a portion of the second isolation pattern 430 adjacent thereto on the second region II of the substrate 400 may form a fourth dummy gate structure 474.

In example embodiments, each of the third and fourth dummy gate structures 472 and 474 may extend in the second direction D2 on the fin structure and the second isolation pattern 430, and may cover an upper surface and opposite sidewalls in the second direction D2 of the fin structure.

In example embodiments, a plurality of third dummy gate structures 472 may be spaced apart from each other in the first direction D1 on the first region I of the substrate 400, and a plurality of fourth dummy gate structures 474 may be spaced apart from each other in the first direction D1 on the second region II of the substrate 400.

Referring to FIGS. 40 to 41, third and fourth gate spacers 482 and 484 may be formed on sidewalls of the third and fourth dummy gate structures 472 and 474, respectively.

Particularly, a second spacer layer may be formed on the substrate 400 having the fin structure, the second isolation pattern 430 and the third and fourth dummy gate structures 472 and 474 thereon, and may be anisotropically etched to form the third and fourth gate spacers 482 and 484 covering each of opposite sidewalls in the first direction D1 of the third and fourth dummy gate structures 472 and 474, respectively.

The fin structure and an upper portion of the second active pattern 405 on the first region I of the substrate 400 may be etched using the third dummy gate structure 472 and the third gate spacer 482 as an etching mask to form a fifth opening 492, and the fin structure and an upper portion of the second active pattern 405 on the second region II of the substrate 400 may be etched using the fourth dummy gate structure 474 and the fourth gate spacer 484 as an etching mask to form an sixth opening 494.

Thus, the sacrificial lines 412 and the semiconductor lines 422 under the third and fourth dummy gate structures 472 and 474 and the third and fourth gate spacers 482 and 484 may be transformed into sacrificial patterns 414 and semiconductor patterns 424, respectively, and the fin structure extending in the first direction D1 may be divided into a plurality of portions spaced apart from each other in the first direction D1.

Hereinafter, the third dummy gate structure 472, the third gate spacers 482 on respective opposite sidewalls of the third dummy gate structure 472 and the fin structure may be referred to as a first stack structure, and the fourth dummy gate structure 474, the fourth gate spacers 484 on respective opposite sidewalls of the fourth dummy gate structure 474 and the fin structure may be referred to as a second stack structure.

In example embodiments, each of the first and second stack structures may extend in the second direction D2. In example embodiments, a plurality of first stack structures may be spaced apart from each other in the first direction D1 on the first region I of the substrate 400, and a plurality of second stack structures may be spaced apart from each other in the first direction D1 on the second region II of the substrate 400.

A portion of each of the sacrificial patterns 414 adjacent to the fifth and sixth openings 492 and 494 may be removed to form a gap, and an inner spacer (not shown) may be formed in the gap.

A selective epitaxial growth (SEG) process may be performed using the upper surface of the second active pattern 405 and the sidewalls of the semiconductor patterns 424 and the sacrificial patterns 414 exposed by the fifth and sixth openings 492 and 494 as a seed to form third and fourth source/drain layers 512 and 514 in the fifth and sixth openings 492 and 494, respectively.

In an example embodiment, a single crystalline silicon-germanium layer doped with p-type impurities may be formed as the third source/drain layer 512, and a single crystalline silicon layer doped with n-type impurities or a single crystalline silicon carbide layer doped with n-type impurities may be formed as the fourth source/drain layer 514.

Figure 43:
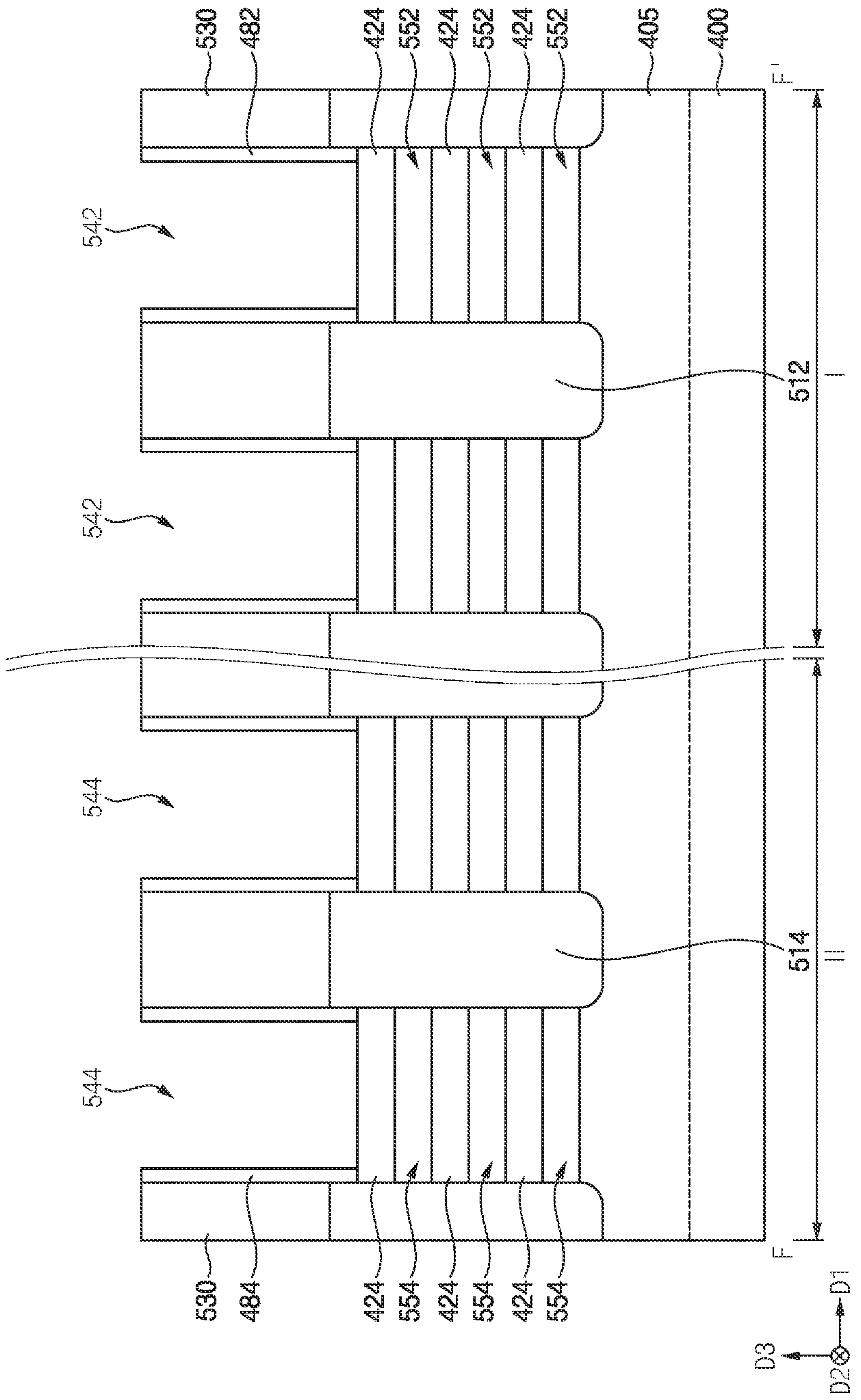

Referring to FIG. 43, a third insulating interlayer 530 may be formed on the substrate 400 to cover the first and second stack structures and the third and fourth source/drain layers 512 and 514, and a planarization process may be performed until upper surfaces of the second dummy gate electrodes 450 included in the first and second stack structures, respectively, are exposed so that an upper portion of the third insulating interlayer 530 and the second dummy gate masks 460 included in the third and fourth dummy gate structures 472 and 474, respectively.

The second dummy gate electrodes 450, the second dummy gate insulation patterns 440 and the sacrificial patterns 414 may be removed by, e.g., a wet etching process and/or a dry etching process. Thus, a seventh opening 542 exposing an inner sidewall of the third gate spacer 482 and an upper surface of an uppermost one of the semiconductor patterns 424, and an eighth opening 552 exposing a sidewall of the third source/drain layer 512, surfaces of the semiconductor patterns 424 and an upper surface of the second active pattern 405 may be formed on the first region I of the substrate 400. Additionally, a ninth opening 544 exposing an inner sidewall of the fourth gate spacer 484 and an upper surface of an uppermost one of the semiconductor patterns 424, and a tenth opening 554 exposing a sidewall of the fourth source/drain layer 514, surfaces of the semiconductor patterns 424 and an upper surface of the second active pattern 405 may be formed on the second region II of the substrate 400.

Figure 44:
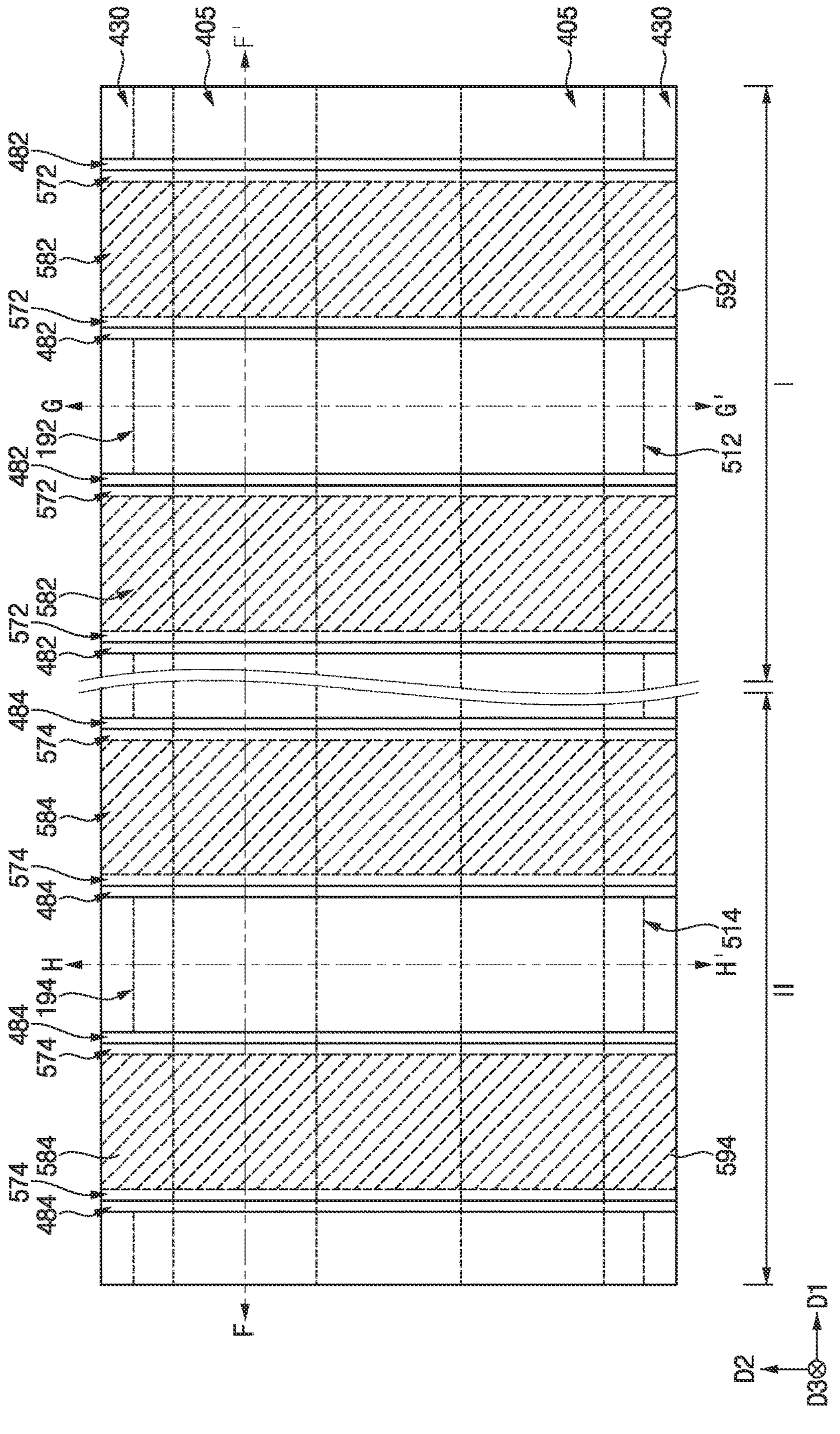
Figure 46:
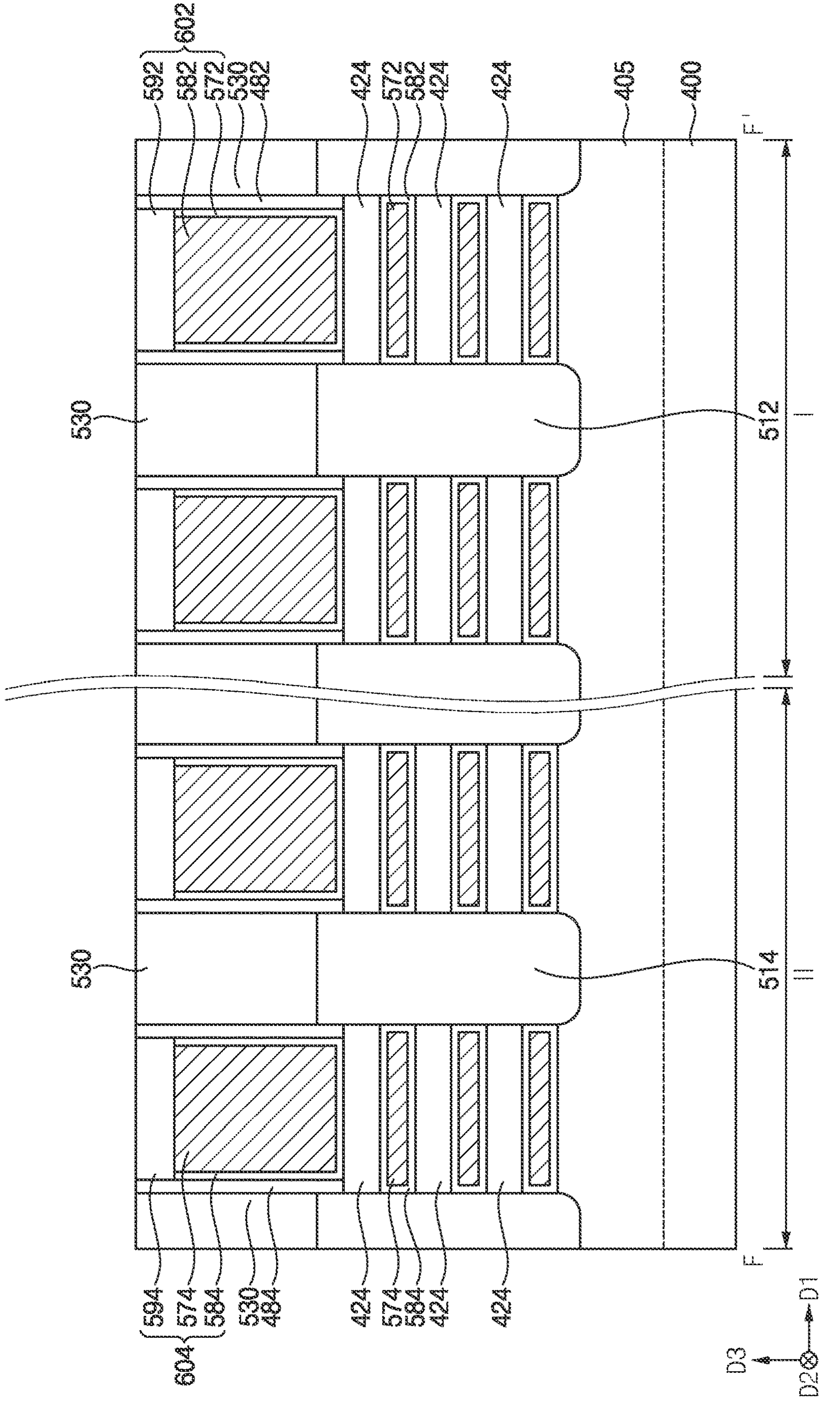

Referring to FIGS. 44 to 46, processes substantially the same as or similar to those illustrated with reference to FIGS. 13 to 15 may be performed.

Thus, a third gate structure 602 including a third gate insulation pattern 572 on the upper surface of the second active pattern 405, the upper surface of the second isolation pattern 430, the sidewall of the third source/drain layer 512, the surfaces of the semiconductor patterns 424 and an inner lower sidewall of the third gate spacer 482 in the seventh and eighth openings 542 and 552, a third gate electrode 582 on the third gate insulation pattern 572 and filling a lower portion of the seventh opening 542 and the eighth opening 552, and a third capping pattern 592 on the third gate insulation pattern 572 and the third gate electrode 582 and filling an upper portion of the seventh opening 542 to contact an inner upper sidewall of the third gate spacer 482 may be formed.

Additionally, a fourth gate structure 604 including a fourth gate insulation pattern 574 on the upper surface of the second active pattern 405, the upper surface of the second isolation pattern 430, the sidewall of the fourth source/drain layer 514, the surfaces of the semiconductor patterns 424 and an inner lower sidewall of the fourth gate spacer 484 in the ninth and tenth openings 544 and 554, a fourth gate electrode 584 on the fourth gate insulation pattern 574 and filling a lower portion of the ninth opening 544 and the tenth opening 554, and a fourth capping pattern 594 on the fourth gate insulation pattern 574 and the fourth gate electrode 584 and filling an upper portion of the ninth opening 544 to contact an inner upper sidewall of the fourth gate spacer 484 may be formed.

In an example embodiment, an interface pattern (not shown) including, e.g., silicon oxide may be further formed on the upper surface of the second active pattern 405 and the surfaces of the semiconductor patterns 424.

Referring to FIGS. 31 to 34 again, processes substantially the same as or similar to those illustrated with reference to FIGS. 16 to 20 and FIGS. 1 to 5 may be performed.

Accordingly, a fourth insulating interlayer 620 may be formed on the third and fourth gate structures 602 and 604, the third and fourth gate spacers 482 and 484 and the third insulating interlayer 530, and third and fourth contact plug structures 638 and 639 may be formed to extend through the third and fourth insulating interlayers 530 and 620 to contact upper surfaces of the third and fourth source/drain layers 512 and 514, respectively.

The third contact plug structure 638 may include a third metal silicide pattern 630, a third metal layer 632 and a third conductive pattern 636, and the fourth contact plug structure 639 may include a fourth metal silicide pattern 631 and a fourth conductive pattern 637.

FIGS. 47 to 50 are cross-sectional views illustrating semiconductor devices in accordance with example embodiments, and may correspond to FIG. 22.

Figure 48:
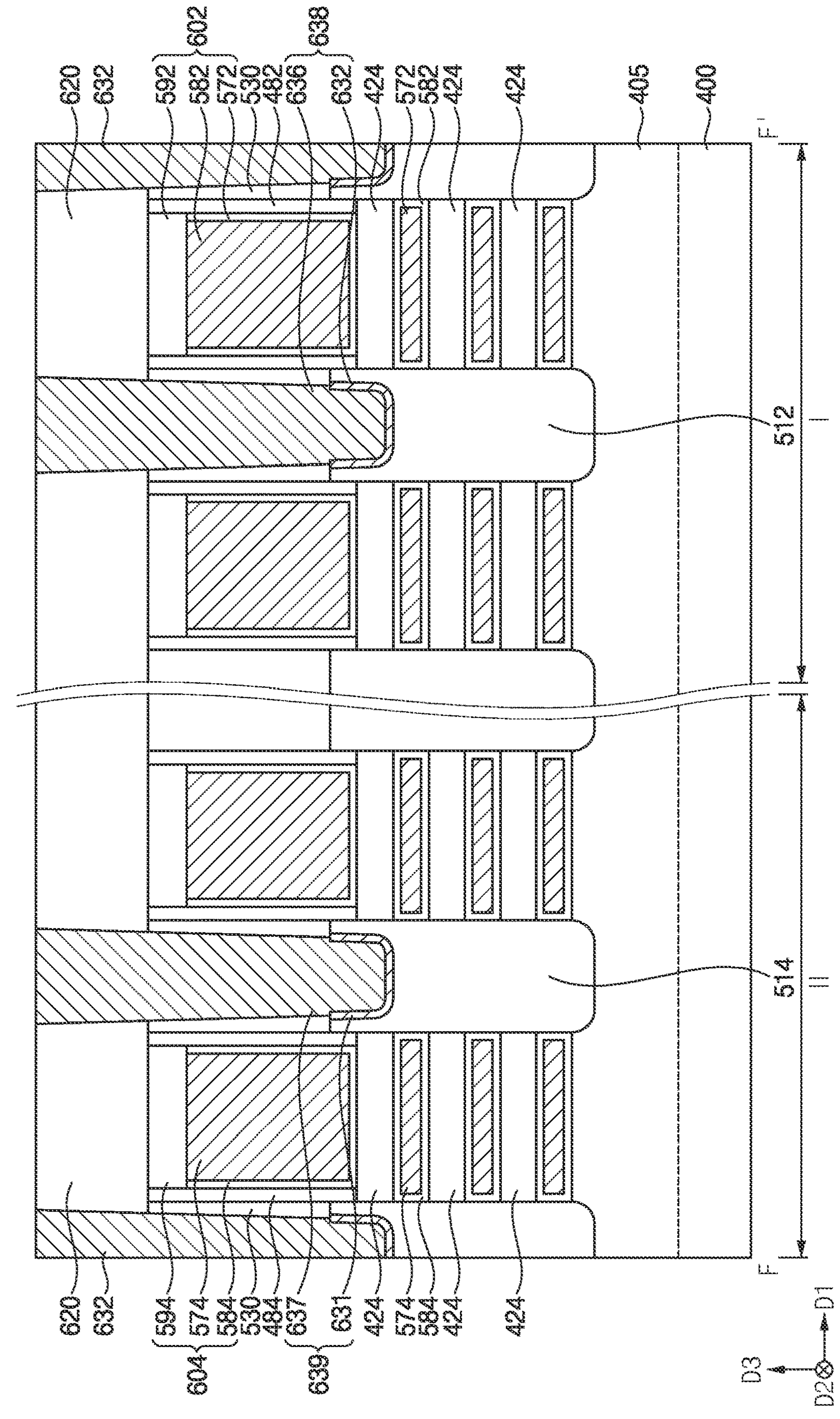
Figure 49:
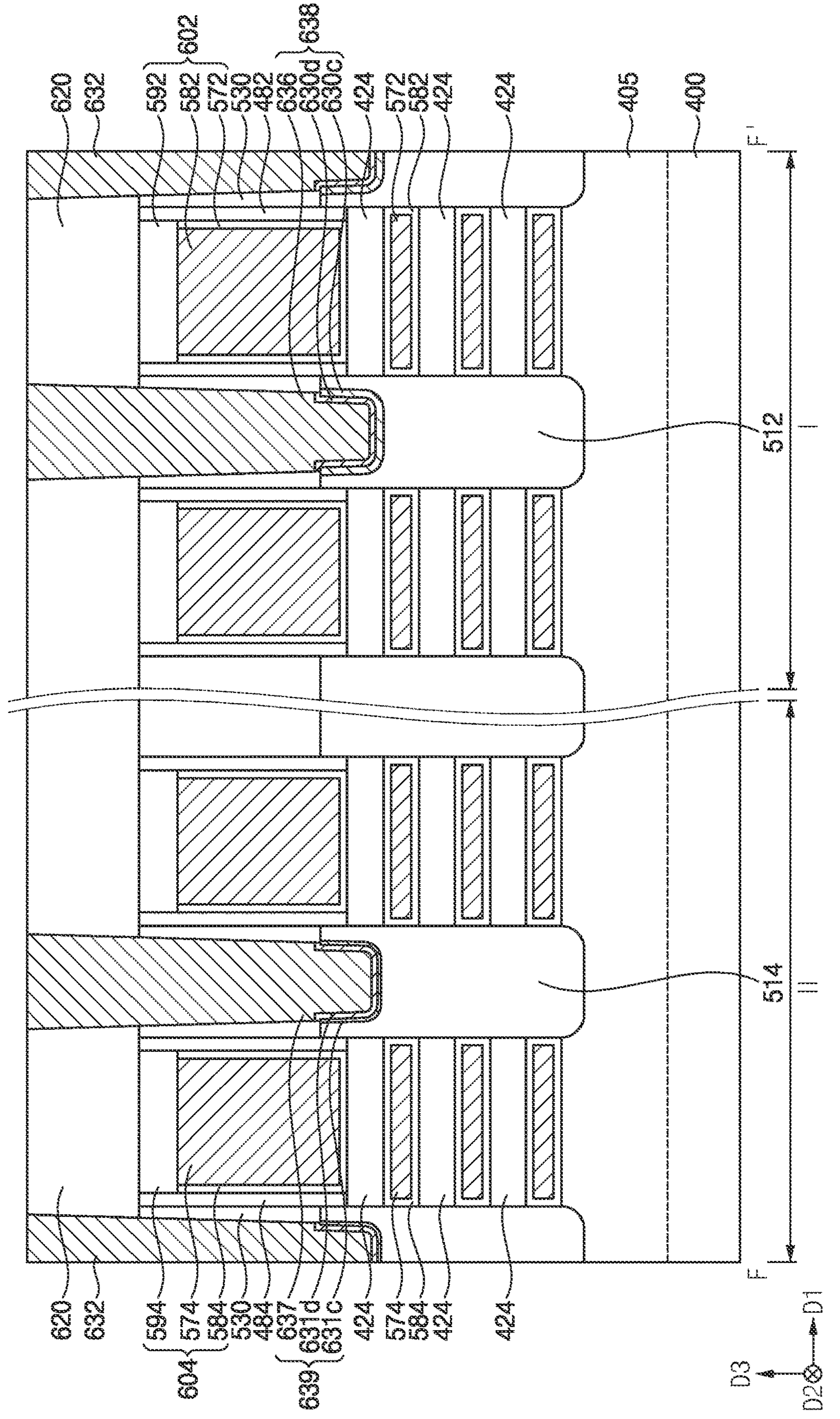
Figure 50:
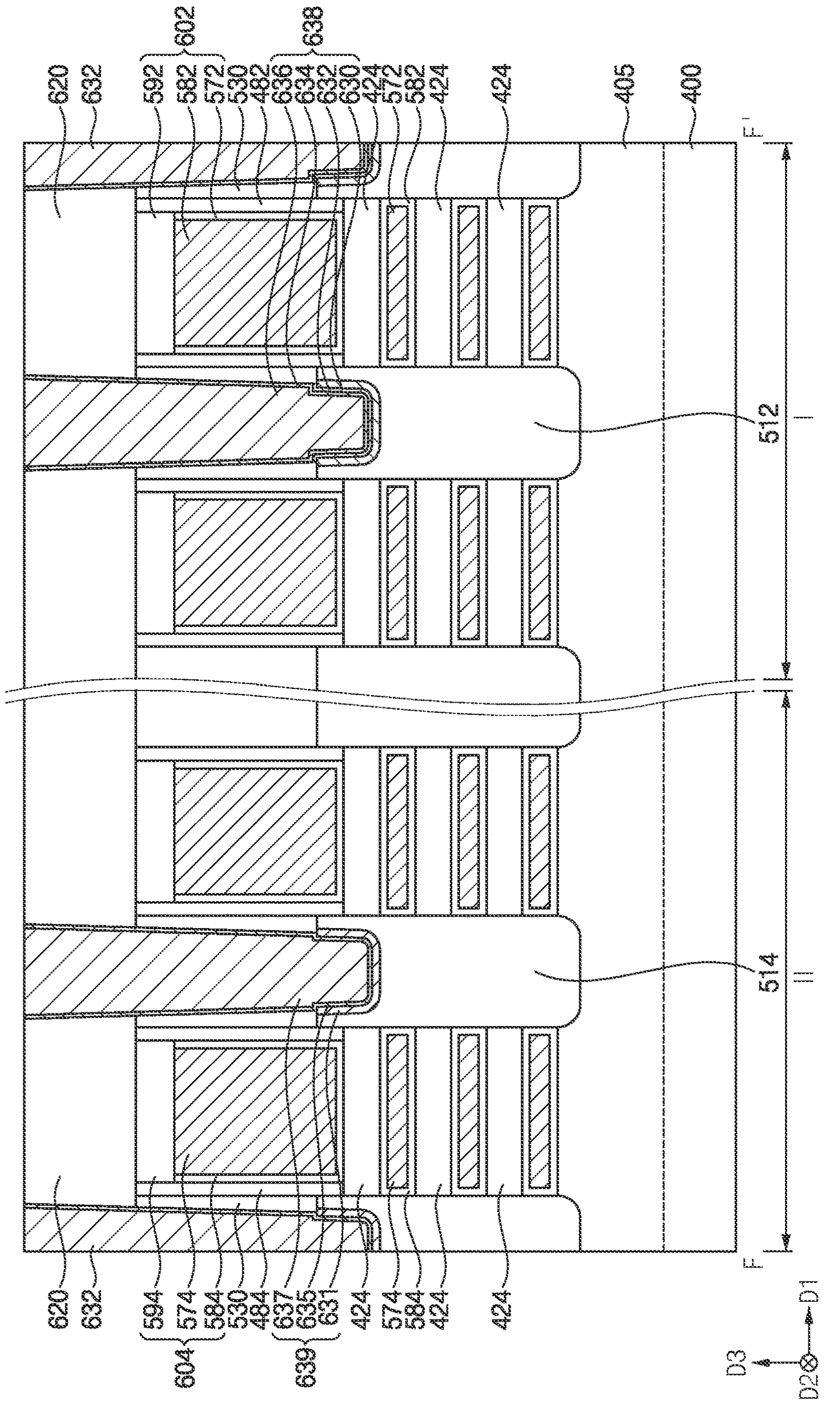

These semiconductor devices are applications of the semiconductor devices including finFETs shown in FIGS. 21, 25, 27 and 30, respectively, to the semiconductor device of FIGS. 48 to 50 including an MBCFET, and thus, repeated explanations of already described elements are omitted herein.

Figure 47:
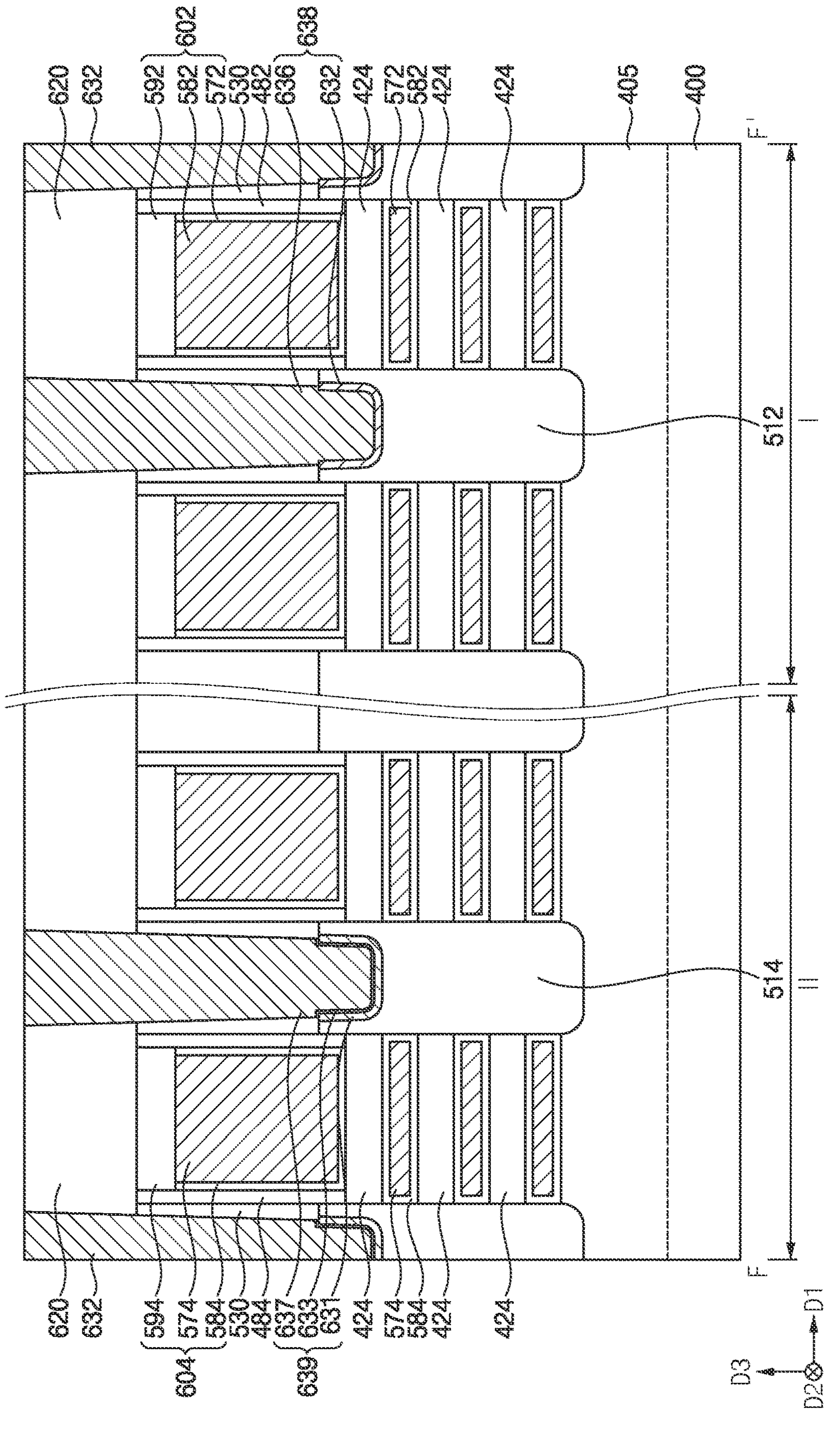
FIGS. 47 to 50 are cross-sectional views illustrating a semiconductor device in accordance with example embodiments, and may correspond to FIG. 33.

Referring to FIG. 47, the third contact plug structure 638 may not include the third metal layer 632, and thus an upper surface of the third metal silicide pattern 630 may contact a lower surface of the third conductive pattern 636.

The third metal silicide pattern 630 may include a silicide of the first and second metals and a germanide of the first and second metals. In an example embodiment, a concentration of the first metal of a first portion of the third metal silicide pattern 630 that is farther from the third source/drain layer 512 may be greater than a concentration of the first metal of a second portion of the third metal silicide pattern 630 that is nearer to the third source/drain layer 512.

The fourth contact plug structure 639 may further include a fourth metal layer 633 disposed between the fourth metal silicide pattern 631 and the fourth conductive pattern 637, and the fourth metal layer 633 may include the first metal.

The fourth metal silicide pattern 631 may include a silicide of the first and second metals. In an example embodiment, a concentration of the first metal of a first portion of the fourth metal silicide pattern 631 that is nearer to the fourth metal layer 633 may be greater than a concentration of the first metal of a second portion of the fourth metal silicide pattern 631 that is farther to the fourth metal layer 633.

Referring to FIG. 48, the third contact plug structure 638 may not include the third metal layer 632, and thus an upper surface of the third metal silicide pattern 630 may contact a lower surface of the third conductive pattern 636.

In an example embodiment, a concentration of the second metal of a first portion of the third metal silicide pattern 630 that is nearer to the third conductive pattern 636 may be greater than a concentration of the second metal of a second portion of the third metal silicide pattern 630 that is farther from the third conductive pattern 636. Also, in an example embodiment, a concentration of the second metal of a first portion of the fourth metal silicide pattern 631 that is nearer to the fourth conductive pattern 637 may be greater than a concentration of the second metal of a second portion of the fourth metal silicide pattern 631 that is farther from the fourth conductive pattern 637.

In contrast, in an example embodiment, a concentration of the first metal of a first portion of the fourth metal silicide pattern 631 that is nearer to the third conductive pattern 637 may be greater than a concentration of the first metal of a second portion of the fourth metal silicide pattern 631 that is farther from the third conductive pattern 636, and a concentration of the first metal of a first portion of the third metal silicide pattern 630 that is nearer to the third conductive pattern 636 may be greater than a concentration of the first metal of a second portion of the third metal silicide pattern 630 that is farther from the third conductive pattern 636.

Referring to FIG. 49, the third contact plug structure 638 may include a third metal silicide pattern and a third conductive pattern 636, and the third metal silicide pattern may include a third lower portion 630*c* and a third upper portion 630*d* that may be sequentially stacked.

The fourth contact plug structure 639 may include a fourth metal silicide pattern and a fourth conductive pattern 636, and the fourth metal silicide pattern may include a fourth lower portion 631*c* and a fourth upper portion 631*d* that may be sequentially stacked.

In example embodiments, the third lower portion 630*c* may include a silicide of the first metal and a germanide of the first metal, and the third upper portion 630*d* may include a silicide of the second metal. However, the third lower portion 630*c* may further include a silicide of the second metal and a germanide of the second metal, and the third upper portion 630*d* may further include a silicide of the first metal. In an example embodiment, a concentration of the second metal of a first portion of the third lower portion 630*c* that is nearer to the third upper portion 630*d* may be greater than a concentration of the second metal of a second portion of the third lower portion 630*c* that is farther from the third upper portion 630*d*.

In example embodiments, the fourth lower portion 631*c* may include a silicide of the first metal, and the fourth upper portion 631*d* may include a silicide of the second metal. However, the fourth lower portion 631*c* may further include a silicide of the second metal, and the fourth upper portion 631*d* may further include a silicide of the first metal. In an example embodiment, a concentration of the second metal of a first portion of the fourth lower portion 631*c* that is nearer to the fourth upper portion 631*d* may be greater than a concentration of the second metal of a second portion of the fourth lower portion 631*c* that is farther from the fourth upper portion 631*d*.

Referring to FIG. 50, the third contact plug structure 638 may further include a third barrier pattern 634 disposed on the third metal layer 632 and covering a lower surface and sidewalls of the third conductive pattern 636. The fourth contact plug structure 639 may further include a fourth barrier pattern 635 disposed on the fourth metal silicide pattern 631 and covering a lower surface and sidewalls of the fourth conductive pattern 637.

The above-described semiconductor device may be used in various memory devices and systems including contact plugs. For example, the semiconductor device may be applied to a logic device such as a central processing unit (CPU), an application processor (AP), etc. As alternative examples, the semiconductor device may be applied to a volatile memory device such as a DRAM device, an SRAM device, etc., or to a non-volatile memory device such as a flash memory device, a PRAM device, an MRAM device, an RRAM device, etc.

While example embodiments have been particularly shown and described, it will be understood by one of ordinary skill in the art that variations in form and detail may be made therein without departing from the spirit and scope of the claims.

What is claimed is:

1. A semiconductor device, comprising:

a substrate including a first region and a second region;

a first gate structure on the first region of the substrate, a first source/drain layer on a portion of the substrate adjacent to the first gate structure;

a second gate structure on the second region of the substrate;

a second source/drain layer on a portion of the substrate adjacent to the second gate structure;

a first contact plug including:

a first metal silicide pattern on the first source/drain layer, the first metal silicide pattern including a silicide of a first metal and a silicide of a second metal different from the first metal; and a first conductive pattern on the first metal silicide pattern; and a second contact plug including:

a second metal silicide pattern on the second source/drain layer, the second metal silicide pattern including a silicide of the first and second metals; and a second conductive pattern on the second metal silicide pattern, wherein a first ratio of the first metal to the second metal included in the first metal silicide pattern is different from a second ratio of the first metal to the second metal included in the second metal silicide pattern.

2. The semiconductor device as claimed in claim 1, wherein a work function of the first metal is greater than a work function of the second metal, and wherein the first ratio is greater than the second ratio.

3. The semiconductor device as claimed in claim 2, wherein the first source/drain layer includes silicon-germanium doped with a p-type impurity, and the second source/drain layer includes silicon or silicon carbide doped with an n-type impurity.

4. The semiconductor device as claimed in claim 1, further comprising a first metal layer between the first metal silicide pattern and the first conductive pattern, the first metal layer including the second metal.

5. The semiconductor device as claimed in claim 4, wherein a concentration of the second metal of a first portion of the first metal silicide pattern that is nearer to the first metal layer is greater than a concentration of the second metal of a second portion of the first metal silicide pattern that is farther from the first metal layer.

6. The semiconductor device as claimed in claim 1, further comprising a second metal layer between the second metal silicide pattern and the second conductive pattern, the second metal layer including the first metal, wherein a concentration of the first metal of a first portion of the second metal silicide pattern that is nearer to the second metal layer is greater than a concentration of the first metal of a second portion of the second metal silicide pattern that is farther from the second metal layer.

7. The semiconductor device as claimed in claim 1, wherein the first metal silicide pattern and the first conductive pattern directly contact each other, and wherein a concentration of the second metal of a first portion of the first metal silicide pattern that is nearer to the first conductive pattern is greater than a concentration of the second metal of a second portion of the first metal silicide pattern that is farther from the first conductive pattern.

8. The semiconductor device as claimed in claim 1, wherein the first metal silicide pattern includes a first lower portion and a first upper portion sequentially stacked in a vertical direction substantially perpendicular to an upper surface of the substrate, the first lower portion and the first upper portion including a silicide of the first metal and a silicide of the second metal, respectively, and wherein the second metal silicide pattern includes a second lower portion and a second upper portion sequentially stacked in the vertical direction, the second lower portion and the second upper portion including a silicide of the first metal and a silicide of the second metal, respectively.

9. The semiconductor device as claimed in claim 8, wherein each of the first and second upper portions further includes a silicide of the first metal, and wherein a concentration of the first metal of a first portion of the first upper portion that is nearer to the first lower portion is greater than a concentration of the first metal of a second portion of the first upper portion that is farther from the first lower portion, and a concentration of the first metal of a first portion of the second upper portion that is nearer to the second lower portion is greater than a concentration of the first metal of a second portion of the second upper portion that is farther from the second lower portion.

10. The semiconductor device as claimed in claim 8, wherein the first lower portion further includes a germanide of the first metal.

11. The semiconductor device as claimed in claim 8, wherein the first lower portion is thicker than the second lower portion.

12. The semiconductor device as claimed in claim 1, wherein the first metal includes at least one of molybdenum (Mo), tungsten (W), ruthenium (Ru), nickel (Ni), cobalt (Co), or platinum (Pt).

13. The semiconductor device as claimed in claim 1, wherein the second metal includes at least one of titanium (Ti), yttrium (Y), lanthanum (La), hafnium (Hf), zirconium (Zr), scandium (Sc), manganese (Mn), aluminum (Al), or erbium (Er).

14. The semiconductor device as claimed in claim 1, further comprising a plurality of channels on the substrate, the plurality of channels being spaced apart from each other in a vertical direction substantially perpendicular to an upper surface of the substrate, wherein each of the first and second gate structures at least partially surrounds upper and lower surfaces and sidewalls of the channels.

15. A semiconductor device, comprising:

a substrate including a first region and a second region;

a first epitaxial layer on the first region of the substrate;

a second epitaxial layer on the second region of the substrate;

a first contact plug including:

a first metal silicide pattern on the first epitaxial layer, the first metal silicide pattern including a silicide of a first metal and a silicide of a second metal different from the first metal; and a first conductive pattern on the first metal silicide pattern; and a second contact plug including:

a second metal silicide pattern on the second epitaxial layer, the second metal silicide pattern including a silicide of the first and second metals;

a second conductive pattern on the second metal silicide pattern; and a first metal layer between the first metal silicide pattern and the first conductive pattern, the first metal layer including the second metal, wherein a work function of the first metal silicide pattern and a work function of the second metal silicide pattern are different from each other.

16. The semiconductor device as claimed in claim 15, wherein the first epitaxial layer includes silicon-germanium doped with a p-type impurity, and the second epitaxial layer includes silicon or silicon carbide doped with an n-type impurity.

17. The semiconductor device as claimed in claim 15, wherein a concentration of the second metal of a first portion of the first metal silicide pattern that is nearer to the first metal layer is greater than a concentration of the second metal of a second portion of the first metal silicide pattern that is farther from the first metal layer.

18. The semiconductor device as claimed in claim 15, further comprising a second metal layer between the second metal silicide pattern and the second conductive pattern, the second metal layer including the first metal, wherein a concentration of the first metal of a first portion of the second metal silicide pattern that is nearer to the second metal layer is greater than a concentration of the first metal of a second portion of the second metal silicide pattern that is farther from the second metal layer.

19. A semiconductor device, comprising:

a substrate including a first region and a second region;

a first active fin and a second active fin on the first and second regions of the substrate, respectively;

a first transistor including:

a first gate structure on the first active fin of the first region of the substrate; and a first source/drain layer on a portion of the first active fin adjacent to the first gate structure, the first source/drain layer including silicon-germanium doped with a p-type impurity;

a second transistor including:

a second gate structure on the second active fin of the second region of the substrate; and a second source/drain layer on a portion of the second active fin adjacent to the second gate structure, the second source/drain layer including silicon doped with a n-type impurity;

a first contact plug including:

a first metal silicide pattern on the first source/drain layer, the first metal silicide pattern including a silicide of a first metal having a work function equal to or more than about 4.6 eV;

a first conductive pattern on the first metal silicide pattern, the first conductive pattern including a third metal; and a first metal layer between the first metal silicide pattern and the first conductive pattern, the first metal layer including a second metal having a work function in a range of about 2.0 eV to about 4.5 eV; and a second contact plug including;

a second metal silicide pattern on the second source/drain layer, the first metal silicide pattern including a silicide of the first metal; and a second conductive pattern on the second metal silicide pattern, the second conductive pattern including the third metal, wherein a first ratio of the first metal to the second metal included in the first metal silicide pattern is greater than a second ratio of the first metal to the second metal included in the second metal silicide pattern.

20. The semiconductor device as claimed in claim 19, further comprising a plurality of channels on the substrate, the plurality of channels being spaced apart from each other along a vertical direction substantially perpendicular to an upper surface of the substrate, wherein each of the first and second gate structures at least partially surrounds upper and lower surfaces and sidewalls of the channels.

* * * * *